(12) United States Patent
Tan et al.

(10) Patent No.: US 11,314,168 B2
(45) Date of Patent: Apr. 26, 2022

(54) UNDERLAYER FOR PHOTORESIST ADHESION AND DOSE REDUCTION

(71) Applicant: Lam Research Corporation, Fremont, CA (US)

(72) Inventors: Samantha S. H. Tan, Fremont, CA (US); Jun Xue, San Jose, CA (US); Mary Anne Manumpil, Northridge, CA (US); Jengyi Yu, San Ramon, CA (US); Da Li, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/310,635

(22) PCT Filed: Jan. 11, 2021

(86) PCT No.: PCT/US2021/012953
§ 371 (c)(1),
(2) Date: Aug. 13, 2021

(87) PCT Pub. No.: WO2021/146138
PCT Pub. Date: Jul. 22, 2021

(65) Prior Publication Data
US 2022/0035247 A1 Feb. 3, 2022

Related U.S. Application Data

(60) Provisional application No. 62/961,647, filed on Jan. 15, 2020.

(51) Int. Cl.
*G03F 7/09* (2006.01)
*C23C 16/04* (2006.01)
(Continued)

(52) U.S. Cl.
CPC ............ *G03F 7/094* (2013.01); *C23C 16/047* (2013.01); *G03F 1/22* (2013.01); *G03F 7/091* (2013.01);
(Continued)

(58) Field of Classification Search
CPC ................ G03F 7/094; G03F 7/70033; H01L 21/02274; H01L 21/0274; H01L 21/0332
(Continued)

(56) References Cited

U.S. PATENT DOCUMENTS 3,513,010 A    5/1970 Notley et al.
3,529,963 A    9/1970 Marchese et al.
(Continued)

FOREIGN PATENT DOCUMENTS

CN    102610516 A    7/2012
EP    3230294 A1    10/2017
(Continued)

OTHER PUBLICATIONS

International Search Report and the Written Opinion of the International Searching Authority, dated May 12, 2021, for International Patent Application No. PCT/US2021/012953.
(Continued)

*Primary Examiner* — Caleen O Sullivan
(74) *Attorney, Agent, or Firm* — Weaver Austin Villeneuve & Sampson LLP

(57) ABSTRACT

This disclosure relates generally to a patterning structure including an underlayer and an imaging layer, as well as methods and apparatuses thereof. In particular embodiments, the underlayer provides an increase in radiation absorptivity and/or patterning performance of the imaging layer.

79 Claims, 12 Drawing Sheets

(51) Int. Cl.
  *H01L 21/02* (2006.01)
  *H01L 21/033* (2006.01)
  *G03F 7/20* (2006.01)
  *H01L 21/027* (2006.01)
  *G03F 1/22* (2012.01)
  *G03F 7/16* (2006.01)

(52) U.S. Cl.
  CPC ............ *G03F 7/167* (2013.01); *G03F 7/2004* (2013.01); *G03F 7/70033* (2013.01); *H01L 21/0274* (2013.01); *H01L 21/02274* (2013.01); *H01L 21/0332* (2013.01)

(58) Field of Classification Search
  USPC .............................. 430/270.1, 280.1; 257/635
  See application file for complete search history.

(56) References Cited

U.S. PATENT DOCUMENTS

| | | | |
|---|---|---|---|
| 3,576,755 A | 4/1971 | Patella et al. |
| 3,720,515 A | 3/1973 | Stanley |
| 4,241,165 A | 12/1980 | Hughes et al. |
| 4,328,298 A | 5/1982 | Nester |
| 4,590,149 A | 5/1986 | Nakane et al. |
| 4,834,834 A | 5/1989 | Ehrlich et al. |
| 4,842,989 A | 6/1989 | Taniguchi et al. |
| 4,845,053 A | 7/1989 | Zajac |
| 5,077,085 A | 12/1991 | Schnur et al. |
| 5,322,765 A | 6/1994 | Clecak et al. |
| 5,534,312 A | 7/1996 | Hill et al. |
| 6,017,553 A | 1/2000 | Burrell et al. |
| 6,162,577 A | 12/2000 | Felter et al. |
| 6,261,938 B1 | 7/2001 | Beauvais et al. |
| 6,290,779 B1 | 9/2001 | Saleh et al. |
| 6,348,239 B1 | 2/2002 | Hill et al. |
| 6,607,867 B1 | 8/2003 | Kim et al. |
| 6,797,439 B1 | 9/2004 | Alpay |
| 8,465,903 B2 | 6/2013 | Weidman et al. |
| 8,664,124 B2 | 3/2014 | Graff |
| 8,664,513 B2 | 3/2014 | Pfenninger et al. |
| 9,023,731 B2 | 5/2015 | Ji et al. |
| 9,310,684 B2 | 4/2016 | Meyers et al. |
| 9,551,924 B2 | 1/2017 | Burkhardt et al. |
| 9,778,561 B2 | 10/2017 | Marks et al. |
| 9,823,564 B2 | 11/2017 | Stowers et al. |
| 9,996,004 B2 | 6/2018 | Smith et al. |
| 10,025,179 B2 | 7/2018 | Meyers et al. |
| 10,228,618 B2 | 3/2019 | Meyers et al. |
| 10,416,554 B2 | 9/2019 | Meyers et al. |
| 10,514,598 B2 | 12/2019 | Marks et al. |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,831,096 B2 | 11/2020 | Marks et al. |
| 2002/0017243 A1 | 2/2002 | Pyo |
| 2002/0180372 A1 | 12/2002 | Yamazaki |
| 2003/0008246 A1 | 1/2003 | Cheng et al. |
| 2003/0183244 A1 | 10/2003 | Rossman |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0213563 A1 | 10/2004 | Irie |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0175558 A1 | 8/2006 | Bakker et al. |
| 2007/0074541 A1 | 4/2007 | Badding et al. |
| 2007/0181816 A1 | 8/2007 | Ikeda et al. |
| 2008/0157011 A1 | 7/2008 | Nagai et al. |
| 2009/0208880 A1 | 8/2009 | Nemani et al. |
| 2009/0239155 A1 | 9/2009 | Levinson et al. |
| 2009/0305174 A1 | 12/2009 | Shiobara et al. |
| 2009/0325387 A1 | 12/2009 | Chen et al. |
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0304027 A1 | 12/2010 | Lee et al. |
| 2011/0104595 A1 | 5/2011 | Hayashi et al. |
| 2011/0198756 A1 | 8/2011 | Thenappan et al. |
| 2011/0209725 A1 | 9/2011 | Kim et al. |
| 2012/0088193 A1 | 4/2012 | Weidman et al. |
| 2012/0088369 A1 | 4/2012 | Weidman et al. |
| 2012/0202357 A1 | 8/2012 | Sato et al. |
| 2012/0223418 A1 | 9/2012 | Stowers et al. |
| 2012/0322011 A1 | 12/2012 | Wu et al. |
| 2013/0129995 A1 | 5/2013 | Ouattara et al. |
| 2013/0157177 A1 | 6/2013 | Yu et al. |
| 2013/0224652 A1 | 8/2013 | Bass et al. |
| 2014/0014745 A1 | 1/2014 | Burrows et al. |
| 2014/0170563 A1 | 6/2014 | Hatakeyama |
| 2014/0170853 A1 | 6/2014 | Shamma et al. |
| 2014/0209015 A1 | 7/2014 | Yamada et al. |
| 2014/0239462 A1 | 8/2014 | Shamma et al. |
| 2014/0268082 A1 | 9/2014 | Michaelson et al. |
| 2014/0272726 A1 | 9/2014 | Chang |
| 2015/0056542 A1 | 2/2015 | Meyers et al. |
| 2015/0079393 A1 | 3/2015 | Freedman et al. |
| 2015/0125679 A1 | 5/2015 | Ishikawa |
| 2015/0152551 A1 | 6/2015 | Yamaguchi et al. |
| 2015/0221519 A1 | 8/2015 | Marks et al. |
| 2015/0303064 A1 | 10/2015 | Singer et al. |
| 2016/0011505 A1 | 1/2016 | Stowers et al. |
| 2016/0011516 A1 | 1/2016 | Devilliers |
| 2016/0035631 A1 | 2/2016 | Lee et al. |
| 2016/0116839 A1 | 4/2016 | Meyers et al. |
| 2016/0216606 A1 | 7/2016 | Meyers et al. |
| 2016/0284559 A1 | 9/2016 | Kikuchi et al. |
| 2016/0357107 A1 | 12/2016 | Buchberger, Jr. et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0261850 A1 | 9/2017 | Stowers et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0046086 A1 | 2/2018 | Waller et al. |
| 2018/0122648 A1 | 5/2018 | Kim et al. |
| 2018/0166278 A1 | 6/2018 | Belyansky et al. |
| 2018/0224744 A1 | 8/2018 | Bae et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2019/0094685 A1 | 3/2019 | Marks et al. |
| 2019/0129307 A1 | 5/2019 | Kwon et al. |
| 2019/0137870 A1 | 5/2019 | Meyers et al. |
| 2019/0153001 A1 | 5/2019 | Cardineau et al. |
| 2019/0172714 A1 | 6/2019 | Bobek et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0348292 A1* | 11/2019 | Dutta .................. H01L 21/3081 |
| 2019/0369489 A1 | 12/2019 | Meyers et al. |
| 2019/0391486 A1 | 12/2019 | Jiang et al. |
| 2020/0064733 A1 | 2/2020 | Meyers et al. |
| 2020/0089104 A1 | 3/2020 | Marks et al. |
| 2020/0124970 A1 | 4/2020 | Kocsis et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |

(56) References Cited

U.S. PATENT DOCUMENTS

| | | |
|---|---|---|
| 2020/0292937 A1 | 9/2020 | Stowers et al. |
| 2021/0013034 A1 | 1/2021 | Wu et al. |

FOREIGN PATENT DOCUMENTS

| | | |
|---|---|---|
| JP | H07106224 A | 4/1995 |
| JP | 2003213001 A | 7/2003 |
| JP | 2003532303 A | 10/2003 |
| JP | 2004006798 A | 1/2004 |
| JP | 2005504146 A | 2/2005 |
| JP | 2006253282 A | 9/2006 |
| JP | 2011520242 A | 7/2011 |
| JP | 2011529126 A | 12/2011 |
| JP | 2012185485 A | 9/2012 |
| JP | 2014521111 A | 8/2014 |
| JP | 2015201622 A | 11/2015 |
| KR | 20090042059 A | 4/2009 |
| KR | 20130093038 A | 8/2013 |
| KR | 20140106442 A | 9/2014 |
| TW | 201224190 A | 6/2012 |
| TW | 201241555 A | 10/2012 |
| WO | WO-03029015 A2 | 4/2003 |
| WO | WO-2004095551 A1 | 11/2004 |
| WO | WO-2011081151 A1 | 7/2011 |
| WO | WO-2012048094 A3 | 7/2012 |
| WO | WO-2014152023 A1 | 9/2014 |
| WO | WO-2016065120 A1 | 4/2016 |
| WO | WO-2016144960 A1 | 9/2016 |
| WO | WO-2017066319 A2 | 4/2017 |
| WO | WO-2017198418 A1 | 11/2017 |
| WO | WO-2018004551 A1 | 1/2018 |
| WO | WO-2019217749 A1 | 11/2019 |
| WO | WO-2020102085 A1 | 5/2020 |
| WO | WO-2020263750 A1 | 12/2020 |
| WO | WO-2021072042 A1 | 4/2021 |

OTHER PUBLICATIONS

Chinese First Office Action dated May 24, 2017 issued in Application No. CN 201510053668.7.
Chinese Second Office Action dated Feb. 28, 2018 issued in Application No. CN 201510053668.7.
Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.
Extended European Search Report dated Dec. 23, 2021, in Application No. EP19800353.5.
Gerritsen et al., (Apr. 1, 1986) "Laser-generated plasma as soft x-ray source," J. Appl. Phys., 59(7):2337-2344.
Hamley, I.W., "Nanostructure fabrication using block copolymers", Nanotechnology. Sep. 17, 2003;14(10):R39-R54.
Hench, L.L. and West, J.K., "The sol-gel process," Chemical reviews, Jan. 1, 1990; 90(1) pp. 33-72.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 8, 2020 issued in Application No. PCT/US2020/038968.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Nazarov, D.V., et al., "Atomic layer deposition of tin dioxide nanofilms: A review", Rev. Adv. Mater. Sci. Jun. 1, 2015; 40(3):262-75.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
U.S. Final Office Action, dated May 11, 2017, issued in U.S. Appl. No. 14/610,038.

(56) References Cited

OTHER PUBLICATIONS

U.S. Final Office Action, dated Sep. 10, 2018, issued in U.S. Appl. No. 15/691,659.
U.S. Notice of Allowance, dated Apr. 25, 2018 issued in U.S. Appl. No. 14/948,109.
U.S. Notice of Allowance, dated Aug. 22, 2017, issued in U.S. Appl. No. 14/610,038.
U.S. Notice of Allowance, dated Jul. 28, 2020, issued in U.S. Appl. No. 16/206,959.
U.S. Notice of Allowance dated Sep. 15, 2021, issued in U.S. Appl. No. 16/691,508.
U.S. Notice of Allowance, dated Sep. 19, 2019, issued in U.S. Appl. No. 15/691,659.
U.S. Notice of Allowance dated Sep. 9, 2021, issued in U.S. Appl. No. 16/691,508.
U.S. Office Action, dated Apr. 9, 2019, issued in U.S. Appl. No. 15/691,659.
U.S. Office Action, dated Jan. 23, 2017, issued in U.S. Appl. No. 14/610,038.
U.S. Office Action, dated Mar. 5, 2020, issued in U.S. Appl. No. 16/206,959.
U.S. Office Action dated May 14, 2021, issued in U.S. Appl. No. 16/691,508.
U.S. Office Action, dated May 21, 2018, issued in U.S. Appl. No. 15/691,659.
U.S. Office Action, dated Nov. 2, 2017, issued in U.S. Appl. No. 14/948,109.
U.S. Appl. No. 17/309,247, Weidman et al., filed May 11, 2021.
U.S. Appl. No. 17/309,587, Volosskiy et al., filed Jun. 8, 2021.
U.S. Appl. No. 17/452,365, Tan et al., filed Oct. 26, 2021.
Xu, et al., "Underlayer designs to enhance the performance of EUV resists," Proceedings of SPIE, vol. 7273, 2009, pp. 727311-1-727311-11.
Korean Office Action, dated Feb. 8, 2022, with machine translation, issued in Application No. KR 10-2015-0015184.
European Search Report dated Feb. 15, 2022, in Application No. EP21741104.

* cited by examiner

| Underlayer density [g/cm³] | AHM | Embodiment 1 | Embodiment 2 | SOC |
|---|---|---|---|---|
| | 1.5 | 1.06 | 1.3 | 1.26 |
| CDSEM | | | | |
| LnCD / LWR$_{unbi}$ | 15.8/3.0 | 16.0/3.0 | 16.5/2.9 | 16.2/2.9 |

FIG. 3

| DtS | 43 mj/cm2 | 49 mj/cm2 |
|---|---|---|
| Pulsing Bias | 140W DC 10 | 140W DC 50 |
|  |  |  |
| LnCD | 15.7 | 15.6 |
| Unbiased LWR/SpWR | 2.47/2.66 | 2.26/2.23 |
| LF/MF/HF$_{spwr}$ | 1.87/1.67/0.83 | 1.40/1.56/0.70 |
| Undercut | 3.5 nm undercut from each side | 1.5 nm undercut from each side |

UNDERLAYER FOR PHOTORESIST ADHESION AND DOSE REDUCTION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

This disclosure relates generally to the field of semiconductor processing, and in particular to extreme ultraviolet (EUV) photoresist (PR) lithography techniques and materials.

BACKGROUND

As semiconductor fabrication continues to advance, feature sizes continue to shrink, and new processing methods are needed. One area where advances are being made is in the context of patterning, for example using photoresist materials that are sensitive to lithographic radiation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, materials, apparatus, and systems for depositing an underlayer on a substrate.

In a first aspect, the present disclosure encompasses a patterning structure including: a radiation-sensitive imaging layer disposed over a substrate; and an underlayer disposed between the substrate and the imaging layer. In some embodiments, the underlayer is configured to: increase adhesion between the substrate and the imaging layer and/or reduce a radiation dose for effective photoresist exposure of the imaging layer.

In some embodiments, the substrate further includes a hardmask disposed thereon.

In some embodiments, the imaging layer includes an Extreme Ultraviolet (EUV)-sensitive inorganic photoresist layer. In particular embodiments, the imaging layer is a chemical vapor deposited (CND) film, an atomic layer deposition (ALD) film, or a spin-on film. In other embodiments, the imaging layer includes a tin oxide film or a tin oxide hydroxide film.

In some embodiments, the substrate is or includes a hardmask, amorphous carbon film, amorphous hydrogenated carbon film, silicon oxide film, silicon nitride film, silicon oxynitride film, silicon carbide film, silicon boronitride film, amorphous silicon film, polysilicon film, or a combination thereof. In particular embodiments, the amorphous carbon film is doped with boron (B) or tungsten (W).

In some embodiments, the underlayer has a thickness of no more than 25 nm. In other embodiments, the underlayer has a thickness of about 2 to 20 nm.

In particular embodiments, the underlayer includes a hydrogenated carbon doped with oxygen (O), silicon (Si), nitrogen (N), tungsten (W), boron (B), iodine (I), chlorine (Cl), or a combination of two or more of any of these. In particular embodiments, the underlayer includes about 0-30 atomic % oxygen (O) and/or about 20-50 atomic % hydrogen (H) and/or 30-70 atomic % carbon (C). In other embodiments, the underlayer includes the hydrogenated carbon doped with iodine configured to improve generation of secondary electrons upon exposure to radiation. In yet other embodiments, a surface of the underlayer includes hydroxyl groups (e.g., —OH), carboxyl groups (e.g., —CO$_2$H), peroxy groups (e.g., —OOH), sp$^2$ carbons, sp carbons, and/or unsaturated carbon-containing bonds (e.g., C=C and/or C≡C bonds).

In some embodiments, the underlayer includes a density of about 0.7 to 2.9 g/cm$^3$. In other embodiments, the underlayer further provides increased etch selectivity. In yet other embodiments, the underlayer further provides decreased line edge and line width roughness and/or decreased dose to size.

In particular embodiments, the underlayer further includes beta hydrogen atoms configured to be released upon exposure to radiation and/or oxygen atoms configured to form oxygen bonds to an atom in the imaging layer.

In a second aspect, the present disclosure encompasses a patterning structure including: a substrate including a partially fabricated semiconductor device film stack; a radiation-sensitive imaging layer disposed over the substrate; and an underlayer disposed between the substrate and the imaging layer. In particular embodiments, the underlayer includes a vapor deposited film of hydrogenated carbon doped with O, Si, N, W, B, Cl, or a combination of two or more of any of these, wherein the film has a thickness of no more than about 25 nm or a thickness of about 2 to 20 nm. In yet other embodiments, the substrate further includes an amorphous carbon hardmask disposed on the substrate and/or disposed on the partially fabricated semiconductor device film stack. In some embodiments, the amorphous carbon hardmask is doped.

In a third aspect, the present disclosure encompasses a method of making a patterning structure, including: providing a substrate; depositing an underlayer (e.g., any described herein) on the substrate; and forming a radiation-sensitive imaging layer on the underlayer. In some embodiments, the underlayer is configured to: increase adhesion between the substrate and the photoresist and/or reduce radiation dose for effective photoresist exposure.

In some embodiments, the substrate is a partially fabricated semiconductor device film stack. In other embodiments, the substrate further comprises a hardmask, amorphous carbon film, amorphous hydrogenated carbon film, silicon oxide film, silicon nitride film, silicon oxynitride film, silicon carbide film, silicon boronitride film, amorphous silicon film, polysilicon film, or a combination thereof, disposed thereon the substrate and/or the partially, fabricated semiconductor device film stack; the imaging layer includes a tin oxide-based photoresist or a tin oxide hydroxide-based photoresist; and the underlayer includes a vapor deposited film of hydrogenated carbon doped with O, Si, N, W, B, I, Cl, or a combination of two or more of any of these, wherein the film has a thickness of no more than 25 nm.

In some embodiments, the underlayer is vapor deposited on the substrate using a hydrocarbon precursor, thereby providing a carbon-containing film. In particular embodiments, the hydrocarbon precursor includes an alkane, an alkene, an alkyne, or other hydrocarbon precursors described herein. In other embodiments, the underlayer is vapor deposited using the hydrocarbon precursor in the presence or absence of an oxocarbon precursor (e.g., any described herein including carbon and oxygen atoms).

In yet other embodiments, the underlayer is vapor deposited using the hydrocarbon precursor in the presence of a nitrogen-containing precursor, a tungsten-containing precursor, a boron-containing precursor, and/or an iodine-containing precursor, thereby providing a doped film. In some embodiments, the doped film includes iodine; a combination of iodine and silicon; or a combination of iodine, silicon, and nitrogen.

In some embodiments, the underlayer is vapor deposited on the substrate using an oxocarbon precursor that co-reacts with hydrogen ($H_2$) or a hydrocarbon. In other embodiments, the oxocarbon precursor co-reacts with $H_2$ or a hydrocarbon and optionally further co-reacts with a Si source dopant. In particular embodiments, the underlayer is vapor deposited on the substrate by using a Si-containing precursor that co-reacts with an oxidizer (e.g., an oxocarbon or an O-containing precursor). In further embodiments, the Si-containing precursor further co-reacts with a C source dopant (e.g., a hydrocarbon precursor).

In some embodiments, said depositing further includes applying a bias at a bias power of 0 W to about 1000 W (e.g., from 0-500 W, 0-400 W, or 0-300 W) and using a duty cycle of about 1% to 100% or about 5% to 100%. In particular embodiments, said applying the bias provides the underlayer having an increased density, as compared to an underlayer formed without applying the bias.

In some embodiments, the underlayer is vapor deposited on the substrate by plasma enhanced chemical vapor deposition (PECVD) as a termination operation of a vapor deposition on the substrate. In other embodiments, the underlayer is vapor deposited on the substrate by PECVD or ALD.

In further embodiments, the method includes (e.g., after said depositing) modifying the underlayer to provide a roughened surface. In some embodiments, said modifying can include sputtering by way of non-reactive ion bombardment of a surface of the underlayer, thereby providing the roughened surface. Non-limiting non-reactive ions can include argon (Ar), helium (He), krypton (Kr), or other non-reactive species. In other embodiments, modifying can include exposing a surface of the underlayer or the roughened surface to an oxygen-containing plasma to provide an oxygen-containing surface. Non-limiting oxygen-containing plasma can include carbon dioxide ($CO_2$), oxygen ($O_2$), or water (as $H_2O$ or as mixtures of $H_2$ and $O_2$).

In a fourth aspect, the present disclosure encompasses a method of depositing an underlayer, the method including: providing a substrate in a process chamber; and depositing by a PECVD process a hydrogenated carbon film on a surface of the substrate, wherein the hydrogenated carbon film is a low density film. In some embodiments, the substrate is or includes a hardmask.

In some embodiments, the PECVD process includes introducing a carbon-containing precursor selected from methane ($CH_4$), acetylene ($C_2H_2$), ethylene ($C_2H_4$), propylene ($C_3H_6$), propyne ($C_3H_4$), allene ($C_3H_4$), cyclopropene ($C_3H_4$), butane ($C_4H_{10}$), cyclohexane ($C_6H_{12}$), benzene ($C_6H_6$), and toluene ($C_7H_8$). In other embodiments, the PECVD process further includes introducing nitrogen-containing precursor, a tungsten-containing precursor, a boron-containing precursor, and/or an iodine-containing precursor, thereby providing a doped film.

In some embodiments, the PECVD process includes a transformer coupled plasma (TCP) or an inductively coupled plasma (ICP). In particular embodiments, a TCP power is about 100-1000 W with no bias. In other embodiments, the PECVD process further includes a pressure of about 10-1000 mTorr and/or a temperature of about 0-100° C. In yet other embodiments, the PECVD process further includes an applied pulsed bias including a power of about 10-1000 W or an applied continuous wave bias including a power of about 10-500 W. In further embodiments, the applied pulsed bias includes a duty cycle of about 1-99% and a pulsing frequency of about 10-2000 Hz.

In further embodiments, the method includes (e.g., after said depositing) modifying the hydrogenated carbon film to provide a roughened surface. In some embodiments, said modifying can include sputtering by way of non-reactive ion bombardment of a surface of the film, thereby providing the roughened surface. Non-limiting non-reactive ions can include argon (Ar), helium (He), krypton (Kr), or other non-reactive species. In other embodiments, modifying can include exposing a surface of the film or the roughened surface to an oxygen-containing plasma to provide an oxygen-containing surface. Non-limiting oxygen-containing plasma can include carbon dioxide ($CO_2$), oxygen ($O_2$), or water (as $H_2O$ or as mixtures of $H_2$ and $O_2$).

In a fifth aspect, the present disclosure features an apparatus for processing a substrate, the apparatus including: a process chamber including a substrate support; a process gas source connected with the process chamber and associated flow-control hardware; substrate handling hardware connected with the process chamber; and a controller having a processor and a memory, wherein the processer and the memory are communicatively connected with one another. In particular embodiments, the processor is at least operatively connected with the flow-control and substrate handling hardware.

In particular embodiments, the substrate support can be a chuck or a pedestal. In other embodiments, the apparatus includes one or more gas inlets into the process chambers, in which the gas inlet(s) are fluidically connected to the process gas source and the associated flow-control hardware; and one or more gas outlets for removing materials from the process chamber and associated flow-control hardware.

In some embodiments, the memory stores computer-executable instructions for conducting the operations recited in any methods described herein. In one embodiment, the computer-executable instructions include machine-readable instructions for causing providing a substrate or a hardmask disposed on a substrate; causing deposition of an underlayer (e.g., any described herein) on the substrate and/or the hardmask; and causing formation of a radiation-sensitive imaging layer (e.g., any described herein) on the underlayer.

In another embodiment, the computer-executable instructions include machine-readable instructions for causing deposition by a PECVD process a hydrogenated carbon film (e.g., any described herein) on a surface of the substrate or the hardmask. In further embodiments, the computer-executable instructions include machine-readable instructions for causing formation of a radiation-sensitive imaging layer (e.g., any described herein) on the hydrogenated carbon film.

In particular embodiments, said causing deposition of the underlayer includes introducing or delivering one or more precursors (e.g., a hydrocarbon precursor, an oxocarbon precursor, a C-containing precursor, an O-containing precursor, an Si-containing precursor, an N-containing precursor, a W-containing precursor, a B-containing precursor, an I-containing precursor, or a Cl-containing precursor) and/or one or more process gases (e.g., any described herein).

In other embodiments, said causing deposition of the underlayer includes a plasma (e.g., transformer coupled plasma (TCP), inductively coupled plasma (ICP), or capacitively coupled plasma (CCP)). In particular embodiments, the plasma is TCP or ICP with a power of about 100-1000 W, a pressure of about 10-1000 mTorr, and/or a temperature of about 0-100° C. In yet other embodiments, the plasma further comprises an applied pulsed bias (e.g., a power of about 10-1000 W) or an applied continuous wave bias (e.g., a power of about 10-500 W).

In some embodiments, said causing formation of the imaging layer includes causing deposition of an element having a high patterning radiation-absorption cross-section. In particular embodiments, the element has a high EUV absorption cross-section (e.g., equal to or greater than $1 \times 10^7$ $cm^2/mol$).

In other embodiments, causing formation of the imaging layer includes introducing or delivering one or more precursors (e.g., a structure having formula (I), (II), (IIa), (III), (IV), (V), (VI), (VII), or (VIII)). In some embodiments, causing formation of the imaging layer can further include providing the one or more precursors in the presence of the counter-reactant. Non-limiting counter-reactants include an oxygen-containing counter-reactant, including oxygen ($O_2$), ozone ($O_3$), water, a peroxide, hydrogen peroxide, oxygen plasma, water plasma, an alcohol, a dihydroxy alcohol, a polyhydroxy alcohol, a fluorinated dihydroxy alcohol, a fluorinated polyhydroxy alcohol, a fluorinated glycol, formic acid, and other sources of hydroxyl moieties, as well as combinations thereof.

In any embodiment herein, the substrate is or includes a partially fabricated semiconductor device film stack.

In any embodiment herein, the substrate is a hardmask. In other embodiments, the substrate includes a hardmask. In yet other embodiments, the substrate includes a hardmask disposed on a work piece (e.g., disposed on a wafer, a semiconductor wafer, a stack, a partially fabricated integrated circuit, a partially fabricated semiconductor device film stack, a film, a surface, etc.). In non-limiting instances, the hardmask includes an amorphous carbon hardmask, which can be optionally doped.

In any embodiment herein, the imaging layer includes an EUV-sensitive inorganic photoresist layer. In particular embodiments, the imaging layer includes a tin oxide film, a tin oxide hydroxide film, a tin oxide-based photoresist, or a tin oxide hydroxide-based photoresist. In other embodiments, the imaging layer includes an EUV-sensitive film, a DUV-sensitive film, a UV-sensitive film, a photoresist film, a photopatternable film.

In any embodiment herein, the substrate is or includes a hardmask, amorphous carbon film, amorphous hydrogenated carbon film, silicon oxide film, silicon nitride film, silicon oxynitride film, silicon carbide film, silicon boronitride film, amorphous silicon film, polysilicon film, or a combination thereof. In some embodiments, the hardmask is an amorphous carbon film, amorphous hydrogenated carbon film, silicon oxide film, silicon nitride film, silicon oxynitride film, silicon carbide film, silicon boronitride film, amorphous silicon film, polysilicon film, or a combination thereof.

In any embodiment herein, the underlayer includes a hydrogenated carbon doped with oxygen (O), silicon (Si), nitrogen (N), tungsten (W), boron (B), iodine (I), chlorine (Cl), or a combination of two or more of any of these.

In any embodiment herein, the underlayer or a surface of the underlayer includes hydroxyl groups (e.g., —OH), carboxyl groups (e.g., —$CO_2H$), peroxy groups (e.g., —OOH), $sp^2$ carbons, sp carbons, and/or unsaturated carbon-containing bonds (e.g., C=C and/or C≡C bonds).

In any embodiment herein, the underlayer includes a doped film. In particular embodiments, the doped film includes I; a combination of I and Si; or a combination of I, Si, and N. In some embodiments, the doped film includes Cl; a combination of Cl and Si; or a combination of Cl, Si, and N. In other embodiments, the doped films includes N; a combination of N and Si; or a combination of N, Si, and O. In yet other embodiments, the doped film includes B or W.

In any embodiment herein, the underlayer includes about 0-30 atomic % O (e.g., 1-30%, 2-30%, or 4-30%), about 20-50 atomic % H (e.g., 20-45%, 30-50%, or 30-45%), and/or 30-70 atomic % C (e.g., 30-60%, 30-65%, or 30-68%).

In any embodiment herein, the underlayer includes a density less than about 1.5 $g/cm^3$ or a density of about 0.7-1.4 $g/cm^3$. In yet other embodiments, the doped film has a density of about 0.7-1.4 $g/cm^3$.

In any embodiment herein, the underlayer further provides increased etch selectivity. In yet other embodiments, the underlayer further provides decreased line edge and line width roughness and/or decreased dose to size. In particular embodiments, the underlayer further includes beta hydrogen atoms configured to be released upon exposure to radiation and/or oxygen atoms configured to form oxygen bonds to an atom in the imaging layer.

In any embodiment herein, depositing includes providing or depositing the precursor(s) in vapor form. In other embodiments, depositing includes providing one or more counter-reactant(s) in vapor form. In particular embodiments, depositing includes CVD, ALD, or plasma-enhanced forms thereof (e.g., PECVD).

In any embodiment herein, depositing can include delivering or introducing one or more precursors described herein. Non-limiting precursors include a hydrocarbon precursor, an oxocarbon precursor, and/or a dopant precursor (e.g., an O-containing precursor, an Si-containing precursor, an N-containing precursor, a W-containing precursor, a B-containing precursor, an I-containing precursor, or a Cl-containing precursor). Said depositing can also include delivering or introducing one or more process gases, such as an inert gas, carbon monoxide (CO), carbon dioxide ($CO_2$), helium (He), argon (Ar), krypton (Kr), neon (Ne), nitrogen ($N_2$), hydrogen ($H_2$), or combinations thereof.

In any embodiment herein, depositing can include providing a plasma. Providing can include a PECVD process. Non-limiting plasma processes can include TCP, ICP, or CCP. Other non-limiting process conditions include a pressure of >1 milliTorr (mTorr) (e.g., from about 5-1000 mTorr), a power level of <4000 Watts (W) (e.g., from about 10-3000 W), and/or a temperature of <200° C. (e.g., from about 0-100° C.). Plasma can be generated with a power between about 10-3000 W with a radio frequency (RF) source operating at 0.3-600 MHz. Bias can be applied using an applied pulsed bias (e.g., a power of about 10-1000 W) or an applied continuous wave bias (e.g., a power of about 10-50011'), as described herein.

Other features and advantages of the invention will be apparent from the following description and the claims.

BRIEF DESCRIPTION OF THE DRAWINGS

FIG. 3 shows film properties for various embodiments of an ashable hardmask (AHM), two embodiments of underlayers (Embodiments 1 and 2), and a Spin-On-Carbon (SOC) film. Provided are parameters such as critical dimension scanning electron micrograph (CDSEM) and ratio of line critical dimension (LnCD) to the unbiased line width roughness ($LWR_{unbi}$) (ratio indicated as $LnCD/LWR_{unbi}$).

DETAILED DESCRIPTION

Figure 1:
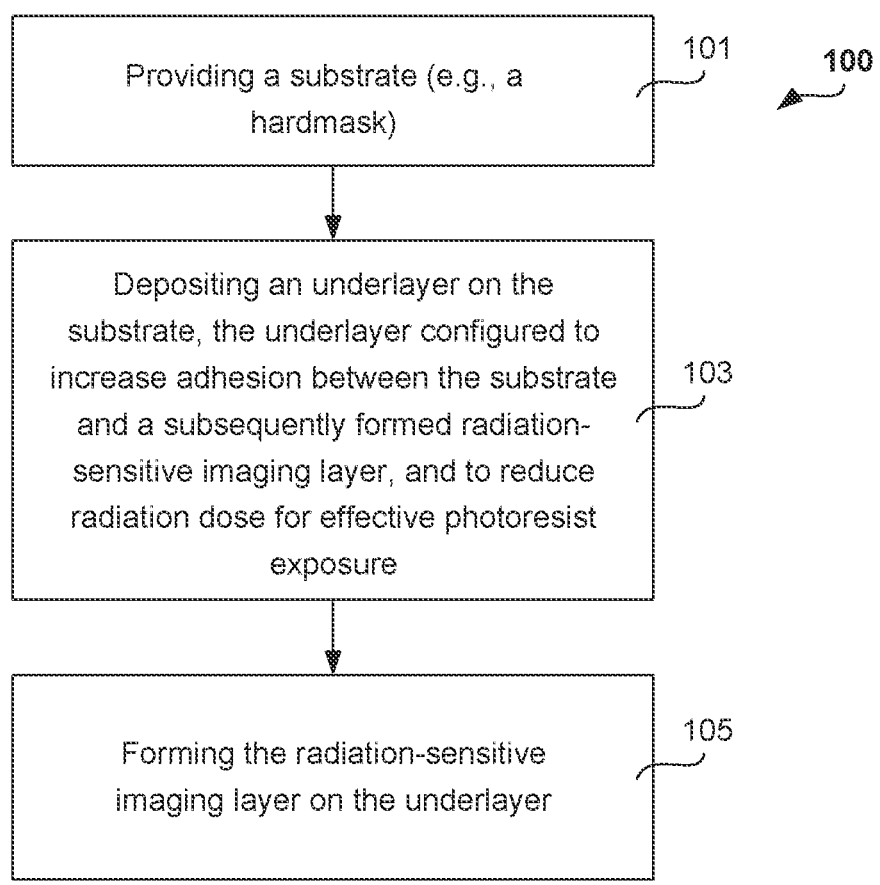
FIG. 1 presents a process flow diagram for a non-limiting method 100.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Extreme ultraviolet (EUV) lithography typically at a wavelength of 13.5 nm is considered as the next enabling technology for lithographic patterning. However, a number of technological stumbling blocks have delayed the widespread introduction and implementation of this technique. EUV photoresist (PR) is one of the roadblocks.

Traditional chemically amplified resist (CAR) provides a cost-effective approach. But organic polymer CARs generate line edge roughness (LER) and line width roughness (LWR), and have sensitivity and resolution limitations due to random fluctuation of the use of polymer. Recent research and development efforts have focused on new EUV inorganic photoresist platform development. Such systems offer several advantages compared to a polymer-based CAR system. These inorganic photoresists are generally based on metal oxides, including metal hydroxide oxides. The small metal oxide molecule size enhances ultimate resolution of the patterning step, and metal oxide photoresists generally show higher etch resistance than CAR, which can reduce PR thickness to reduce structure aspect ratio.

However, there are various challenges associated with inorganic PR, as well. Spin-On-Carbon (SOC) hardmask materials are often used in hardmask film stacks to which EUV PRs are applied for patterning. But SOCs have a soft carbon (C)-rich film with poor etch resistance and poor LWR. Common hardmask materials such as silicon oxide (e.g., silicon dioxide, $SiO_2$), silicon nitride, and ashable hardmasks (AHMs) can be used directly under PR for better etch selectivity and good LER and LWR. But delamination between EUV PR and hardmask material, particularly after wet development of the EUV-exposed PR, is a persistent problem. And only about twenty percent of the EUV photons are absorbed by a typical PR, meaning that a large amount of primary and secondary electrons will often be created in a PR underlayer. Dose to Size (DtS) data have shown that there is higher dose required for EUV inorganic PR disposed directly on a common hardmask material than for EUV inorganic PR on SOC for resolving the same line critical dimension.

As described herein, a thin underlayer film disposed directly under the EUV inorganic PR enables a film stack EUV inorganic PR having improved performance. With this underlayer, the resulting multilayer (e.g., bilayer) hardmask scheme has comparable or better DtS performance, as compared to EUV inorganic PR directly on a SOC stack. And the underlayer can also serve as an adhesion layer between the EUV inorganic PR and the hardmask, regardless of hardmask film composition, which enables improved etch selectivity and LER/LWR performance. Surfaces other than a hardmask can be employed below the underlayer, in which the underlayer can serve as an adhesion layer between the EUV Pit, and any useful substrate (e.g., a hardmask, a wafer, a partially fabricated semiconductor device film stack, etc.).

As further described below, suitable underlayer thin films can be deposited by chemical vapor deposition (CVD), plasma enhanced chemical vapor deposition (PECVD), atomic layer deposition (ALD), plasma enhanced atomic layer deposition (PEALD), or other vapor deposition methods (e.g. by sputter deposition, physical vapor deposition (PVD) including PVD co-sputtering). The underlayer deposition process can be implemented in either an etch tool (e.g., Kiyo® or Flex®, available from Lam Research Corporation, Fremont, Calif.) or a deposition tool (e.g., Lam Striker®). In some implementations, it can be integrated as a termination step in a hardmask deposition process. Different film compositions of the underlayer can be chosen depending on the film stack.

It should also be understood that while the present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources; X-ray, which formally includes EUV at the lower energy range of the X-ray range; as well as e-beam, which can cover a wide energy range. Such methods include those where a substrate, having exposed hydroxyl groups, is contacted with a hydrocarbyl-substituted tin capping agent to form a hydrocarbyl-terminated tin oxide (SnOx) film as the imaging/PR layer on the surface of the substrate. The specific methods may depend on the particular materials and applications used in the semiconductor substrate and ultimate semiconducting device. Thus, the methods described in this application are merely exemplary of the methods and materials that may be used in present technology.

FIG. 1 depicts a process flow for one aspect of this disclosure, a method of making a patterning structure. The method 100 involves, at 101, providing a substrate. The substrate may be, for example, a hardmask, a film, a stack, a partially fabricated semiconductor device film stack, etc., fabricated in any suitable way. In some embodiments, the substrate may include a hardmask disposed on a work piece, such as the partially fabricated semiconductor device film stack. The hardmask, on the uppermost layer of the film stack, may have a variety of compositions, such as $SiO_2$, silicon nitride, an ashable hardmask material, and may be formed by chemical vapor deposition, for example PECVD. Ashable hardmasks composed of amorphous carbon films are desirable in some implementations. Amorphous carbon films in this context may be undoped or doped with boron (B) or tungsten (W), for example. Suitable amorphous carbon films may have a composition including about 50 to 80 atomic % carbon (C), 10 to 20 atomic % hydrogen (H), and 5 to 40 atomic % B or W dopant, for example.

Yet other substrates can be employed. For instance, the substrate can be or include an amorphous hydrogenated carbon, silicon oxide, silicon nitride, silicon oxynitride, silicon carbide, silicon boronitride, amorphous silicon, poly-silicon, or a combination of any, described herein, in any form (e.g., a bulk film, a thin film, another film, a stack, etc.).

At 103, a photoresist underlayer is deposited on the substrate. The underlayer is configured to increase adhesion between the substrate and a subsequently formed EUV-sensitive inorganic photoresist, and to reduce EUV dose for effective EUV exposure of the photoresist. The underlayer may be or include a vapor deposited film of hydrogenated carbon doped with O, silicon (Si), nitrogen (N), tungsten (W), boron (B), iodine (I), chlorine (Cl), or a combination of any of these (e.g., a combination of Si and O). In one embodiment, the film is deposited by introducing or delivering a hydrocarbon precursor (e.g., to provide carbon atoms) and a dopant precursor (e.g., to provide the doping, non-carbon atoms). In another embodiment, the film is deposited by introducing or delivering a heteroatom-containing precursor, such as an iodine-containing precursors, that provides a doped film after deposition. In particular, a hydrogenated carbon film doped with iodine can improve generation of secondary electrons upon exposure to EUV radiation. Further non-limiting precursors and dopants to provide such underlayers are described herein.

The film can have a thickness of no more than about 25 nm. For example, the photoresist underlayer may a thickness of about 2 to 20 nm, e.g., 2, 3, 4, 5, 6, 7, 8, 9, 10, 15 or 20 nm, and may optionally include about 0-30 atomic % O and/or about 20-50 atomic % hydrogen (H) and/or 30-70 atomic % C. Other underlayer properties are described herein.

In some implementations, the underlayer may be vapor deposited on the substrate by PECVD or ALD using a hydrocarbon precursor, which can be with or without carbon monoxide (CO) and/or carbon dioxide ($CO_2$). In particular embodiments, vapor deposition includes introducing or delivering a hydrocarbon precursor without CO and without $CO_2$.

In some implementations, the underlayer may be vapor deposited on the substrate by PECVD or ALD using an oxocarbon precursor that co-reacts with hydrogen ($H_2$) or a hydrocarbon. In variations on this implementation, the oxocarbon precursor may further co-react with a Si source dopant during the deposition. In particular embodiments, oxocarbon precursors can include CO or $CO_2$. Without wishing to be limited by mechanism, the use of oxocarbon precursors can include hydroxyl (—OH) groups or other oxygen-containing groups to the underlayer, which can provide a hydrophilic surface or a surface with increased hydrophilicity (as compared to an underlayer lacking such —OH or oxygen-containing groups). In non-limiting examples, a hydrophilic surface can improve adhesion between the underlayer and the PR layer.

In other implementations, the underlayer may be vapor deposited on the substrate by PECVD or ALD using a Si-containing precursor that co-reacts with an oxidizer (e.g., an oxocarbon, an O-containing precursor, CO, or $CO_2$). In variations on this implementation, the Si-containing precursor further co-reacts with a C source dopant (e.g., a hydrocarbon precursor, as described herein). Non-limiting Si-containing precursors are described herein, such as silanes, halosilanes, aminosilanes, alkoxysilanes, organosilanes, etc.

In some implementations, the underlayer may be vapor deposited on the substrate by PECVD as a termination operation of a vapor deposition on the substrate, for example by adjusting the precursor flows entering the PECVD process chamber to achieve the desired composition of the photoresist underlayer.

In other implementations, underlayer may be vapor deposited on the substrate by PECVD to provide a hydrogenated carbon film. In some embodiments, the film is a low density film (e.g., from 0.7-2.9 $g/cm^3$). In other embodiments, the undoped film (or a film prior to doping) has a density less than about 1.5 $g/cm^3$ or a density of about 0.7-1.4 $g/cm^3$. In yet other embodiments, the doped film has a density of about 0.7-1.4 $g/cm^3$.

The PECVD process can include any useful precursor or combinations of precursors. In one embodiment, the precursor is a hydrocarbon precursor (e.g., any described herein). Optionally, a doped, hydrogenated carbon film is formed by using a heteroatom-containing precursor (e.g., a nitrogen-containing precursor, a tungsten-containing precursor, a boron-containing precursor, and/or an iodine-containing precursor) during the PECVD process.

Deposition of the underlayer can include use of plasma (e.g., as in a PECVD process), including transformer coupled plasma (TCP), inductively coupled plasma (ICP), or capacitively coupled plasma (CCP). In particular embodiments, deposition can use low TCP power (e.g., about 100-1000 W) with minimum bias (e.g., no bias) to provide a low density film. Of course, higher power plasmas can be employed, as described herein. In certain embodiments, generation of plasma (e.g., TCP or ICP) can be controlled by power, which is in a continuous wave (CW) mode.

Deposition (e.g., with TCP or ICP power in CW mode) can include an applied bias (regardless of frequency) that is pulsed (e.g., in the range of about 1 Hz to about 10 kHz, such as 10-2000 Hz) with a duty cycle between about 1% and 99%. Additional pulsing frequencies and duty cycles are described herein. In some embodiments, the applied pulsed bias can be provided to control ion energy. Non-limiting applied pulsed bias power can be from about 10-1000 W, as well as other ranges described herein.

In yet other embodiments, deposition can include an applied CW bias. CW bias may also be used to control ion energy. In some embodiments, the applied CW bias power can be from 10-1000 W (e.g., 10-500 W, 10-400 W, as well as other ranges described herein).

Yet other conditions (e.g., useful for a low density film) includes use of certain pressure conditions (e.g., such as 5-1000 millitorr (inTorr), including 10-1000 mTorr, 10-500 mTorr, or 10-400 mTorr) and certain temperature conditions (e.g., such as about 0-100° C., including 0-50° C. and 10-40° C.).

Pulsed or continuous bias can be employed to fine tune properties of the film. In one embodiment, pulsed bias can provide a higher density film, as compared to a low density film prepared with 0 W of bias power. Such higher density films can, in some instances, provide increased etch resistance, as compared to the low density film. In other instances, such higher density films can provide reduced undercut, as compared to a low density film prepared with 0 W of bias power. Additional plasma conditions and processes are also described herein.

Turning again to FIG. 1, at 105, the radiation-sensitive imaging layer is formed on the underlayer. The imaging layer can include an EUV-sensitive inorganic photoresist, for example. A suitable EUV-sensitive inorganic photoresist may be a metal oxide film, such as a EUV-sensitive tin oxide-based photoresist. Such resists (also referred to as imaging layers) and their formation and use are described, for example, in International Patent Applications PCT/US2019/031618, filed May 9, 2019, published as WO2019/217749, and titled METHODS FOR MAKING EUV PATTERNABLE HARD MASKS; and PCT/US2019/060742, filed Nov. 11, 2019, published as WO2020/102085, and titled METHODS FOR MAKING HARD MASKS USEFUL IN NEXT GENERATION LITHOGRAPHY, the disclosure of which relating to the composition, deposition, and patterning of directly photopatternable metal-organic based metal oxide films to form EUV resist masks is incorporated by reference herein. As described therein, according to various embodiments, the EUV-sensitive inorganic photoresist may be a spin-on film or a vapor deposited film.

Figure 2A:
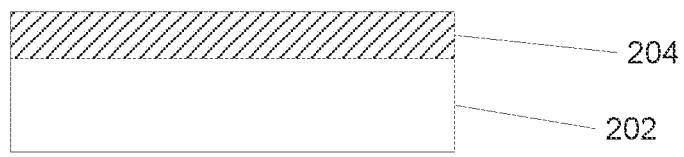
FIG. 2A-2F presents schematic diagrams of example patterning structures. Provided are (A-C) stages in the fabrication of an example patterning structure, as described herein; (I)) a cross-sectional view showing possible interactions between an imaging layer 218 and an underlayer 216; (E) a non-limiting reaction scheme within an imaging layer; and (F) a non-limiting reaction scheme between the imaging layer 228 and the underlayer 226.
Figure 2B:
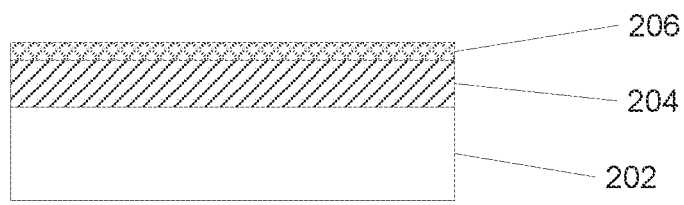
Figure 2C:
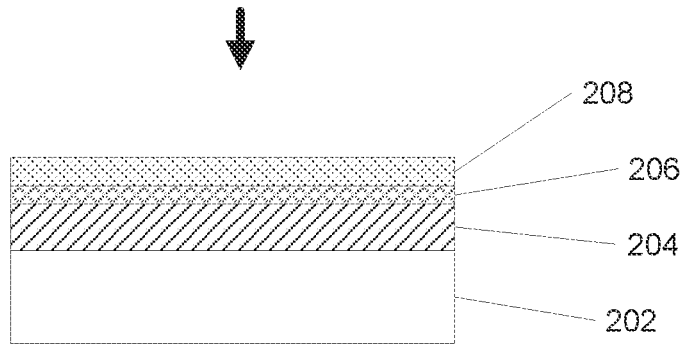

FIGS. 2A-C depict stages in the fabrication of a non-limiting patterning structure, as described herein. The patterning structure shown in FIG. 2C has a hardmask 204 disposed on a substrate 202 (e.g., a wafer or a partially fabricated semiconductor device film stack). An imaging layer 208 is disposed over the hardmask 204. And an underlayer 206 is disposed between the hardmask 204 and the imaging layer 208. The underlayer 206 can be configured to increase adhesion between the hardmask and the imaging layer, as well as to reduce radiation dose for effective photoresist exposure.

In test structures in accordance with described embodiments, DtS performance of EUV PR on an amorphous carbon AHM with an underlayer, as described herein, is as good as or even better than EUV PR on SOC, in some cases decreasing required dose by 10% or more. Furthermore, post-development peeling of the EMI PR from the hardmask bilayer (amorphous carbon AHM with a photoresist underlayer) is not observed.

The underlayer 206 can further provide increased etch selectivity and/or decreased line edge and line width roughness (LER/LWR) in the structure. In test structures in accordance with described embodiments, LER/LWR were as about good to as much as 25% or more improved relative to EUV PR on AHM or SOC.

Referring again to FIGS. 2A-C, an implementation of the fabrication of the structure of FIG. 2C is illustrated in FIGS. 2A-29. Such as described above with reference to FIG. 1, FIG. 2A shows the hardmask 204 disposed on the substrate 202, and FIG. 29 shows the underlayer 206 deposited on the hardmask 204.

Figure 2D:
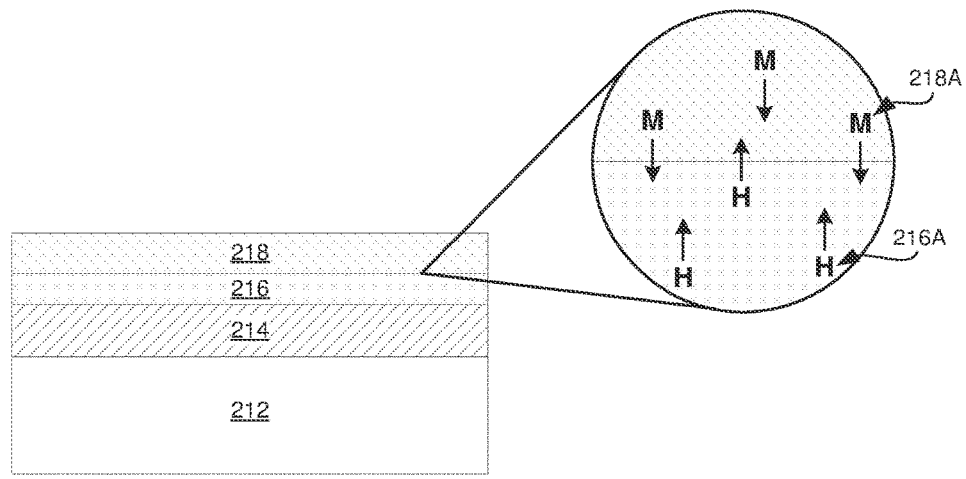

The use of an underlayer within the stack can provide improved properties. In one instance, interactions between the underlayer and the imaging layer provides a reduction in DtS. As seen in FIG. 2D, the patterning structure includes a hardmask 214 disposed on a surface of the substrate 212, as well as an underlayer 216 disposed between imaging layer 218 and the hardmask 214. Possible interactions include migration (or diffusion) of metal (M) atoms 218A from the imaging layer 218 into the underlayer 216; and/or migration (or diffusion) of hydrogen (H) atoms 216A from the underlayer 216 into the imaging layer 218. Without wishing to be limited by mechanism, such migration events can provide productive interactions between the underlayer and the imaging layer, which in turn can contribute to improved adhesion and/or DtS.

Figure 2E:
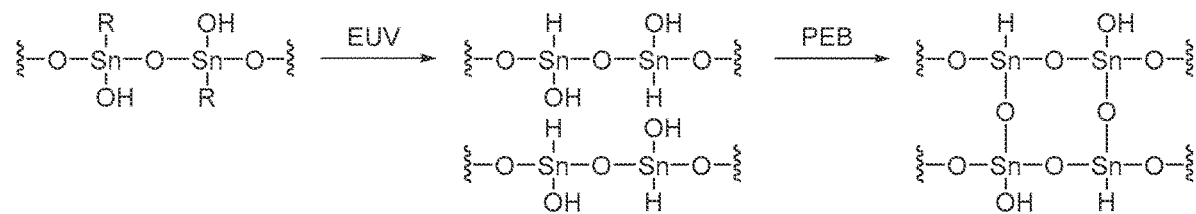

In addition, the composition of the underlayer and the imaging layer can be designed to promote favorable reactions, which in turn can improve DtS. For instance, as seen in FIG. 2E, the imaging layer can include a tin-based photoresist having a radiation-cleavable ligand. Upon exposure to radiation (e.g., EUV), the ligand (R) is eliminated from the tin (Sn) center, and an Sn—H bond is formed in its place. After a post-exposure bake (PEB) step, the Sn—H bonds participate in further thermally-activated crosslinking reactions, thereby increasing material property differences between exposed and unexposed photoresist.

Figure 2F:
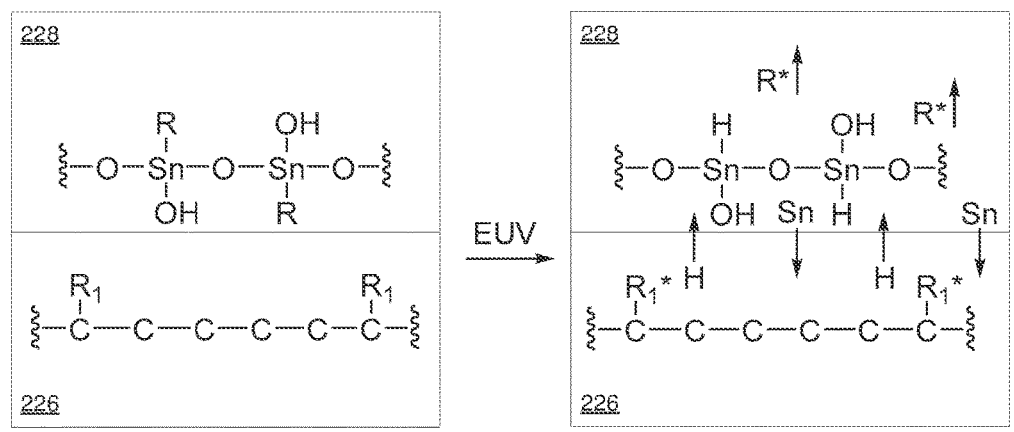

Thus, in one instance, as seen in FIG. 2F, the underlayer 226 can include ligands ($R_1$) that provide releasable H atoms, upon exposure to EUV radiation, thereby forming a reacted ligand ($R_1^*$). Possible $R_1$ groups include, e.g., an optionally substituted alkyl that can be linear or branched. In the imaging layer 228, the EUV-cleavable ligand R will provide an eliminated ligand R* and a reactive metal center Sn. The released H atoms from the underlayer 226 can facilitate formation of the Sn—H bond within the imaging layer 228, thereby reducing DtS. If the underlayer also include oxygen (O) atoms, then such atoms can form M-O bonds (e.g., Sn—O bonds) in the imaging layer, which can further reduce DtS. Furthermore, Sn atoms from the imaging layer 228 can diffuse into the underlayer 226, thereby allowing for the generation of additional secondary electrons.

Implementation 1: Dry Deposition of the Underlayer

The underlayer can be deposited in any useful manner. In one instance, deposition includes vapor deposition of a hydrocarbon precursor or a carbon-containing precursor (e.g., any described herein). Deposition can include use of a process gas (e.g., as a plasma or as an inert gas) during deposition, in which non-limiting process gases include carbon monoxide (CO), helium (He), argon (Ar), krypton (Kr), neon (Ne), nitrogen ($N_2$), and/or hydrogen ($H_2$).

Deposition conditions include control of precursor flow rate(s), gas flow rate(s), process pressure, temperature (e.g., electrostatic chuck (ESC) temperature), plasma (e.g., TCP) power, bias power, and duty cycle (DC) within the processing chamber. The flow rate of precursor(s) may be between about 1-100 standard cubic centimeter per minute (sccm). The flow rate of gas(es) may be between about 1-1600 sccm. The chamber pressure may be between about 5-1000 mTorr (e.g., 5-800 mTorr, 10-500 mTorr, 10-400 mTorr, 30-500 mTorr, 10-1000 mTorr, or 30-1000 mTorr). The ESC temperature may be between about 0-100° C. (e.g., 0-50° C. or 10-40° C.). The power used to generate the plasma may be between about 10-3000 W per station (e.g., 100-1000 W, 200-1000 W, 200-800 W, or 200-500 W). The RF frequency used to generate the plasma can be between about 0.3-600 MHz (e.g., 13.56 MHz, 60 MHz, 27 MHz, 2 MHz, 400 kHz, or combinations thereof). The RF bias power may be between about 0-1000 W using a pulsed plasma or a continuous wave (CW) plasma. The processing chamber can be an ICP chamber or a CCP chamber. In some embodiments of the ICP chamber, the frequency of both the top ICP generator and the bias generator is 13.5 MHz. Depending on the underlayer, in some embodiments, the pressure can be about 10-400 mTorr, and the TCP power can be about 200-500 W.

Table 1 provides examples of processing regimes for non-limiting underlayers. For Embodiment 1, the hydrocarbon precursor is methane ($CH_4$) with another gas being He. For Embodiment 2, the hydrocarbon precursor is $CH_4$, and process gases include CO, $H_2$, and He.

TABLE 1

| Process regimes | | |
|---|---|---|
| Parameter | Embodiment 1 | Embodiment 2 |
| $CH_4$ flow rate | 30 sccm | 15 sccm |
| CO flow rate | 0 | 50 sccm |
| $H_2$ flow rate | 0 | 50 sccm |
| He flow rate | 660 sccm | 185 sccm |
| Pressure | 150 mTorr | 30 mTorr |
| ESC Temperature | 20° C. | 20° C. |
| TCP Power | 400 W | 400 W |
| Bias mode | — | — |
| Bias Power | 0 W | 0 W |

FIG. 3 provides performance characteristics of Embodiment 1 and Embodiment 2, as compared with an AHM and a SOC layer. In one embodiment, use of the underlayer of Embodiment 1 improves DtS (e.g., by more than 5%, 10%, 15%, 20%, 25%, 30%, or greater). Table 2 provides etch resistance of the underlayers, as compared to ARM, in which the underlayers displayed a higher relative etch rate, as compared to AHM. Film composition was also determined by x-ray photoelectron spectroscopy (XPS). The underlayers (Embodiments 1 and 2) contained higher H and O content, as compared to AHM.

TABLE 2

| Etch resistance of underlayers | | | |
|---|---|---|---|
| | Film composition by XPS | | Relative etch |
| Underlayer | C % | O % | rate to AHM |
| AHM (HST) | 100 | 0 | 1 |
| Embodiment 1 | 99.0 | 1.0 | 2.8 |
| Embodiment 2 | 96.4 | 3.6 | 3.3 |

Implementation 2: Pulsing Bias Process for Use in Deposition of the Underlayer

Further processes were developed to improve etch resistance of the underlayer. In particular, bias power was used to modify the density of the underlayer. For instance, deposition of the underlayer can include a bias (regardless of frequency) that is pulsed (e.g., in the range of about 1 Hz to about 10 kHz) with a DC of between about 1% and 99%. Such bias can be provided at any useful power, such as from about 10-500 W.

It will be understood that plasma pulsing may involve repetitions of periods, each of which may last a duration T. The duration T includes the duration for pulse ON time (the duration for which the plasma is in an ON state) and the duration for plasma OFF time (the duration from which the plasma is in an OFF state) during a given period. The pulse frequency will be understood as 1/T. For example, for a plasma pulsing period T=100 μs, frequency is 1/T=1/100 μs, or 10 kHz. The duty cycle or duty ratio is the fraction or percentage in a period T during which the plasma is in the ON state such that duty cycle or duty ratio is pulse ON time divided by T. For example, for a plasma pulsing period T=100 its, if a pulse ON time is 70 μs (such that the duration for which the plasma is in an ON state in a period is 70 μs) and a pulse OFF time is 30 μs (such that the duration for which the plasma is in an OFF state in a period is 30 μs), the duty cycle is 70%.

Yet other deposition conditions can include control of precursor flow rate(s), gas flow rate(s), process pressure, temperature (e.g., ESC temperature), plasma power, bias power, pulse frequency, and TCCT parameter within the processing chamber. The flow rate of precursor(s) may be between about 1-100 sccm. The flow rate of process gas(es) may be between about 1-160 sccm. The chamber pressure may be between about 5-1000 mTorr (e.g., 5-800 mTorr, 10-500 inTorr, 10-400 mTorr, 30-500 mTorr, 10-1000 mTorr, or 30-1000 mTorr). The ESC temperature may be between about 0-100° C. (e.g., 0-50° C. or 10-40° C.). The power used to generate the plasma may be between about 10-3000 W (e.g., 100-1000 W, 200-1000 W, 200-800 W, or 200-500 W). The RF frequency used to generate the plasma may be between about 0.3-600 MHz (e.g., 13.56 MHz, 60 MHz, 27 MHz, 2 MHz, 400 kHz, or combinations thereof). The RF bias power may be between about 10-1000 W using a pulsed plasma with a DC between 1-100%, in which 100% indicated CW (e.g., 1-99%). The RF bias power can be pulsed below 5000 Hz, such as a frequency from about 10-2000 Hz. The TCCT parameter can be from 0.1 to 1.5. In some non-limiting process, plasma exposure can include a high frequency (HT) RF component (e.g., generally between about 2-60 MHz) and a low frequency (IT) RF component (e.g., generally from about 100 kHz-2 MHz). The processing chamber can be an ICP chamber or a CCP chamber.

Table 3 provides examples of processing regimes for non-limiting underlayers formed with a pulsing bias process (Embodiment 3). Various underlayer films were formed using Embodiment 3, in which bias power was either 70 W or 140 W and in which DC was varied from 10-50%. Density for such non-limiting films are provided in FIG. 4. As compared to a film formed with 0 W bias, pulsing bias processes provided films having an increased density (e.g., density greater than about 1.09 g/cm$^3$). In this way, density of an underlayer can be fine-tuned by adding bias power. In some instances, denser films may provide lower etch rates, thereby providing improved etch resistance.

TABLE 3

Pulsing process regimes

| Parameter | Embodiment 3 |
|---|---|
| CH$_4$ flow rate | 30 sccm |
| He flow rate | 660 sccm |
| Pressure | 150 mTorr |
| ESC Temperature | 20° C. |
| TCP Power | 400 W |
| Bias Power | 70 W, 140 W |
| Bias Pulsing Frequency | 100 Hz |
| TCCT | 1.4 |
| DC % | 10%, 20%, 30%, 40%, 50% |

Figures 4, 5:
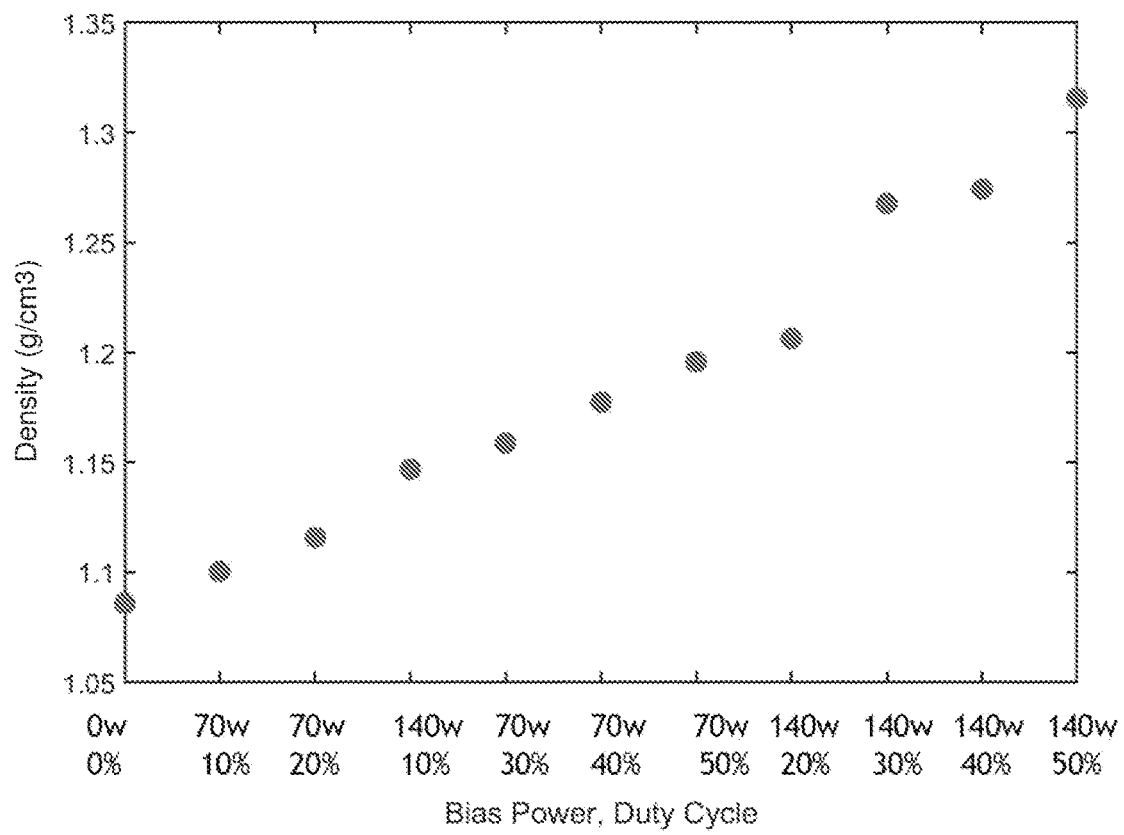
FIG. 4 shows the effect of pulsed bias on density for a non-limiting embodiment of an underlayer (Embodiments 1 and 3). Provided are films produced with a bias power of 0 W, 70 W, or 140 W and a duty cycle of 0% (no bias power was applied), 10%, 20%, 30%, 40%, or 50%, as indicated in the graph.
FIG. 5 shows the effect of pulsed bias on undercuts for a non-limiting embodiment of an underlayer (Embodiment 3). Provided are parameters such as dose to size (DtS), pulsing bias (showing RF bias power as 140 W and a duty cycle (DC) of 10% or 50%). CDSEM, LnCD, ratio of unbiased LWR to space width roughness (SpWR) (ratio indicated as Unbiased LWR/SpWR), various frequency components of SpWR (including low frequency (LF), medium frequency (MF), and high frequency (HF) components, which are indicated as $LF/MF/HF_{spwr}$), and undercut characteristics.

The pulsing process may improve other characteristics of the film, in addition to increasing density, decreasing etch rate, and/or increasing etch resistance. As seen in FIG. 5, the pulsing process can reduce undercut without sacrificing DtS. Processing conditions included a CH$_4$ flow rate of 30 sccm, He flow rate of 660 sccm, pressure of 150 mTorr, ESC temperature of 20° C., TCP power of 400 W, bias power of 140 W, bias frequency of 100 Hz, DC of 10% (FIG. 5, film on left) or 50% (FIG. 5, film on right), and TCCT of 1.4.

Implementation 3: Deposition of Doped Underlayers

The underlayer can include one or more dopants (e.g., non-carbon dopants when a hydrocarbon precursor is employed). The dopant can be provided by using a hydrocarbon precursor (e.g., to provide carbon atoms) and a separate dopant precursor (e.g., to provide the doping, non-carbon atoms). In another embodiment, the dopant is provided by employing a single dopant precursor including carbon atom(s) and heteroatom(s). Non-limiting non-carbon heteroatoms include oxygen (O), silicon (Si), nitrogen (N), tungsten (W), boron (B), iodine (I), chlorine (Cl), or a combination of any of these. Other dopants and heteroatom-containing dopant precursors are described herein.

Use of dopants can, in some instances, improve etch resistance. Any of the process regimes herein can be modified to incorporate dopants into the underlayer. For instance, deposition can include use of a dopant precursor (e.g., any described herein), and process regimes described herein for a precursor generally (e.g., flow rate, pressure, temperature, plasma power, bias power, pulse frequency, duty cycle, TCCT, etc.) can be used for the dopant precursor.

For instance, the flow rate of precursor(s) (e.g., hydrocarbon precursor and/or dopant precursor) may be between about 1-100 scan. The flow rate of process gas(es) may be between about 1-1600 sccm. The chamber pressure may be between about 5-1000 mTorr (e.g., 5-800 mTorr, 10-500 mTorr, 10-400 mTorr, 30-500 mTorr, 10-1000 mTorr, or 30-1000 mTorr). The ESC temperature may be between about 0-100° C. (e.g., 0-50° C. or 10-40° C.). The power used to generate the plasma may be between about 10-3000 W (e.g., 100-1000 W, 200-1000 W, 200-800 W, or 200-500 W), The RF frequency used to generate the plasma may be between about 0.3-600 MHz (e.g., 13.56 MHz, 60 MHz, 27 MHz, 2 MHz, 400 kHz, or combinations thereof). The RF bias power may be between about 0-1000 W using a pulsed plasma with a DC between about 1-99% or a CW plasma (DC of 100%). The RE bias power can be pulsed below 5000 Hz, such as a frequency from about 10-2000 Hz. The TCCT parameter can be from 0.1 to 1.5. The processing chamber can be an ICP chamber or a CCP chamber.

In one instance, the dopant is or includes nitrogen (N) to provide N-doped underlayers. Nan limiting N-containing precursors can include any described herein, such as nitrogen (N$_2$), ammonia (NH$_3$), hydrazine (N$_2$H$_4$), airlines, and aminosilanes. In one instance, an N-doped underlayer is formed by co-flowing of a hydrocarbon precursor and an N-containing precursor.

Table 4 provides examples of processing regimes for non-limiting N-doped underlayers. For Embodiment 4, the hydrocarbon precursor is CH$_4$, and the N-containing precursor is N$_2$. For Embodiment 5, the hydrocarbon precursor is CH$_4$, and the N-containing precursor is NH$_3$.

TABLE 4

Process regimes of nitrogen-doped underlayers

| Parameter | Embodiment 4 (with N$_2$) | Embodiment 5 (with NH$_3$) |
|---|---|---|
| CH$_4$ flow rate | 30 sccm | 30 sccm |
| N$_2$ flow rate | 15 sccm | 0 |
| NH$_3$ flow rate | 0 | 15 sccm |
| He flow rate | 645 sccm | 645 sccm |
| Pressure | 150 mTorr | 150 mTorr |
| ESC Temperature | 20° C. | 20° C. |
| TCP Power | 400 W | 400 W |
| Bias Power | 0 W | 0 W |
| TCCT | 1.3 | 1.3 |

In particular embodiments, the N-doped underlayer can be characterized by the presence of N—H bonds (e.g., with a peak at about 3500 to 3100 cm$^{-1}$ and/or about 1635 cm$^{-1}$ in a Fourier transform infrared spectroscopy (FTIR) spectrum) and/or C≡N bonds (e.g., with peak(s) at about 2260 to 2222 cm$^{-1}$, about 2244 cm$^{-1}$, and/or about 2183 cm$^{-1}$ in an FTIR spectrum).

Figure 6:
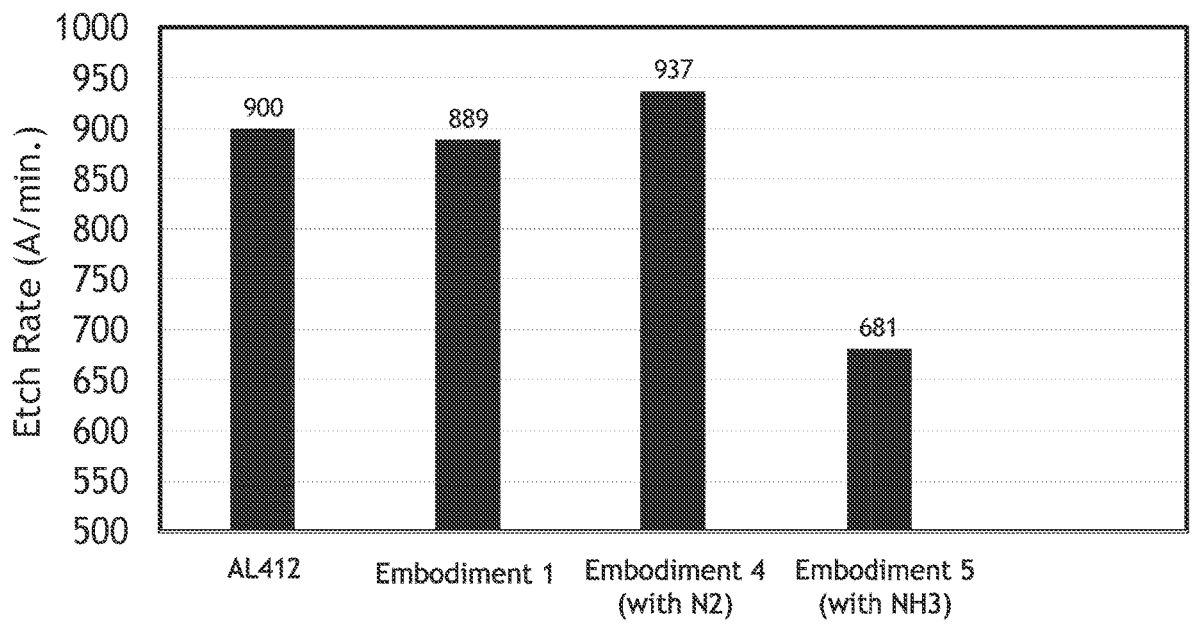
FIG. 6 shows etch rates for non-limiting embodiments of an N-doped, spin-on carbon film used as an underlayer (AL412) and underlayers (Embodiments 1, 4, and 5).

The etch rates of doped underlayers can be improved, in some instances. FIG. 6 provides the etch rate of an undoped underlayer (Embodiment 1), a first N-doped underlayer using N$_2$ as the dopant precursor (Embodiment 4), a second N-doped underlayer using NH$_3$ as the dopant precursor (Embodiment 5), and an AL412 underlayer. Non-limiting etch conditions included use of an ICP chamber having a pressure=5 mTorr; TCP=350 W; TCCT=2; bias power=0 V; flow rate of CH$_4$=10 sccm; flow rate of O$_2$=60 sccm; flow rate of Ar=200 sccm; and ESC temperature=30° C. As can be seen, co-flow of the hydrocarbon precursor with the NH$_3$ dopant precursor improved etch resistance of the underlayer, as compared to the undoped underlayer.

In another instance, the dopant is or includes tungsten (W) to provide W-doped underlayers. Non-limiting W-containing precursors can include any described herein, such as tungsten halides (e.g., WF$_6$, WCl$_6$, or WCl$_5$), tungsten carbonyl (e.g., W(CO)$_6$), or others. In one instance, a W-doped underlayer is formed by co-flowing of a hydrocarbon precursor and a W-containing precursor.

In particular embodiments, the W-doped underlayer can be characterized by the presence of W—OH . . . H$_2$O bonds (e.g., with a peak at about 3500 to 3400 cm$^{-1}$ in a FTIR spectrum), W=O bonds (e.g., with a peak at about 981 cm$^{-1}$ in a FTIR spectrum), and/or W—O—W bonds (e.g., with peak(s) at about 837 cm$^{-1}$, 800 cm$^{-1}$, and/or 702 cm$^{-1}$ in an FTIR spectrum).

Table 5 provides examples of processing regimes for non-limiting W-doped underlayers. For each embodiment, the hydrocarbon precursor is $CH_4$. For Embodiment 6, the W-containing precursor is $WF_6$ at a lower flow rate of 1 sccm. For Embodiment 7, the W-containing precursor is $WF_6$ at a higher flow rate of 2 sccm. For Embodiment 8, the W-containing precursor is $WF_6$ at a lower flow rate of 1 sccm but at a higher pressure of 50 mTorr.

TABLE 5

Process regimes of tungsten-doped underlayers

| Parameter | Embodiment 1 | Embodiment 6 | Embodiment 7 | Embodiment 8 |
|---|---|---|---|---|
| $CH_4$ flow rate | 30 sccm | 30 sccm | 30 sccm | 30 sccm |
| $WF_6$ flow rate | 0 | 1 sccm | 2 sccm | 1 sccm |
| He flow rate | 658-659 sccm | 658-659 sccm | 658-659 sccm | 659 sccm |
| Pressure | 30 mTorr | 30 mTorr | 30 mTorr | 50 mTorr |
| ESC Temperature | 20° C. | 20° C. | 20° C. | 20° C. |
| TCP Power | 400 W | 400 W | 400 W | 400 W |
| Bias Power | 0 W | 0 W | 0 W | 0 W |
| TCCT | 0.2-1.2 | 0.2 to 1.2 | 0.2 to 1.2 | 0.2 to 1.2 |

Density of doped underlayers can be increased. Table 6 provides the refractive index (RI at 633 nm), deposition rate (Dep. Rate), and density of the underlayers. As can be further seen for Embodiment 7, co-flow of the hydrocarbon precursor with the W-containing dopant precursor increased density and RI, as compared to the baseline that was deposited without the dopant precursor.

TABLE 6

Characteristic of tungsten-doped underlayers

| | Embodiment 1 | Embodiment 6 | Embodiment 7 | Embodiment 8 |
|---|---|---|---|---|
| RI @ 633 nm | 1.575 | 1.546 | 1.711 | 1.530 |
| Dep. rate (Å/min.) | 296.0 | 572.8 | 679.0 | 588.6 |
| Density (g/cm$^3$) | 1.08 | 2.07 | 2.83 | 1.93 |

In yet another instance, the dopant is or includes boron (B) to provide B-doped underlayers. B-containing precursors can include any described herein, such as boron halides (e.g., $BCl_3$), boranes (e.g., $B_2H_6$), borates (e.g., $B(OH)_3$), and organoboron compounds (e.g., $B(CH_3)_3$). In one instance, a B-doped underlayer is formed by co-flowing of a hydrocarbon precursor and a B-containing precursor.

In particular embodiments, the B-doped underlayer can be characterized by the presence of B . . . OH bonds (e.g., with a peak at about 3200 cm$^{-1}$ in a FTIR spectrum), B—O bonds (e.g., with a peak at about 1340 cm$^{-1}$ in a FTIR spectrum), and/or B—O—H bonds (e.g., with a peak at about 1194 cm$^{-1}$ in an FTIR spectrum).

Table 7 provides examples of processing regimes for non-limiting B-doped underlayers. For Embodiment 9, the hydrocarbon precursor is $CH_4$, and the B-containing precursor is $BCl_3$. For Embodiment 10, the deposition conditions are the same as Embodiment 9, but the film is further treated with $H_2$. In Table 7, $H_2$ treatment conditions included pressure=5 mTorr; TCP=300 W; bias power=100 W; flow rate of $H_2$=200 sccm; processing time=1 second.

TABLE 7

Process regimes of boron-doped underlayers

| Parameter | Embodiment 1 | Embodiment 9 | Embodiment 10 |
|---|---|---|---|
| $CH_4$ flow rate | 30 sccm | 30 sccm | 30 sccm |
| $BCl_3$ flow rate | 0 | 5 sccm | 5 sccm |

TABLE 7-continued

Process regimes of boron-doped underlayers

| Parameter | Embodiment 1 | Embodiment 9 | Embodiment 10 |
|---|---|---|---|
| He flow rate | 655 sccm | 655 sccm | 655 sccm |
| $H_2$ treatment | No | No | Yes |
| Pressure | 150 mTorr | 150 mTorr | 150 mTorr |

TABLE 7-continued

Process regimes of boron-doped underlayers

| Parameter | Embodiment 1 | Embodiment 9 | Embodiment 10 |
|---|---|---|---|
| ESC Temperature | 20-24° C. | 20-24° C. | 20-24° C. |
| TCP Power | 400 W | 400 W | 400 W |
| Bias Power | 0 W | 0 W | 0 W |
| TCCT | 0.2-1.2 | 1.3 | 1.3 |

In particular embodiments, both the deposition rate and the density of doped underlayers can be increased. Table 8 provides RI at 633 nm, deposition rate (Dep. Rate), and density of the underlayers. As can be seen for Embodiment 9, co-flow of the hydrocarbon precursor with the B-containing dopant precursor increased deposition rate and increased density, as compared to the baseline that was deposited without the dopant precursor.

TABLE 8

Characteristic of boron-doped underlayers

| | Embodiment 1 | Embodiment 9 | Embodiment 10 |
|---|---|---|---|
| RI @ 633 nm | 1.57 | 1.56 | 1.52 |
| Dep. Rate (Å/min.) | 287.0 | 403.0 | 543.0 |
| Density (g/cm$^3$) | 1.06 | 1.24 | TBD |

As described herein, dopant precursors can be employed during deposition to provide a doped underlayer. In particular embodiments, the doped underlayer can have enhanced characteristics, such as improved etch resistance, etch rate, refractive index, deposition rate, and/or density.

Implementation 4: Deposition of Various Hydrocarbon Precursors

The underlayer can be deposited with any useful precursor. For instance, the precursor can include a hydrocarbon precursor having only carbon and hydrogen atoms. In another instance, the precursor can be a heteroatom-containing, hydrocarbon precursor having carbon atoms, hydrogen atoms, and non-carbon heteroatoms. In yet another instance, the precursor can be a dopant precursor (e.g., as described herein).

Of the hydrocarbon precursors, various compounds can be employed. For instance, the hydrocarbon precursor can include aliphatic and aromatic compounds (e.g., alkanes, alkenes, alkenes, benzene, etc.), including substituted forms thereof. By using different hydrocarbon precursors, the type and amount of certain chemical bonds within the underlayer can be modified. For instance, using unsaturated hydrocarbon precursors can provide an underlayer having increased unsaturated bond content (e.g., increased C=C and/or C≡C bond content), increased sp$^2$ carbon content, increased sp carbon content, decreased saturated bond content (e.g., decreased C—C bond content), decreased sp$^3$ carbon content, and/or decreased C—H bond content (e.g., as compared to a film formed with an increased amount saturated hydrocarbon precursors or a decreased amount of unsaturated hydrocarbon precursors). The selection of the hydrocarbon precursor can depend on various factors. In one non-limiting instance, a hydrocarbon precursor includes a saturated precursor (e.g., having increased C—H bond content, as compared to C—C, C=C, or C≡C content), which can provide sufficient H atoms. Without wishing to be limited by mechanism, selection of such a precursor can provide releasable H atoms that interact with atoms in the imaging layer, thus, resulting in improved DtS, as compared to use of an unsaturated precursor. Yet, in other non-limiting instances, a hydrocarbon precursor includes an unsaturated precursor (e.g., having increased C—C, C=C, or C≡C content, as compared to C—H bond content). Without wishing to be limited by mechanism, selection of such a precursor can provide enhanced etch resistance, as compared to use of a saturated precursor.

In particular embodiments, the underlayer can be characterized by the presence of C=CH bonds (e.g., with a peak at about 3310 cm$^{-1}$ in a FTIR spectrum) and/or C=C bonds (e.g., with peak(s) at about 1650 to 1600 cm$^{-1}$ or 1000 to 660 cm$^{-1}$ in a FIR spectrum).

Table 9 provides examples of processing regimes for non-limiting hydrocarbon precursors. For Embodiment 1, the hydrocarbon precursor is CH$_4$. For Embodiment 11, the hydrocarbon precursor is acetylene (C$_2$H$_2$). For Embodiment 12, the hydrocarbon precursor is propyne (C$_3$H$_4$). Different plasma types can be employed (e.g., ICP or CCP). In one instance, ICP is employed to allow for separate control of ion energy and ion density. Process conditions can be optimized to achieve a similar film whether using ICP or CCP. For instance, CCP generally employs a higher self-bias voltage than ICP, thus resulting in a plasma characterized by a higher ion energy. This higher energy can be reduced, e.g., by using a higher process pressure, thus achieving comparable processing environment to provide similar film properties as obtained using ICP. Accordingly, processes herein can include use of ICP or CCP with modifications in one or more processing conditions (e.g., pressure, temperature, flow rate of precursor(s) or inert gases, process time, etc.) to achieve targeted film compositions and film properties.

TABLE 9

Process regimes for hydrocarbon precursors

| Parameter | Embodiment 1 | Embodiment 11 | Embodiment 12 |
|---|---|---|---|
| CH$_4$ flow rate | 30 sccm | 0 | 0 |
| C$_2$H$_2$ flow rate | 0 | 50 sccm | 0 |
| C$_3$H$_4$ flow rate | 0 | 0 | 100 sccm |
| He flow rate | 660 sccm | 1200 sccm | 1200 sccm |
| Pressure | 150 mTorr | 500 mTorr | 500 mTorr |
| ESC Temperature | 20° C. | 20° C. | 20° C. |
| TCP Power | 400 W | — | — |
| Bias Power | 0 W | 0 W @ 400 kHz; 200 W @ 60 MHz | 0 W @ 400 kHz; 200 W @ 60 MHz |
| Plasma type | ICP | CCP | CCP |
| Frequency | — | 1000 Hz | 1000 Hz |
| DC % | — | 20% | 20% |

Figure 7:
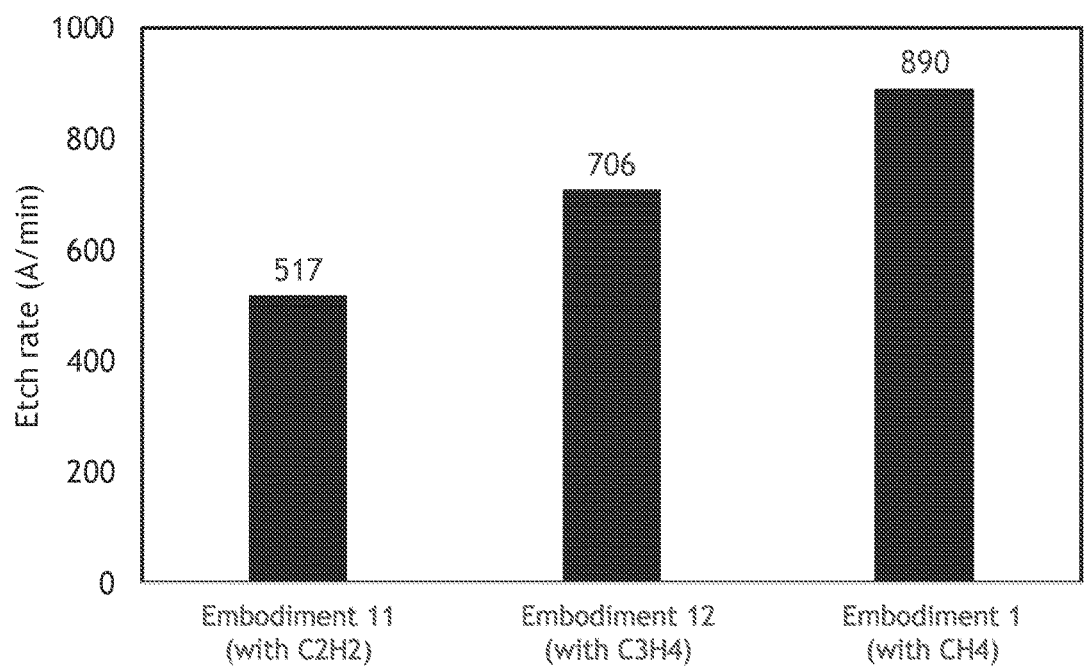
FIG. 7 shows etch rates for non-limiting embodiments of underlayers (Embodiments 11, 12, and 1).

In particular embodiments, use of unsaturated hydrocarbon precursors improves etch resistance. FIG. 7 provides the etch rate of an underlayer formed with a C$_2$H$_2$ precursor (or HC≡CH, Embodiment 11), a CAL precursor (HC≡CCH$_3$, Embodiment 12), and a precursor (Embodiment 1). Non-limiting etch conditions included use of an ICP chamber having a pressure=5 mTorr; TCP=350 W; TCCT=2; bias power=0 V; flow rate of CH$_{4=10}$ sccm; flow rate of O$_2$=60 sccm; flow rate of Ar=200 sccm; and ESC temperature=30° C. As can be seen, use of unsaturated hydrocarbon precursor (e.g., having triple bonds) improved etch resistance of the underlayer, as compared to the saturated hydrocarbon precursor (e.g., having only single bonds).

Implementation 5: Use of High EUV Absorbing Atoms

The underlayer can also include one or more atoms having a high patterning radiation absorption cross-section (e.g., an EUV absorption cross-section that is equal to or greater than $1 \times 10$ cm$^2$/mol). Such atoms include, e.g., iodine (I). Iodine can be provided in any useful source. For instance, the precursor employed during deposition can be a dopant precursor that is a hydrocarbon having one or more iodine atoms. Non-limiting precursors an aliphatic or an aromatic compound (e.g., an alkane, alkene, or alkyne, including cyclic forms thereof, as well as benzene) having one or more I atoms. Yet other examples of precursors include iodoacetylene ($C_2HI$), diiodoacetylene ($C_2I_2$), vinyl iodide ($C_2H_3I$), iodomethane ($CH_3I$), diiodomethane ($CH_2I_2$), 1,1-diiodoethene ($C_2H_2I_2$), (E)-1,2-diiodoethylene (trans-$C_2H_2I_2$), (Z)-1,2-diiodoethylene (cis-$C_2H_2I_2$), allyl iodide ($C_3H_5I$), 1-iodo-1-propyne ($C_3H_3I$), iodocyclopropane ($C_3H_5I$), and 1,1-diiodocyclopropane ($C_3H_4I_2$).

Any of the deposition conditions herein can be combined to provide a beneficial underlayer. For instance, a pulsing bias process can be used with any precursor (e.g., a hydrocarbon precursor, a dopant precursor; or a combination thereof) described herein. In another instance, a dopant precursor can be combined with any hydrocarbon precursor described herein. Furthermore, the process can include the use of one, two, three, or more different precursors (e.g., two or more hydrocarbon precursors; and/or two or more dopant precursors). In yet another instance, a dopant precursor can be generated by modifying any hydrocarbon precursor herein (e.g., saturated or unsaturated hydrocarbon precursors) with one or more non-carbon heteroatoms.

Combinations of precursors can be selected to provide desired film properties. For instance, a particular hydrocarbon precursor (e.g., an unsaturated hydrocarbon precursor) can be selected to improve etch resistance. Then, certain heteroatoms can be selected to provide a film with increased density or refractive index (e.g., heteroatoms such as O, Si, N, W, B, or I). In one instance, the underlayer can include I, C, H, and O atoms; I, C, H, and Si atoms; I, H, N, O, and Si atoms; or I, C, H, N, O, and Si atoms.

Finally, yet other non-carbon heteroatoms can be selected to provide a film with enhanced EUV absorption (e.g., heteroatoms, such as I or another heteroatom having an EUV absorption cross-section that is equal to or greater than $1 \times 10^7$ cm$^2$/mol). The thickness of the underlayer can be controlled (e.g., more than about 5 nm).

Precursors (e.g., for Underlayers)

The underlayers herein can employ any useful precursor or combination of precursors. Such precursors can include hydrocarbon precursors including only carbon (C) and hydrogen (H) atoms, in which the precursor can be saturated (having only single bonds) or unsaturated (having one or more double or triple bonds), as well as linear or cyclic. Yet other precursors can include one or more non-carbon heteroatoms, and such precursors are referred herein as dopant precursors. Such dopant precursors can optionally include carbon atoms in combination with non-carbon atoms. In some embodiments, any hydrocarbon precursor herein can be modified with one or more heteroatoms to provide a dopant precursor. The generic term "precursor" can refer to a hydrocarbon precursor and/or a dopant precursor. Such precursors can, in some instances, be a gas, thereby allowing for vapor deposition within a process chamber.

Hydrocarbon precursors generally include carbon-containing precursors. In some instances, the hydrocarbon precursor includes only C and H atoms. The hydrocarbon precursor may be, for example, one defined by the formula $C_xH_y$, wherein x is an integer from 1 to 10 and y is an integer from 2 to 24. Examples of such precursors include methane ($CH_4$), acetylene ($C_2H_2$), ethane ($C_2H_6$), ethylene ($C_2H_4$), propane ($C_3H_8$), propylene ($C_3H_6$), propyne ($C_3H_4$), allene ($C_3H_4$), cyclopropene ($C_3H_4$), butane ($C_4H_{10}$), butylene ($C_4H_8$), butadiene ($C_4H_6$), cyclohexane ($C_6H_{12}$), benzene ($C_6H_6$), and toluene ($C_7H_8$).

The hydrocarbon precursor can be an aliphatic compound (e.g., a $C_{1-10}$ alkane, $C_{2-10}$ alkene, $C_{2-10}$ alkyne, including linear or cyclic forms thereof) or an aromatic compound (e.g., benzene, as well as polycyclic forms thereof). The hydrocarbon precursor can include saturated bonds (single bonds, e.g., C—C bonds or C—H bonds) and/or unsaturated bonds (double or triple bonds, e.g., C=C, or C≡C, or C≡N bonds).

Useful precursors for underlayers can also include one or more heteroatoms. Such heteroatoms can be any useful non-carbon atoms, such as oxygen (O), silicon (Si), nitrogen (N), tungsten (W), boron (B), iodine (I), chlorine (Cl), and combinations thereof. Thus, non-limiting heteroatom-containing precursors (also referred to herein as dopant precursors) can include an O-containing precursor, an Si-containing precursor, an N-containing precursor, a W-containing precursor, a B-containing precursor, an I-containing precursor, or a Cl-containing precursor. Such dopant precursors can be inorganic (lacking carbon atoms) or organic (including carbon atoms), as described herein.

O-containing precursors can include an oxocarbon precursor comprising O and C atoms. In particular embodiments, the oxocarbon precursor reacts with hydrogen ($H_2$) or a hydrocarbon and optionally further co-reacts with an Si source or an Si-containing precursor. Yet other O-containing precursors can include carbon monoxide (CO), carbon dioxide ($CO_2$), water ($H_2O$), oxygen ($O_2$), ozone ($O_3$), hydrogen peroxide ($H_2O_2$), alcohol (e.g., t-amyl alcohol, ethanol, propanol, etc.), polyol (e.g., a diol, such as ethylene glycol), ketone, aldehyde, ether, ester, carboxylic acid, alkoxysilane, oxolane, or furan.

Si-containing precursors can include silanes, halosilanes, aminosilanes, alkoxysilanes, organosilanes, etc. In particular embodiments, the Si-containing precursor co-reacts with an oxidizer (e.g., any described herein, such as an O-containing precursor or an oxocarbon precursor, including CO and $CO_2$). Non-limiting Si-containing precursors include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, allylsilane, sec-butylsilane, thexylsilane, isoamylsilane, t-butyldisilane, di-t-butyldisilane, and the like.

A halosilane includes at least one halogen group and may or may not include H and/or C atoms. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, hexyldimethylchlorosilane, and the like. Specific iodosilanes are tetraiodosilane, triiodosilane, diiodosilane, monoiodosilane, trimethylsilyl iodide, and the like.

An aminosilane includes at least one N atom bonded to a Si atom, but may also contain H, O, halogen, and/or C atoms. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, t-butylsilanamine, bi(t-butylamino)silane ($SiH_2(NHC(CH_3)_3)_2$ (BTBAS), t-butyl silylcarbamate, SiH(CH₃)—(N(CH₃)₂)₂, SiHCl—(N(CH₃)₂)₂, (Si(CH₃)₂NH)₃ and the like. A further example of an aminosilane is trisilylamine (N(SiH₃)).

An alkoxysilane includes at least one O atom bonded to a Si atom, but may also contain H, N, halogen, and/or C atoms. Examples of alkoxysilanes are mono-, di-, tri- and tetra-alkoxysilanes (H₃Si(OR), H₂Si(OR)₂, HSi(OR)₃ and Si(OR)₄, respectively, in which each R can be, independently, optionally substituted alkyl or aryl), as well as substituted mono-, di-, tri- and tetra-alkoxysilanes, for example, trimethoxymethylsilane (CH₃Si(OCH₃)₃), (3-aminopropyl) trimethoxysilane (NH₂(CH₂)₃Si(OCH₃)₃), (3-aminopropyl)triethoxysilane (NH₂(CH₂)₃Si(OCH₂CH₃)₃), triethoxyvinylsilane (CH₂=CHSi(OCH₂CH₃)₃), triethoxyethylsilane (CH₃CH₂Si(OCH₂CH₃)₃), trimethoxyphenylsilane (PhSi(OCH₃)₃), isobutyltriethoxysilane (i-BuSi(OCH₂CH₃)₃), diacetoxydimethylsilane ((CH₃)₂Si(OCOCH₃)₂), and the like. Yet other examples include tetraethoxysilane (Si(OCH₂CH₃)₄), triethoxysilane (HSi(OCH₂CH₃)₃), tetramethoxysilane (Si(OCH₃)₄), and trimethoxysilane (HSi(OCH₃)₃).

N-containing precursors include any that has at least one N atom, for example, nitrogen gas (N₂), ammonia (NH₃), hydrazine (N₂H₄), amines (amines bearing carbon) such as methylamine, dimethylamine, ethylmethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzyiamines. Yet other N-containing precursors can include nitrile (e.g., acetonitrile), amides, N-containing heterocyclic compound, or amino alcohols (e.g., ethanolamine). Amines may be primary, secondary, tertiary, or quaternary (for example, tetraalkylammonium compounds). Ari N-containing precursor can contain heteroatoms other than N, for example, hydroxylamine, t-butyloxycarbonyl amine, and N-t-butyl hydroxylamine are N-containing precursors.

W-containing precursors include tungsten-containing halide precursors, which may include tungsten fluorides, such as tungsten(VI) fluoride (WF₆); and tungsten chlorides, such as tungsten(VI) chloride (WCl₆), tungsten(V) chloride (WCl₅), and tungsten(VI) oxychloride (WOCl4). In some embodiments, metal-organic tungsten-containing precursors may be used, such as tungsten hexacarbonyl (W(CO)₆), mesitylene tungsten tricarbonyl ([C₆H₃(CH₃)₃]W(CO)₃), bis(t-butylimido)bis(dimethylamino)tungsten(VI) ([CH₃]₃CN]₂W[N(CH₃)₂]₂), bis(cyclopentadienyl)tungsten(IV) dihydride (H₂WCp₂), or others.

B-containing precursors include boron halides (e.g., BCl₃), boranes (e.g., B₂H₆), borates (e.g., B(OH)₃), and organoboron compounds (e.g., B(CH₃)₃). B-containing precursors include diborane (B₂H₆), trimethylborate (B[OCH₃]₃), triethyllborate (B[OCH₂CH₃]₃), triisopropyl borate (B[OCH(CH₃)₂]₃), trimethylborane B(CH₃)₃), triethylborane (B(C₂H₅)₃), triphenylborane (BPh₃), tetrakis(dimethylamino)diboron (B₂(N(CH₃)₂)₄), boron trifluoride (BF₃), boron trichloride (BCl₃), boron tribromide (BBr₃), and boron iodide (BI₃).

I-containing precursors include iodinated hydrocarbon compounds, such as iodoacetylene (C₂HI), diiodoacetylene (C₂I₂), vinyl iodide (C₂H₃I), iodomethane (CH₃I), diiodomethane (CH₂I₂), 1,1-diiodoethene (C₂H₂I₂), (E)-1,2-diiodoethylene (trans-C₂H₂I₂), (Z)-1,2-diiodoethylene (cis-C₂H₂I₂), allyl iodide (C₃H₅I), 1-iodo-1-propyne (C₃H₃I), iodocyclopropane (C₃H₅I), and 1,1-diiodocyclopropane (C₃H₄I₂).

Cl-containing precursors include chlorinated hydrocarbon compounds, such as chloroacetylene (C₂HCl), vinyl chloride (C₂H₃Cl), chloromethane (CH₃Cl), dichloromethane (CH₂Cl₂), 1,1-dichloroethene (C₂H₂Cl₂), (E)-1,2-dichloroethylene (trans-C₂H₂Cl₂), (Z)-1,2-dichloroethylene (cis-C₂H₂Cl₂), allyl chloride (C₃H₅Cl), 1-chloro-1-propyne (C₃H₃Cl), chlorocyclopropane (C₃H₅Cl), and 1,1-dichlorocyclopropane (C₃H₄Cl₂).

Other heteroatoms may be included, such as phosphorous (P). P-containing precursors can include phosphates, phosphines, phosphorous halides, organophosphorus compounds, and others. Non-limiting P-containing precursors include triethyl phosphate (PO[OC₂H₅]₃), trimethyl phosphate (PO[OCH₃]₃), trimethyl phosphite (P(OCH₃)₃), tris-dimethylaminophosphorus (P[N(CH₃)₂]₃), phosphorous trichloride (PCl₃), trismethylsilyl phosphine (P[Si(CH₃)₃]₃), and phosphorus oxychloride (POCl₃).

Properties of Underlayers

Any of the processes and precursors herein can be employed to provide useful underlayers. The composition of the underlayer can be tuned to include particular atoms. In one embodiment, the underlayer include about 0-30 atomic % O (e.g., 1-30%, 2-30%, or 4-30%), about 20-50 atomic % H (e.g., 20-45%, 30-50%, or 30-45%), and/or 30-70 atomic % C (e.g., 30-60%, 30-65%, or 30-68%), In other embodiments, the underlayer includes the presence of unsaturated bonds (e.g., C=C, C≡C, and/or C≡N bonds). In yet other embodiments, the underlayer has a density of about 0.7 to 2.9 g/cm³.

The underlayer can be characterized by increased etch selectivity and/or decreased undercut, as compared to a control film. In other embodiments, the underlayer can be characterized decreased line edge and line width roughness and/or decreased dose to size, as compared to a control film. Non-limiting control films include those formed with a saturated hydrocarbon precursors, formed within pulsed bias, and/or formed without a dopant. In one instance, the control film is an AHM formed with methane. In another instance, the control film is an AHM formed with acetylene.

Patterning Structures

The patterning structures (or films) herein can include an imaging layer on a surface of a hardmask or a substrate, as well as an underlayer under the imaging layer. In particular embodiments, the presence of the underlayer provides increased radiation absorptivity and/or patterning performance of the imaging layer.

Generally, photon absorption through a layer is depth dependent. When a homogenous layer or film is exposed to radiation, the lower portion of the layer is exposed to a lower dose of radiation, as compared to the upper portion of that same layer, because fewer photons reach that lower portion. Thus, to ensure sufficient and uniform exposure through the entire depth of a layer, the layer must provide sufficient transmission of the radiation. In particular embodiments, the underlayer described herein provides increased radiation absorption through the imaging layer. Furthermore, in some instances, the underlayer can effectively generate more secondary electrons that can better expose lower portions of the patterning structure.

One or both of the underlayer and the imaging layer can include a high-absorbing element. In one instance, the underlayer and the imaging layer both include a high-absorbing element, such as equal to or greater than $1\times10^7$ cm²/mol for EUV absorption. The element in each of the absorbing and imaging layers can be the same or different. In particular embodiments, enhanced adhesion can lower the required radiation dose to provide desired patterned features within the imaging layer and/or the underlayer.

The imaging layer can include any useful resist, such as metal-organic based resists, as described herein. When the photoresist material being employed possesses a significant inorganic component, for example it exhibits a predominately metal oxide framework, the underlayer may advantageously be a carbon-based film. In cases where there are device features present on the substrate to be patterned which create significant topography, another important function of the underlayer can be to overcoat and planarize the existing topography so that the subsequent patterning step may be performed on a flat surface with all areas of the pattern in focus. For such applications, the underlayer (or at least one of multiple underlayers) may be applied using dry deposition or spin-coating techniques. The layer may include various ALUM films with carbon- and hydrogen-based compositions, and may be doped with additional elements such as tungsten, boron, nitrogen, or fluorine.

The underlayer and imaging layer, either alone or together, can be considered a film. In some embodiments, the film is a radiation-sensitive film (e.g., an EUV-sensitive film). This film, in turn, can serve as an EUV resist, as further described herein. In particular embodiments, the layer or film can include one or more ligands (e.g., EUV labile ligands) that can be removed, cleaved, or cross-linked by radiation (e.g., EUV or DUV radiation).

Precursors can be used to provide a patternable film that is sensitive to radiation (or a patterning radiation-sensitive film or a photopatternable film). Such radiation can include EUV radiation, DUV radiation, or UV radiation that is provided by irradiating through a patterned mask, thereby being a patterned radiation. The film itself can be altered by being exposed to such radiation, such that the film is radiation-sensitive or photosensitive. In particular embodiments, the precursor is an organometallic compound, which includes at least one metal center.

The precursor can have any useful number and type of ligand(s). In some embodiments, the ligand can be characterized by its ability to react in the presence of a counter-reactant or in the presence of patterned radiation. For instance, the precursor can include a ligand that reacts with a counter-reactant, which can introduce linkages between metal centers (e.g., an —O— linkage), In another instance, the precursor can include a ligand that eliminates in the presence of patterned radiation. Such an EUV labile ligand can include branched or linear alkyl groups having a beta-hydrogen, as well as any described herein for R in formula (I) or (II).

The precursor can be any useful metal-containing precursor, such as an organometallic agent, a metal halide, or a capping agent (e.g., as described herein). In a non-limiting instance, the precursor includes a structure having formula (I):

wherein:
M is a metal or an atom having a high EUV absorption cross-section;
each R is, independently, H, halo, optionally substituted alkyl, optionally substituted cycloalkyl, optionally substituted cycloalkenyl, optionally substituted alkenyl, optionally substituted alkynyl, optionally substituted alkoxy, optionally substituted alkanoyloxy, optionally substituted aryl, optionally substituted amino, optionally substituted bis(trialkylsilyl)amino, optionally substituted trialkylsilyl, oxo, an anionic ligand, a neutral ligand, or a multidentate ligand;
a≥1; and b≥1.

In another non-limiting instance, the precursor includes a structure having formula (II):

wherein:
M is a metal or an atom having a high EUV absorption cross-section;
each R is, independently, halo, optionally substituted alkyl, optionally substituted aryl, optionally substituted amino, optionally substituted alkoxy, or L;
each L is, independently, a ligand, an anionic ligand, a neutral ligand, a multidentate ligand, ion, or other moiety that is reactive with a counter-reactant, in which R and L with M, taken together, can optionally form a heterocyclyl group or in which R and L, taken together; can optionally form a heterocyclyl group;
a≥1; b≥1; and c≥1.

In some embodiments, each ligand within the precursor can be one that is reactive with a counter-reactant. In one instance, the precursor includes a structure having formula (II), in which each R is, independently, L. In another instance, the precursor includes a structure having formula (IIa):

wherein:
M is a metal or an atom having a high EUV absorption cross-section;
each L is, independently, a ligand, ion, or other moiety that is reactive with a counter-reactant, in which two L, taken together, can optionally form a heterocyclyl group;
a≥1; and c≥1.

In particular embodiments of formula (IIa), a is 1. In further embodiments, c is 2, 3, or 4.

For any formula herein, M can be a metal or a metalloid or an atom with a high patterning radiation absorption cross-section (e.g., an EUV absorption cross-section that is equal to or greater than $1\times10^7$ cm$^2$/mol). In some embodiments, M is tin (Sn), bismuth (Bi), tellurium (Te), cesium (Cs), antimony (Sb), indium (In), molybdenum (Mo), hafnium (Hf), iodine (I), zirconium (Zr), iron (Fe), cobalt (Co), nickel (Ni), copper (Cu), zinc (Zn), silver (Ag), platinum (Pt), and lead (Pb). In further embodiments, M is Sn, a is 1, and c is 4 in formula (I), (II), or (IIa). In other embodiments, M is Sn, a is 1, and c is 2 in formula (I), (II), or (IIa). In particular embodiments, M is Sn(II) (e.g., in formula (I), (II), or (IIa)), thereby providing a precursor that is a Sn(II)-based compound. In other embodiments, M is Sn(IV) (e.g., in formula (I), (II), or (IIa)), thereby providing a precursor that is a Sn(IV)-based compound. In particular embodiments, the precursor includes iodine (e.g., as in periodate).

For any formula herein, each R is, independently, H, halo, optionally substituted alkyl, optionally substituted cycloalkyl, optionally substituted cycloalkenyl, optionally substituted alkenyl, optionally substituted alkynyl, optionally substituted alkoxy (e.g., —OR$^1$, in which R$^1$ can be optionally substituted alkyl), optionally substituted alkanoyloxy, optionally substituted aryl, optionally substituted amino, optionally substituted bis(trialkylsilyl)amino, optionally substituted trialkylsilyl, oxo, an anionic ligand (e.g., oxido, chlorido, hydride, acetate, iminodiacetate, propanoate, butanoate, benzoate, etc.), a neutral ligand, or a multidentate ligand.

In some embodiments, the optionally substituted amino is —NR$^1$R$^2$, in which each R$^1$ and R$^2$ is, independently, H or alkyl; or in which R$^1$ and R$^2$, taken together with the nitrogen atom to which each are attached, form a heterocyclyl group, as defined herein. In other embodiments, the optionally substituted bis(trialkylsilyl)amino is —N(SiR$^1$R$^2$R$^3$)$_2$, in which each R$^1$, R$^2$, and R$^3$ is, independently, optionally substituted alkyl. In yet other embodiments, the optionally substituted trialkylsilyl is —SiR$^1$R$^2$R$^3$, in which each R$^1$, R$^2$, and R$^3$ is, independently, optionally substituted alkyl.

In other embodiments, the formula includes a first R (or first L) that is —NR$^1$R$^2$ and a second R (or second L) that is —NR$^1$R$^2$, in which each R$^1$ and R$^2$ is, independently, H or optionally substituted alkyl; or in which R$^1$ from a first R (or first L) and R$^1$ from a second R (or second L), taken together with the nitrogen atom and the metal atom to which each are attached, form a heterocyclyl group, as defined herein. In yet other embodiments, the formula includes a first R that is —OR$^1$ and a second R that is —OR$^1$, in which each R$^1$ is, independently, H or optionally substituted alkyl; or in which R$^1$ from a first R and R$^1$ from a second R taken together with the oxygen atom and the metal atom to which each are attached, form a heterocyclyl group, as defined herein.

In some embodiments, at least one of R or L (e.g., in formula (I), (II), or (IIa)) is optionally substituted alkyl. Non-limiting alkyl groups include, e.g., C$_n$H$_{2n+1}$, where n is 1, 2, 3, or greater, such as methyl, ethyl, n-propyl, isopropyl, n-butyl, isobutyl, s-butyl, or t-butyl. In various embodiments, R or L has at least one beta-hydrogen or beta-fluorine. In other embodiments, at least one of R or L is a halo-substituted alkyl (e.g., a fluoro-substituted alkyl).

In some embodiments, each R or L or at least one R or L (e.g., in formula (I), (II), or (IIa)) is halo. In particular, the precursor can be a metal halide. Non-limiting metal halides include SnBr$_4$, SnCl$_4$, SnI$_4$, and SbCl$_3$.

In some embodiments, each R or L or at least one 1 or L (e.g., in formula (I), (II), or (IIa)) can include a nitrogen atom. In particular embodiments, one or more R or L can be optionally substituted amino, an optionally substituted monoalkylamino (e.g., —NR$^1$H, in which R$^1$ is optionally substituted alkyl), an optionally substituted dialkylamino —NR$^1$R$^2$, in which each R$^1$ and R$^2$ is, independently, optionally substituted alkyl), or optionally substituted bis(trialkylsilyl)amino. Non-limiting R and L substituents can include, e.g., —NMe$_2$, —NHMe, —NEt$_2$, —NHEt, —NMeEt, —N(t-Bu)—[CHCH$_3$]$_2$—N(t-Bu)— (tbba), —N(SiMe$_3$)$_2$; and —N(SiEt$_3$)$_2$.

In some embodiments, each R or L or at least one R or L (e.g., in formula (I), (II), or (IIa)) can include a silicon atom. In particular embodiments, one or more R or L can be optionally substituted trialkylsilyl or optionally substituted bis(trialkylsilyl)amino. Non-limiting R or L substituents can include, e.g., —SiMe$_3$, —N(SiMe$_3$)$_2$, and —N(SiEt$_3$)$_2$.

In some embodiments, each R or L or at least one R or L (e.g., in formula (I), (II), or (IIa)) can include an oxygen atom. In particular embodiments, one or more R or L can be optionally substituted alkoxy or optionally substituted alkanoyloxy. Non-limiting R or L substituents include, e.g., methoxy, ethoxy, isopropoxy (i-PrO), t-butoxy (t-BuO), acetate (—OC(O)—CH$_3$), and —O—C(CH$_3$)=CH—C(CH$_3$)—O— (acac).

Any formulas herein can include one or more neutral ligands. Non-limiting neutral ligands include an optionally substituted amine (e.g., —NR$_3$ or R$_2$N-Ak-NR$_2$, in which each R can be, independently, optionally substituted alkyl, optionally substituted hydrocarbyl, or optionally substituted aryl, and Ak is optionally substituted alkylene), an optionally substituted phosphine (e.g., PR$_3$ or R$_2$P-Ak-PR$_2$, in which each R can be, independently, H, optionally substituted alkyl, optionally substituted hydrocarbyl; or optionally substituted aryl, and Ak is optionally substituted alkylene), an optionally substituted ether (e.g., OR$_2$, in which each R can be, independently, H, optionally substituted alkyl, optionally substituted hydrocarbyl, or optionally substituted aryl), an optionally substituted alkyl, an optionally substituted alkene, an optionally substituted alkyne, an optionally substituted benzene, oxo, or carbon monoxide.

Any formulas herein can include one or more multidentate (e.g., bidentate) ligands.

Non-limiting multidentate ligand include a diketonate (e.g., acetylacetonate (acac) or —OC(R$^1$)-Ak-(R$^1$)CO— or —OC(R$^1$)—C(R$^2$)—(R$^1$)CO—), a bidentate chelating dinitrogen —N(R$^1$)-Ak-N(R$^1$)— or —N(R$^3$)—CR$^4$—CR$^2$=N(R$^1$)—), an aromatic (e.g., —Ar—), an amidinate (e.g., —N(R$^1$)—C(R$^2$)—N(R$^1$)—), an aminoalkoxide (e.g., —N(R$^1$)-Ak-O— or —N(R$^1$)$_2$-Ak-O—), a diazadienyl (e.g., —N(R$^1$)—C(R$^2$)—C(R$^2$)—N(R$^1$)—), a cyclopentadienyl, a pyrazolate, an optionally substituted heterocyclyl, an optionally substituted alkylene, or an optionally substituted heteroalkylene. In particular embodiments, each R$^1$ is, independently, optionally substituted alkyl, optionally substituted haloalkyl, or optionally substituted aryl; each R$^2$ is, independently, H or optionally substituted alkyl; R$^3$ and R$^4$, taken together, forms an optionally substituted heterocyclyl; Ak is optionally substituted alkylene; and Ar is optionally substituted arylene.

In particular embodiments, the precursor includes tin. In some embodiments, the tin precursor includes SnR or SnR$_2$ or SnR$_4$ or R$_3$SnSnR$_3$, wherein each R is, independently, H, halo, optionally substituted C$_{1-12}$ alkyl, optionally substituted C$_{1-12}$ alkoxy, optionally substituted amino (e.g., —NR$^1$R$^2$), optionally substituted C$_{2-12}$ alkenyl, optionally substituted C$_{2-12}$ alkynyl, optionally substituted C$^{3-8}$ cycloalkyl, optionally substituted aryl, cyclopentadienyl, optionally substituted bis(trialkylsilyl)amino (e.g., —N(SiR$^1$R$^2$R$^3$)$_2$), optionally substituted alkanoyloxy (e.g., acetate), a diketonate (e.g., —OC(R$^1$)-Ak-(R$^2$)CO—), or a bidentate chelating dinitrogen (e.g., —N(R$^1$)-Ak-N(R$^1$)—). In particular embodiments, each R$^1$, R$^2$, and R$^3$ is, independently, H or C$_{1-12}$ alkyl (e.g., methyl, ethyl, isopropyl, t-butyl, or neopentyl); and Ak is optionally substituted C$_{1-6}$ alkylene. In particular embodiments, each R is, independently, halo, optionally substituted C$_{1-12}$ alkoxy, optionally substituted amino, optionally substituted aryl, cyclopentadienyl, or a diketonate. Non-limiting tin precursors include SnF$_2$, SnH$_4$, SnBr$_4$, SnCl$_4$, SnI$_4$, tetramethyl tin (SnMe$_4$), tetraethyl tin (SnEt$_4$), trimethyl tin chloride (SnMe$_3$Cl), dimethyl tin dichloride (SnMe$_2$Cl$_2$), methyl tin trichloride (SnMeCl$_3$), tetraallyltin, tetravinyl tin, hexaphenyl ditin (Ph$_3$Sn—SnPh$_3$, in which Ph is phenyl), dibutyldiphenyltin (SnBu$_2$Ph$_2$), trimethyl(phenyl) tin (SnMe$_3$Ph), trimethyl (phenylethynyl) tin, tricyclohexyl tin hydride, tributyl tin hydride (SnBu$_3$H), dibutyltin diacetate (SnBu$_2$(CH$_3$COO)$_2$), tin(II) acetylacetonate (Sn(acac)$_2$), SnBu$_3$(OEt), SnBu$_2$(OMe)$_2$, SnBu$_3$(OMe), Sn(t-BuO)$_4$, Sn(n-Bu) (t-BuO)$_3$, tetrakis(dimethylamino)tin (Sn(NMe$_2$)$_4$), tetrakis (ethylmethylamino)tin (Sn(NMeEt)$_4$), tetrakis(diethylamino)tin(IV) (Sn(NEt$_2$)$_4$), (dimethylamino)trimethyl tin(IV)

(Sn(Me)₃(NMe₂), Sn(i-Pr)(NMe₂)₃, Sn(n-Bu)(NMe₂)₃, Sn(s-Bu)(NMe₂)₃, Sn(i-Bu)(NMe₂)₃, Sn(t-Bu)(NMe₂)₃, Sn(t-Bu)₂(NMe₂)₂, Sn(t-Bu)(NEt₂)₃, Sn(tbba), Sn(II) (1,3-bis(1,1-dimethylethyl)-4,5-dimethyl-(4R,5R)-1,3,2-diazastannolidin-2-ylidene), or bis[bis(trimethylsilyl)amino] tin (Sn[N(SiMe₃)₂]₂).

In other embodiments, the precursor includes bismuth, such as in BiR₃, wherein each R is, independently, halo, optionally substituted $C_{1-12}$ alkyl, mono-$C_{1-12}$ alkylamino (e.g., —NR¹H), di-$C_{1-12}$ alkylamino (e.g., —NR¹R²), optionally substituted aryl, optionally substituted bis(trialkylsilyl)amino (e.g., —N(SiR¹R²R³)₂), or a diketonate —OC(R⁴)-Ak-(R⁵)CO—). In particular embodiments, each R¹, R², and R³ is, independently, $C_{1-12}$ alkyl (e.g., methyl, ethyl, isopropyl, t-butyl, or neopentyl); and each R⁴ and R⁵ is, independently, H or optionally substituted $C_{1-12}$ alkyl (e.g., methyl, ethyl, isopropyl, t-butyl, or neopentyl). Non-limiting bismuth precursors include BiCl₃, BiMe₃, BiPh₃, Bi(NMe₂)₃, Bi[N(SiMe₃)₂]₃, and Bi(thd)₃, in which thd is 2,2,6,6-tetramethyl-3,5-heptanedionate.

In other embodiments, the precursor includes tellurium, such as TeR₂ or TeR₄, wherein each R is, independently, halo, optionally substituted $C_{1-12}$ alkyl (e.g., methyl, ethyl, isopropyl, t-butyl, and neopentyl), optionally substituted $C_{1-12}$ alkoxy, optionally substituted aryl, hydroxyl, oxo, or optionally substituted trialkylsilyl. Non-limiting tellurium precursors include dimethyl tellurium (TeMe₂), diethyl tellurium (TeEt₂), di(n-butyl) tellurium (Te(n-Bu)₂), di(isopropyl) tellurium (Te(i-Pr)₂), di(t-butyl) tellurium (Te(t-Bu)₂), t-butyl tellurium hydride (Te(t-Bu)(H)), Te(OEt)₄, bis(trimethylsilyptellurium (Te(SiMe₃)₂), and bis(triethylsilyl) tellurium (Te(SiEt₃)₂).

The precursor can include antimony, such as in SbR₃, wherein each R is, independently, halo, optionally substituted $C_{1-12}$ alkyl (e.g., methyl, ethyl, isopropyl, t-butyl, and neopentyl), optionally substituted $C_{1-12}$ alkoxy, or optionally substituted amino (e.g., —NR¹R², in which each R¹ and R² is, independently, H or optionally substituted $C_{1-12}$ alkyl). Non-limiting antimony precursors include SbCl₃, Sb(OEt)₃, Sb(On-Bu)₃, and Sb(NMe₂)₃.

Other precursors include indium precursors, such as in InR₃, wherein each R is, independently, halo, optionally substituted $C_{1-12}$ alkyl (e.g., methyl, ethyl, isopropyl, t-butyl, and neopentyl), or a diketonate (e.g., —OC(R⁴)-Ak-(R₅)CO—, in which each R⁴ and R⁵ is, independently, H or $C_{1-12}$ alkyl). Non-limiting indium precursors include InCp, in which Cp is cyclopentadienyl, InCl₃, InMe₃, In(acac)₃, In(CF₃COCHCOCH₃)₃, and In(thd)₃.

The precursor can include iodine, such as RI, wherein R is iodo (I) or optionally substituted $C_{1-12}$ alkyl, or periodate. Non-limiting iodine precursors include iodine gas (I₂), diiodomethane (CH₂I₂), and periodate.

Yet other precursors and non-limiting substituents are described herein. For instance, precursors can be any having a structure of formulas (I), (II), and (IIa), as described above; or formulas (III), (IV), (V), (VI), (VII), or (VIII), as described below. Any of the substituents M, R, X, or L, as described herein, can be employed in any of formulas (I), (II), (IIa), (III), (IV), (V), (VI), (VII), or (VIII).

Yet other exemplary EUV-sensitive materials, as well as processing methods and apparatuses, are described in U.S. Pat. No. 9,996,004; Int. Pat. Pub. No. WO 2020/102085; and Int. Pat. Pub. No. V(2019/217749, each of which is incorporated herein by reference in its entirety.

As described herein, the films, layers, and methods herein can be employed with any useful precursor. In some instances, the precursor includes a metal halide having the following formula (III):

$$MX_n \quad \quad (III),$$

in which M is a metal, X is halo, and n is 2 to 4, depending on the selection of M. Exemplary metals for M include Sn, Te, Bi, or Sb. Exemplary metal halides include SnBr₄, SnCl₄, SnI₄, and SbCl₃.

Another non-limiting precursor includes a structure having formula (IV):

$$MR_n \quad \quad (IV),$$

in which M is a metal; each R is independently H, an optionally substituted alkyl, amino (e.g., —NR₂, in which each R is independently alkyl), optionally substituted bis(trialkylsilyl)amino (e.g., —N(SiR₃)₂, in which each R is independently alkyl), or an optionally substituted trialkylsilyl (e.g., —SiR₃, in which each R is independently alkyl); and n is 2 to 4, depending on the selection of M. Exemplary metals for Nil include Sn, Te, Bi, or Sb. The alkyl group may be $C_nH_{2n+1}$, where n is 1, 2, 3, or greater. Exemplary organometallic agents include SnMe₄, SnEt₄, TeR$_n$, RTeR, t-butyl tellurium hydride (Te(t-Bu)(H)), dimethyl tellurium (TeMe₂), di(t-butyl) tellurium (Te(t-Bu)₂), di(isopropyl)tellurium (Te(i-Pr)₂), bis(trimethylsilyptellurium (Te(SiMe₃)₂), bis(triethylsilyl) tellurium (Te(SiEt₃)₂), tris(bis(trimethylsilyl)amido) bismuth (Bi[N(SiMe₃)₂]₃), Sb(NMe₂)₃, and the like.

Another non-limiting precursor can include a capping agent having the following formula (V):

$$ML_n \quad \quad (V),$$

in which M is a metal; each L is independently an optionally substituted alkyl, amino (e.g., —NR¹R², in which each of R¹ and R² can be H or alkyl, such as any described herein), alkoxy (e.g., —OR, in which R is alkyl, such as any described herein), halo, or other organic substituent; and n is 2 to 4, depending on the selection of M. Exemplary metals for Ni include Sn, Te, Bi, or Sb. Exemplary ligands include dialkylamino (e.g., dimethylamino, methylethylamino, and diethylamino), alkoxy (e.g., i-butoxy and isopropoxy), halo (e.g., Cl, Br, and I), or other organic substituents (e.g., acetylacetone or N²,N³-di-tertbutyl-butane-2,3-diamino). Non-limiting capping agents include SnCl₄; SnI₄; Sn(NR₂)₄, wherein each of R is independently methyl or ethyl; or Sn(t-BuO)₄. In some embodiments, multiple types of ligands are present.

A precursor can include a hydrocarbyl-substituted capping agent having the following formula (VI):

$$R_nMX_m \quad \quad (VI),$$

wherein M is a metal, R is a $C_{2-10}$ alkyl or substituted alkyl having a beta-hydrogen, and X is a suitable leaving group upon reaction with a hydroxyl group of the exposed hydroxyl groups. In various embodiments, n=1 to 3, and m=4−n, 3−n, or 2−n, so long as m>0 (or m≥1). For example, R may be t-butyl, t-pentyl, t-hexyl, cyclohexyl, isopropyl, isobutyl, sec-butyl, n-butyl, n-pentyl, n-hexyl, or derivatives thereof having a heteroatom substituent in the beta position. Suitable heteroatoms include halogen (F, Cl, Br, or I), or oxygen (—OH or —OR). X may be dialkylamino (e.g., dimethylamino, methylethylamino, or diethylamino), alkoxy (e.g., t-butoxy, isopropoxy), halo (e.g., F, Cl, Br, or I), or another organic ligand. Examples of hydrocarbyl-substituted capping agents include t-butyltris(dimethylamino)tin ($Sn(t-Bu)(NMe_2)_3$), n-butyltris(dimethylamino) tin ($Sn(n-Bu)(NMe_2)_3$), t-butyltris(diethylamino)tin ($Sn(t-Bu)(NEt_2)_3$), di(t-butyl)di(dimethylamino)tin ($Sn(t-Bu)_2(NMe_2)_2$), sec-butyltris(dimethylamino)tin ($Sn(s-Bu)(NMe_2)_3$), n-pentyltris(dimethylamino)tin ($Sn(n-pentyl)(NMe_2)_3$), i-butyltris(dimethylamino) tin ($Sn(i-Bu)(NMe_2)_3$), i-propyltris(dimethylamino)tin ($Sn(i-Pr)(NMe_2)_3$), t-butyltris(t-butoxy)tin ($Sn(t-Bu)(t-BuO)_3$), n-butyl(tris(t-butoxy)tin ($Sn(n-Bu)(t-BuO)_3$), or isopropyl-tris(t-butoxy)tin ($Sn(i-Pr)(t-BuO)_3$).

In various embodiments, a precursor includes at least one alkyl group on each metal atom that can survive the vapor-phase reaction, while other ligands or ions coordinated to the metal atom can be replaced by the counter-reactants. Accordingly, another non-limiting precursor includes an organometallic agent having the formula (VII):

$$M_aR_bL_c \qquad (VII),$$

in which M is a metal; R is an optionally substituted alkyl; L is a ligand, ion, or other moiety which is reactive with the counter-reactant; $a \geq 1$; $b \geq 1$; and $c \geq 1$. In particular embodiments, a=1, and b+c=4. In some embodiments, M is Sn, Te, Bi, or Sb. In particular embodiments, each L is independently amino (e.g., $-NR^1R^2$, in which each of $R^1$ and $R^2$ can be H or alkyl, such as any described herein), alkoxy (e.g., $-OR$, in which R is alkyl, such as any described herein), or halo (e.g., F, Cl, Br, or I). Exemplary agents include $SnMe_3Cl$, $SnMe_2Cl_2$, $SnMeCl_3$, $SnMe(NMe_2)_3$, $SnMe_2(NMe_2)_2$, $SnMe_3(NMe_2)$, and the like.

In other embodiments, the non-limiting precursor includes an organometallic agent having the formula (VIII):

$$M_aL_c \qquad (VIII),$$

in which M is a metal; L is a ligand, ion, or other moiety which is reactive with the counter-reactant; $a \geq 1$; and $c \geq 1$. In particular embodiments, c=n−1, and n is 2, 3, or 4, In some embodiments, M is Sn, Bi, or Sb. Counter-reactants preferably have the ability to replace the reactive moieties ligands or ions (e.g., L in formulas herein) so as to link at least two metal atoms via chemical bonding.

In any embodiment herein, R can be an optionally substituted alkyl (e.g., $C_{1-10}$ alkyl). In one embodiment, alkyl is substituted with one or more halo (e.g., halo-substituted $C_{1-10}$ alkyl, including one, two, three, four, or more halo, such as F, Cl, Br, or I). Exemplary substituents include $C_nH_{2n+1}$, preferably wherein $n \geq 3$; and $C_nF_xH_{(2n+1-x)}$, wherein $2n+1 \leq x \leq 1$. In various embodiments, R has at least one beta-hydrogen or beta-fluorine. For example, R may be selected from the group consisting of i-propyl, n-propyl, t-butyl, n-butyl, sec-butyl, n-pentyl, i-pentyl, sec-pentyl, and mixtures thereof.

In any embodiment herein, L may be any moiety readily displaced by a counter-reactant to generate an M-OH moiety, such as a moiety selected from the group consisting of an amino (e.g., $-NR^1R^2$, in which each of $R^1$ and $R^2$ can be H or alkyl, such as any described herein), alkoxy (e.g., $-OR$, in which R is alkyl, such as any described herein), carboxylates, halo (e.g., F, Cl, Br, or I), and mixtures thereof.

Counter-reactants preferably have the ability to replace the reactive moieties, ligands, or ions (e.g., L in formulas herein) so as to link at least two metal atoms via chemical bonding. Exemplary counter-reactants include oxygen-containing counter-reactants, such as oxygen ($O_2$), ozone ($O_3$), water, peroxides (e.g., hydrogen peroxide), oxygen plasma, water plasma, alcohols, dihydroxy alcohols, polyhydroxy alcohols, fluorinated dihydroxy alcohol, fluorinated polyhydroxy alcohols, fluorinated glycols, formic acid, and other sources of hydroxyl moieties, as well as combinations thereof. In various embodiments, a counter-reactant reacts with the precursor by forming oxygen bridges between neighboring metal atoms. Other potential counter-reactants include hydrogen sulfide and hydrogen disulfide, which can crosslink metal atoms via sulfur bridges and bis(trimethylsilyl)tellurium, which can crosslink metal atoms via tellurium bridges. In addition, hydrogen iodide may be utilized to incorporate iodine into the film.

Yet other non-limiting counter-reactants include a chalcogenide precursor having the formula $ZR_2$, wherein: Z is sulfur, selenium, or tellurium; and each R is, independently, H, optionally substituted alkyl (e.g., methyl, ethyl, n-propyl, isopropyl, n-butyl, t-butyl, etc.), optionally substituted alkenyl, optionally substituted aryl, optionally substituted amino, optionally substituted alkoxy, or optionally substituted trialkylsilyl.

Exemplary organometallic agents include $SnMeCl_3$, ($N^2$, $N^3$-di-t-butyl-butane-2,3-diamido) tin(II) (Sn(tbba)), bis(bis(trimethylsilyl)amido) tin(II), tetrakis(dimethylamino) tin (IV) ($Sn(NMe_2)_4$), t-butyl tris(dimethylamino) tin ($Sn(t-butyl)(NMe_2)_3$), i-butyl tris(dimethylamino) tin ($Sn(i-Bu)(NMe_2)_3$), n-butyl tris(dimethylamino) tin ($Sn(n-Bu)(NMe_2)_3$), sec-butyl tris(dimethylamino) tin ($Sn(s-Bu)(NMe_2)_3$), i-propyl(tris)dimethylamino tin ($Sn(i-Pr)(NMe_2)_3$), n-propyltris(diethylamino) tin ($Sn(n-Pr)(NEt_2)_3$), and analogous alkyl(tris)(t-butoxy) tin compounds, such as t-butyl tris(t-butoxy) tin ($Sn(t-Bu)(t-BuO)_3$). In some embodiments, the organometallic agents are partially fluorinated.

In some embodiments, patterning structure can include a surface layer or film comprising exposed hydroxyl groups or hydroxyl-terminated $SnO_x$. Without limiting the mechanism, function or utility of present technology, it is believed that the hydroxyl-terminated $SnO_x$ layer may offer benefits such as improved adhesion of materials deposited on the surface of the substrate and enhanced absorption of EUV (or other radiation) during patterning. Sensitivity to EUV or other irradiation and resolution may be dependent on the properties of the $SnO_x$ layer, such as thickness, density and short-range charge transfer characteristics. In various embodiments, the $SnO_x$ layer has a thickness of from 0.1 nm to 20 nm, or from 0.2 nm to 10 nm, or from 0.5 nm to 5 nm.

In some embodiments, the hydroxyl-terminated $SnO_x$ layer is deposited on a surface of the substrate by vapor deposition. In such methods, the deposition comprises reacting $Sn-X_n$ with an oxygen-containing counter-reactant, wherein X is a ligand such as dialkylamino, dimethylamino, methylethylamino, and diethylamino), alcohol (e.g., t-butoxy, and isopropoxy), halogen (e.g., F, Cl, Br, and I), or other organic substituent (e.g., acetylacetone, $N_2,N_3$-di-ter-tbutyl-butane-2,3-diamino). For example, $Sn-X_n$ may be $SnCl_4$, $SnI_4$, or $Sn(NR_2)_4$ wherein R is methyl or ethyl, or $Sn(t-BuO)_4$. In some embodiments, multiple types of ligands are present. The oxygen-containing counter-reactant may be selected from the group consisting of water, hydrogen peroxide, formic acid, alcohols, oxygen, ozone, and combinations thereof.

Suitable vapor deposition processes include chemical vapor deposition (CVD), atomic layer deposition (ALD), plasma-enhanced chemical vapor deposition (PECVD), or plasma-enhanced atomic layer deposition (PEALD). In some embodiments, the deposition is ALD, in a cyclical process of depositing the $Sn-X_n$ and depositing the oxygen-containing counter-reactant. In some embodiments, the deposition is CVD, by simultaneously flowing the $Sn-X_n$ and the oxygen-containing counter-reactant. Materials and processes among those useful herein for depositing $SnO_x$ layers are described in Nazarov et al., Atomic Layer Deposition of Tin Dioxide Nanofilms: A Review, 40 *Rev. Adv. Mater. Sci.* 262 (2015). A $SnO_x$ substrate may be deposited by a CVD or ALD process, as described herein.

A surface activation operation may be used to activate the surface for future operations. For example, for a $SiO_x$ surface, a water or oxygen/hydrogen plasma may be used to create hydroxyl groups on the surface. For a carbon- or hydrocarbon-based surface, a water, hydrogen/oxygen or $CO_2$ plasma or ozone treatment may be used to create carboxylic acids/or hydroxyl groups. Such approaches can prove critical for improving the adhesion of resist features to the substrate, which might otherwise delaminate or lift off in the solvent used for development.

Adhesion may also be enhanced by inducing roughness in the substrate surface to increase the surface area available for interaction, as well as directly improve mechanical adhesion. For example, first a sputtering process using Ar or other non-reactive ion bombardment can be used to produce rough surfaces. Then, the surface can be terminated with a desired surface functionality as described above (e.g., hydroxyl and/or carboxylic acid groups). On carbon, a combination approach can be employed wherein a chemically reactive oxygen-containing plasma such as $CO_2$, $O_2$, $H_2O$ (or mixtures of $H_2$ and $O_2$) can be used to etch away a thin layer of film with local non-uniformity and simultaneously terminate with —OH, —OOH, or —COOH groups. This may be done with or without bias. In conjunction with the surface modification strategies mentioned above, this approach could serve the dual purpose of surface roughening and chemical activation of the substrate surface, either for direct adhesion to an inorganic metal-oxide based resist or as an intermediate surface modification for further functionalization.

The patterning structure can include any useful substrate. For instance, an incoming wafer can be prepared with a substrate surface of a desired material, with the uppermost material being the layer into which the resist pattern is transferred. While the material selection may vary depending on integration, it is generally desired to select a material which can be etched with high selectivity to (i.e., much faster than) the EUV resist or imaging layer. In some embodiments, the substrate is a hardmask, which is used in lithographic etching of an underlying semiconductor material. The hardmask may comprise any of a variety of materials, including amorphous carbon (a-C), tin oxide (e.g., $SnO_x$), silicon oxide (e.g., $SiO_x$, including $SiO_2$), silicon oxynitride (e.g., $SiO_xN_y$), silicon oxycarbide $SiO_xC_y$), silicon nitride (e.g., $Si_3N_4$), titanium oxide (e.g., $TiO_2$), titanium nitride (e.g., TiN), tungsten (e.g., W), doped carbon (e.g., W-doped C), tungsten oxide (e.g., $WO_x$, hafnium oxide (e.g., $HfO_2$), zirconium oxide (e.g., $ZrO_2$), and aluminum oxide (e.g., $Al_2O_3$). Suitable substrate materials can include various carbon-based films (e.g., ashable hardmask (AHM, silicon-based films (e.g., $SiO_x$, $SiC_x$, $SiO_xC_y$, $SiO_xN_y$, $SiO_xC_yN_z$), a-Si:H poly-Si, or SiN), or any other (generally sacrificial) film applied to facilitate the patterning process). For example, the substrate may preferably comprise $SnO_x$, such as $SnO_2$. In various embodiments, the layer may be from 1 nm to 100 nm thick, or from 2 nm to 10 nm thick.

In various embodiments, the surface (e.g., of the substrate and/or the film) comprises exposed hydroxyl groups on its surface. In general, the surface may be any surface that comprises, or has been treated to produce, an exposed hydroxyl surface. Such hydroxyl groups may be formed on the surface by surface treatment of a substrate using oxygen plasma, water plasma, or ozone. In other embodiments, the surface of the film can be treated to provide exposed hydroxyl groups, upon which a capping layer can be applied. In various embodiments, the hydroxyl-terminated metal oxide layer has a thickness of from 0.1 nm to 20 nm, or from 0.2 nm to 10 nm, or from 0.5 nm to 5 nm.

The implementations disclosed herein describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. In addition to semiconductor wafers, other work pieces that may be used implementations disclosed herein include various articles such as printed circuit boards and the like. The processes and apparatuses can be used in the fabrication of semiconductor devices, displays, and the like.

Lithographic Processes

EUV lithography makes use of EUV resists, which may be polymer-based chemically amplified resists produced by liquid-based spin-on techniques or metal oxide-based resists produced by dry vapor-deposited techniques. Such EUV resists can include any EUV-sensitive film or material described herein. Lithographic methods can include patterning the resist, e.g., by exposure of the EUV resist with EUV radiation to form a photo pattern, followed by developing the pattern by removing a portion of the resist according to the photo pattern to form a mask.

It should also be understood that while the present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources; X-ray, which formally includes EUV at the lower energy range of the X-ray range; as well as e-beam, which can cover a wide energy range. Such methods include those where a substrate (e.g., optionally having exposed hydroxyl groups) is contacted with a precursor (e.g., any described herein) to form a metal oxide (e.g., a layer including a network of metal oxide bonds, which may include other non-metal and non-oxygen groups) film as the imaging/PR layer on the surface of the substrate. The specific methods may depend on the particular materials and applications used in the semiconductor substrate and ultimate semiconducting device. Thus, the methods described in this application are merely exemplary of the methods and materials that may be used in present technology. In some embodiments, lithography includes use of a radiation source having a wavelength that is between 10 nm and 400 nm.

Directly photopatternable EUV resists may be composed of or contain metals and/or metal oxides. The metals/metal oxides are highly promising in that they can enhance the EUV photon absorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects during the evaporation of solvent between fine features.

Dry development techniques have been proposed to overcome these issues by eliminating substrate delamination and interface failures. Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line CD variation in the following transfer etch step. Additional processes employed during lithography are described in detail below.

Deposition Processes, Including Dry Deposition

As discussed herein, the present disclosure provides methods for making underlayers and imaging layers on semiconductor substrates, which may be patterned using EUV or other next generation lithographic techniques. In some embodiments, dry deposition can employ any useful precursor (e.g., hydrocarbon precursors, dopant precursors, metal halides, capping agents, or organometallic agents described herein) to provide the underlayer and the imaging layer. Methods include those where polymerized organometallic materials are produced in a vapor and deposited above the underlayer. In other embodiments, a spin-on formulation may be used. Deposition processes can include applying a EUV-sensitive material as a resist film or an EUV-sensitive film.

Such EUV-sensitive films comprise materials which, upon exposure to EUV, undergo changes, such as the loss of bulky pendant ligands bonded to metal atoms in low density M-OH rich materials, allowing their crosslinking to denser M-O-M bonded metal oxide materials. In other embodiments, EUV exposure results in further cross-linking between ligands bonded to metal atoms, thereby providing denser M-L-M bonded organometallic materials, in which L is a ligand. In yet other embodiments, EUV exposure results in loss of ligands to provide M-OH materials that can be removed by positive tone developers.

Through EUV patterning, areas of the film are created that have altered physical or chemical properties relative to unexposed areas. These properties may be exploited in subsequent processing, such as to dissolve either unexposed or exposed areas or to selectively deposit materials on either the exposed or unexposed areas. In some embodiments, the unexposed film has a hydrophobic surface, and the exposed film has a hydrophilic surface (it being recognized that the hydrophilic properties of exposed and unexposed areas are relative to one another) under the conditions at which such subsequent processing is performed. For example, the removal of material may be performed by leveraging differences in chemical composition, density, and cross-linking of the film. Removal may be by wet processing or dry processing, as further described herein.

The thickness of the EUV-patternable film formed on the surface of the substrate may vary according to the surface characteristics, materials used, and processing conditions. In various embodiments, the film thickness may range from about 0.5 nm to about 100 nm. Preferably, the film has a sufficient thickness to absorb most of the EUV light under the conditions of EUV patterning. For example, the overall absorption of the resist film may be 30% or less (e.g., 10% or less, or 5% or less), so that the resist material at the bottom of the resist film is sufficiently exposed. In some embodiments, the film thickness is from 10 nm to 20 nm. Without limiting the mechanism, function, or utility of the present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

The film (e.g., underlayer and/or imaging layer) may be composed of a metal oxide layer deposited in any useful manner. Such a metal oxide layer can be deposited or applied by using any EUV-sensitive material described herein, such as a precursor (e.g., metal-containing precursor, a metal halide, a capping agent, or an organometallic agent) in combination with a counter-reactant. In exemplary processes, a polymerized organometallic material is formed in vapor phase or in situ on the surface of the substrate in order to provide the metal oxide layer. The metal oxide layer may be employed as a film, an adhesion layer, or a capping layer.

Optionally, the metal oxide layer can include a hydroxyl-terminated metal oxide layer, which can be deposited by employing a capping agent (e.g., any described herein) with an oxygen-containing counter-reactant. Such a hydroxyl-terminated metal oxide layer can be employed, e.g., as an adhesion layer between two other layers, such as between the substrate and the film and/or between the photoresist layer and the underlayer.

Exemplary deposition techniques (e.g., for a film, an underlayer, or an imaging layer) include any described herein, such as ALD (e.g., thermal ALD and plasma-enhanced ALD), spin-coat deposition, PVD including PVD co-sputtering, CVD (e.g., PE-CVD or LP-CVD), sputter deposition, e-beam deposition including e-beam co-evaporation, etc., or a combination thereof, such as ALD with a CVD component, such as a discontinuous, ALD-like process in which precursors and counter-reactants are separated in either time or space.

Further description of precursors and methods for their deposition as EUV photoresist films applicable to this disclosure may be found in International Appl. No. PCT/US19/31618, published as International Pub. No. WO2019/217749, filed May 9, 2019, and titled METHODS FOR MAKING EUV PATTERNABLE HARD MASKS. The thin films may include optional materials in addition to a precursor and a counter-reactant to modify the chemical or physical properties of the film, such as to modify the sensitivity of the film to EUV or enhancing etch resistance. Such optional materials may be introduced, such as by doping during vapor phase formation prior to deposition on the substrate, after deposition of the film, or both. In some embodiments, a gentle remote $H_2$ plasma may be introduced so as to replace some Sn-L bonds with Sn—H, for example, which can increase reactivity of the resist under EUV.

In general, methods can include mixing a vapor stream of a precursor (e.g., a metal-containing precursor, such as an organometallic agent) with an optional vapor stream of a counter-reactant so as to form a polymerized organometallic material, and depositing the organometallic material onto the surface of the semiconductor substrate. In some embodiments, mixing the precursor and optional counter-reactant can form a polymerized organometallic material. As will be understood by one of ordinary skill in the art, the mixing and depositing aspects of the process may be concurrent, in a substantially continuous process.

In an exemplary continuous CVD process, two or more gas streams, in separate inlet paths, of sources of precursor and optional counter-reactant are introduced to the deposition chamber of a CVD apparatus, where they mix and react in the gas phase, to form agglomerated polymeric materials (e.g., via metal-oxygen-metal bond formation) or a film on the substrate. Gas streams may be introduced, for example, using separate injection inlets or a dual-plenum showerhead. The apparatus is configured so that the streams of precursor and optional counter-reactant are mixed in the chamber, allowing the precursor and optional counter-reactant to react to form a polymerized organometallic material or a film (e.g., a metal oxide coating or agglomerated polymeric materials, such as via metal-oxygen-metal bond formation).

For depositing metal oxide, the CVD process is generally conducted at reduced pressures, such as from 0.1 Torr to 10 Torr. In some embodiments, the process is conducted at pressures from 1 Torr to 2 Torr. The temperature of the substrate is preferably below the temperature of the reactant streams. For example, the substrate temperature may be from 0"C to 250° C., or from ambient temperature e.g., 23° C.) to 150° C.

For depositing agglomerated polymeric materials, the CVD process is generally conducted at reduced pressures, such as from 10 mTorr to 10 Torr. In some embodiments, the process is conducted at from 0.5 to 2 Torr. The temperature of the substrate is preferably, at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature. Without limiting the mechanism, function or utility of present technology, it is believed that the product from such vapor-phase reaction becomes heavier in molecular weight as metal atoms are crosslinked by counter-reactants, and is then condensed or otherwise deposited onto the substrate. In various embodiments, the steric hindrance of the bulky alkyl groups further prevents the formation of densely packed network and produces low density films having increased porosity.

A potential advantage of using dry deposition methods is ease of tuning the composition of the film as it grows. In a. CVD process, this may be accomplished by changing the relative flows of a first precursor and a second precursor during deposition. Deposition may occur between 30° C. and 200° C. at pressures between 0.01 Torr to 100 Torr, but more generally between about 0.1 Torr and 10 Torr.

A film (e.g., a metal oxide coating or agglomerated polymeric materials, such as via metal-oxygen-metal bond formation) may also be deposited by an ALD process. For example, the precursor(s) and optional counter-reactant are introduced at separate times, representing an ALD cycle. The precursors react on the surface, forming up to a monolayer of material at a time for each cycle. This may allow for excellent control over the uniformity of film thickness across the surface. The ALD process is generally conducted at reduced pressures, such as from 0.1 Torr to 10 Torr. In some embodiments, the process is conducted from 1 Torr to 2 Torr. The substrate temperature may be from 0° C. to 250° C., or from ambient temperature (e.g., 23° C.) to 150° C. The process may be a thermal process or, preferably, a plasma-assisted deposition.

Any of the deposition methods herein can be modified to allow for use of two or more different precursors. In one embodiment, the precursors can include the same metal but different ligands. In another embodiment, the precursors can include different metal groups. In one non-limiting instance, alternating flows of various volatile precursors can provide a mixed metal-containing layer, such as use of a metal alkoxide precursor having a first metal (e.g., Sn) with a silyl-based precursor having a different second metal (e.g., Te).

Processes herein can be used to achieve a surface modification. In some iterations, a vapor of the precursor may be passed over the wafer. The wafer may be heated to provide thermal energy for the reaction to proceed. In some iterations, the heating can be between about 50° C. to about 250° C. In some cases, pulses of the precursor may be used, separated by pump and/or purging steps. For instance, a first precursor may be pulsed between pulses of a second precursor pulses resulting in ALD or ALD-like growth. In other cases, both precursors may be flowed at the same time. Examples of elements useful for surface modification include I, F, Sn, Bi, Sb, Te, and oxides or alloys of these compounds.

The processes herein can be used to deposit a thin metal oxide or metal by ALD or CVD, Examples include tin oxide ($SnO_x$), bismuth oxide ($BiO_x$), and Te. Following deposition, the film may be capped with an alkyl substituted precursor of the form $M_aR_bL_c$, as described elsewhere herein. A counter-reactant may be used to better remove the ligands, and multiple cycles may be repeated to ensure complete saturation of the substrate surface. The surface can then ready for the EUV-sensitive film to be deposited. One possible method is to produce a thin film of $SnO_x$. Possible chemistries include growth of $SnO_2$ by cycling tetrakis (dimethylamino)tin and a counter-reactant such as water or $O_2$ plasma. After the growth, a capping agent could be used. For example, isopropyltris(dimethylamino)tin vapor may be flown over the surface.

Deposition processes can be employed on any useful surface. As referred to herein, the "surface" is a surface onto which a film of the present technology is to be deposited or that is to be exposed to EUV during processing. Such a surface can be present on a substrate (e.g., upon which a film is to be deposited), on a film (e.g., upon which a capping layer can be deposited), on a hardmask, or on an underlayer.

Any useful substrate can be employed, including any material construct suitable for lithographic processing, particularly for the production of integrated circuits and other semiconducting devices. In some embodiments, substrates are silicon wafers. Substrates may be silicon wafers upon which features have been created ("underlying topographical features"), having an irregular surface topography.

Such underlying topographical features may include regions in which material has been removed (e.g., by etching) or regions in which materials have been added (e.g., by deposition) during processing prior to conducting a method of this technology. Such prior processing may include methods of this technology or other processing methods in an iterative process by which two or more layers of features are formed on the substrate. Without limiting the mechanism, function, or utility of the present technology, it is believed that, in some embodiments, methods of the present technology offer advantages relative to methods among those known in the art in which photolithographic films are deposited on the surface of substrates using spin casting methods. Such advantages may derive from the conformance of the films of the present technology to underlying features without "filling in" or otherwise planarizing such features, and the ability to deposit films on a wide variety of material surfaces.

EUV Exposure Processes

EUV exposure of the film can provide UN exposed areas having activated reactive centers including a metal atom (M), which are produced by EUV-mediated cleavage events. Such reactive centers can include dangling metal bonds, M-H groups, cleaved M-ligand groups, dimerized M-M bonds, or M-O-M bridges.

EUV exposure can have a wavelength in the range of about 10 nm to about 20 nm in a vacuum ambient, such as a wavelength of from 10 nm to 15 nm, e.g., 13.5 nm. In particular, patterning can provide EUV exposed areas and EUV unexposed areas to form a pattern.

The present technology can include patterning using EUV, as well as DUN/or e-beam. In such patterning, the radiation is focused on one or more regions of the imaging layer. The exposure is typically performed such that imaging layer film comprises one or more regions that are not exposed to the radiation. The resulting imaging layer may comprise a plurality of exposed and unexposed regions, creating a pattern consistent with the creation of transistor or other features of a semiconductor device, formed by addition or removal of material from the substrate in subsequent processing of the substrate. EUV, INN and e-beam radiation methods and equipment among useful herein include methods and equipment known in the art.

In some EUV lithography techniques, an organic hardmask (e.g., an ashable hardmask of PECVD amorphous hydrogenated carbon) is patterned using a conventional photoresist process, During photoresist exposure, EUV radiation is absorbed in the resist and in the substrate below, producing highly energetic photoelectrons (e.g., about 100 eV) and in turn a cascade of low-energy secondary electrons (e.g., about 10 eV) that diffuse laterally, by, several nanometers. These electrons increase the extent of chemical reactions in the resist which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

A vacuum-integrated metal hardmask process and related vacuum-integrated hardware that combines film formation (deposition/condensation) and optical lithography with the result of greatly improved EUV lithography (EUVL) performance—e.g. reduced line edge roughness—is disclosed herein.

In various embodiments described herein, a deposition condensation) process (e.g., ALD or MOCVD carried out in a PECVD tool, such as the Lam Vector®) can be used to form a thin film of a metal-containing film, such a photosensitive metal salt or metal-containing organic compound (organometallic compound), with a strong absorption in the EUV (e.g., at wavelengths on the order of 10 nm to 20 nm), for example at the wavelength of the EUVL light source (e.g., 13.5 nm=91.8 eV), This film photo-decomposes upon EUV exposure and forms a metal mask that is the pattern transfer layer during subsequent etching (e.g., in a conductor etch tool, such as the Lam 2300® Kiyo®).

Following deposition, the EUV-patternable thin film is patterned by exposure to a beam of EUV light, typically under relatively high vacuum. For EUV exposure, the metal-containing film can then be deposited in a chamber integrated with a lithography platform (e.g., a wafer stepper such as the TWINSCAN NXE: 3300B® platform supplied by ASML of Veldhoven, NL) and transferred under vacuum so as not to react before exposure. Integration with the lithography tool is facilitated by the fact that EUVL also requires a greatly reduced pressure given the strong optical absorption of the incident photons by ambient gases such as $H_2O$, $O_2$, etc. In other embodiments, the photosensitive metal film deposition and EUV exposure may be conducted in the same chamber.

Development Processes, Including Dry Development

EUV exposed or unexposed areas can be removed by any useful development process. In one embodiment, the EUV exposed area can have activated reactive centers, such as dangling metal bonds, M-H groups, or dimerized M-M bonds. In particular embodiments, M-H groups can be selectively removed by employing one or more dry development processes (e.g., halide chemistry). In other embodiments, M-M bonds can be selectively removed by employing a wet development process, e.g., use of hot ethanol and water to provide soluble $M(OH)_n$ groups. In yet other embodiments, EUV exposed areas are removed by use of wet development (e.g., by using a positive tone developer). In some embodiments, EUV unexposed areas are removed by use of dry development.

Dry development processes can include use of halides, such as HCl— or HBr-based processes. While this disclosure is not limited to any particular theory or mechanism of operation, the approach is understood to leverage the chemical reactivity of the dry-deposited. EUV photoresist films with the clean chemistry (e.g., HCl, HBr, and $BCl_3$) to form volatile products using vapors or plasma. The dry-deposited EUV photoresist films can be removed with etch rates of up to 1 nm/s. The quick removal of dry-deposited EUV photoresist films by these chemistries is applicable to chamber cleaning, backside clean, bevel clean, and PR developing. Although the films can be removed using vapors at various temperatures (e.g., HCl or HBr at a temperature greater than −10° C., or $BCl_3$ at a temperature greater than 80° C., for example), a plasma can also be used to further accelerate or enhance the reactivity.

Plasma processes include transformer coupled plasma (TCP), inductively coupled plasma (ICP), or capacitively coupled plasma (CCP), employing equipment and techniques among those known in the art. For example, a process may be conducted at a pressure of >0.5 mTorr (e.g., such as from 1 mTorr to 100 mTorr), at a power level of <1000 W (e.g., <500 W). Temperatures may be from 30° C. to 300° C. (e.g., 30° C. to 120° C.), at flow rate of 100 to 1000 standard cubic centimeters per minute (sccm), e.g., about 500 sccm, for from 1 to 3000 seconds (e.g., 10 seconds to 600 seconds).

Where the halide reactant flows are of hydrogen gas and halide gas, a remote plasma/UV radiation is used to generate radicals from the $H_2$ and $Cl_2$ and/or $Br_2$, and the hydrogen and halide radicals are flowed to the reaction chamber to contact the patterned EUV photoresist on the substrate layer of the wafer. Suitable plasma power may range from 100 W to 500 W, with no bias. It should be understood that while these conditions are suitable for some processing reactors, e.g., a Kiyo etch tool available from Lam Research Corporation, Fremont, Calif., a wider range of process conditions may be used according to the capabilities of the processing reactor.

In thermal development processes, the substrate is exposed to dry development chemistry (e.g., a Lewis Acid) in a vacuum chamber (e.g., oven). Suitable chambers can include a vacuum line, a dry development hydrogen halide chemistry gas (e.g., HBr, HCl) line, and heaters for temperature control. In some embodiments, the chamber interior can be coated with corrosion resistant films, such as organic polymers or inorganic coatings, One such coating is polytetrafluoroethylene ((PTFE), e.g., Teflon™). Such materials can be used in thermal processes of this disclosure without risk of removal by plasma exposure.

The process conditions for the dry development may be reactant flow of 100 sccm to 500 sccm (e.g., 500 sccm HBr or HCl), temperature of −10° C. to 120° C. (e.g., −10° C.), pressure of 1 mTorr to 500 mTorr (e.g., 300 mTorr) with no plasma and for a time of about 10 sec to 1 min, dependent on the photoresist film and their composition and properties.

In various embodiments, methods of the present disclosure combine all dry steps of film deposition, formation by vapor deposition, (EUV) lithographic photopatterning, and dry development. In such processes, a substrate may directly go to a dry development/etch chamber following photopatterning in an EUV scanner. Such processes may avoid material and productivity costs associated with a wet development. A dry process can also provide more tunability and give further CD control and/or scum removal.

In various embodiments, the EUV photoresist, containing some amount of metal, metal oxide and organic components, can be dry developed by a thermal, plasma (e.g., including possibly photoactivated plasma, such as lamp-heated or UV lamp heated), or a mixture of thermal and plasma methods while flowing a dry development gas including a compound of formula $R_xZ_y$, where R=B, Al, Si, C, S, SO with x>0 and Z=Cl, H, Br, F, $CH_4$ and y>0. The dry development can result in a positive tone, in which the $R_xZ_y$ species selectively removes the exposed material, leaving behind the unexposed counterpart as a mask. In some embodiments, the exposed portions of organotin oxide-based photoresist films are removed by dry development in accordance with this disclosure. Positive tone dry development may be achieved by the selective dry development (removal) of EUV exposed regions exposed to flows comprising hydrogen halides or hydrogen and halides, including HCl and/or HBr without striking a plasma, or flows of $H_2$ and $Cl_2$ and/or $Br_2$ with a remote plasma or UV radiation generated from plasma to generate radicals.

Wet development methods can also be employed. In particular embodiments, such wet developments methods are used to remove EUV exposed regions to provide a positive tone photoresist or a negative tone resist. Exemplary, non-limiting wet development can include use of an alkaline developer (e.g., an aqueous alkaline developer), such as those including ammonium, e.g., ammonium hydroxide ($NH_4OH$); ammonium-based ionic liquids, e.g., tetramethylammonium hydroxide (TMAH), tetraethylammonium hydroxide (TEAH), tetrapropylammonium hydroxide (TPAH), tetrabutylammonium hydroxide (TBAH), or other quaternary alkylammonium hydroxides; an organoamine, such as mono-, di-, and tri-organoamines (e.g., dimethylamine, diethylamine, ethylenediamine, triethylenetetramine); or an alkanolamine, such as monoethanolamine, diethanolamine, triethanolamine, or diethyleneglycolamine. In other embodiments, the alkaline developer can include nitrogen-containing bases, e.g., compounds having the formula $R^{N1}NH_2$, $R^{N1}R^{N2}NH$, $R^{N1}R^{N2}R^{N3}N$ or $R^{N1}R^{N2}R^{N3}R^{N4}N^+X^{N1-}$, where each of $R^{N1}$, and $R^{N2}$, $R^{N3}$, and $R^{N4}$ is, independently, an organo substituent (e.g., optionally substituted alkyl or any described herein), or two or more organo substituents that can be joined together, and $X^{N1-}$ may comprise $OH^-$, $F^-$, $Cl^-$, $Br^-$, $I^-$, or other art-known quaternary ammonium cationic species. These bases may also comprise heterocyclyl nitrogen compounds known in the art, some of which are described herein.

Other development methodologies can include use of an acidic developer (e.g., an aqueous acidic developer or an acid developer in an organic solvent) that includes a halide (e.g., HCl or HBr, an organic acid (e.g., formic acid, acetic acid, or citric acid), or an organofluorine compound (e.g., trifluoroacetic acid); or use of an organic developer, such as a ketone (e.g., 2-heptanone, cyclohexanone, or acetone), an ester (e.g., γ-butyrolactone or ethyl 3-ethoxypropionate (EH)), an alcohol (e.g., isopropyl alcohol (IPA)), or an ether, such as a glycol ether (e.g., propylene glycol methyl ether (PGMF) or propylene glycol methyl ether acetate (PGMEA)), as well as combinations thereof.

In particular embodiments, the positive tone developer is an aqueous alkaline developer (e.g., including $NH_4OH$, TMAH, TEAH, TPAH, or TBAH). In other embodiments, the negative tone developer is an aqueous acidic developer, an acidic developer in an organic solvent, or an organic developer (e.g., HO, HBr, formic acid, trifluoroacetic acid, 2-heptanone, IPA, PGME, PGMEA, or combinations thereof).

Post-Application Processes

The methods herein can include any useful post-application processes, as described below.

For the backside and bevel clean process, the vapor and/or the plasma can be limited to a specific region of the wafer to ensure that only the backside and the bevel are removed, without any film degradation on the frontside of the wafer. The dry-deposited EUV photoresist films being removed are generally composed of Sn, O and C, but the same clean approaches can be extended to films of other metal oxide resists and materials. In addition, this approach can also be used for film strip and PR rework.

Suitable process conditions for a dry bevel edge and backside clean may be a reactant flow of 100 sccm to 500 sccm (e.g., 500 sccm HCl, HBr, or $H_2$ and $Cl_2$ or $Br_2$, $BCl_3$ or $H_2$), temperature of −10° C. to 120° C. (e.g., 20° C.), pressure of 20 mTorr to 500 mTorr (e.g., 300 mTorr), plasma power of 0 to 500 W at high frequency (e.g., 13.56 MHz), and for a time of about 10 sec to 20 sec, dependent on the photoresist film and composition and properties. It should be understood that while these conditions are suitable for some processing reactors, e.g., a Kiyo® etch tool available from Lam Research Corporation, Fremont, Calif., a wider range of process conditions may be used according to the capabilities of the processing reactor.

Photolithography processes typically involve one or more bake steps, to facilitate the chemical reactions required to produce chemical contrast between exposed and unexposed areas of the photoresist. For high volume manufacturing (HVM), such bake steps are typically performed on tracks where the wafers are baked on a hot-plate at a pre-set temperature under ambient air or in some cases $N_2$ flow. More careful control of the bake ambient as well as introduction of additional reactive gas component in the ambient during these bake steps can help further reduce the dose requirement and/or improve pattern fidelity.

According to various aspects of this disclosure, one or more post treatments to metal and/or metal oxide-based photoresists after deposition (e.g., post-application bake (PAB)) and/or exposure (e.g., post-exposure bake (PEB)) and/or development (e.g., post-development bake (PDB)) are capable of increasing material property differences between exposed and unexposed photoresist and therefore decreasing dose to size (DtS), improving PR profile, and improving line edge and width roughness (LER/LWR) after subsequent dry development. Such processing can involve a thermal process with the control of temperature, gas ambient, and moisture, resulting in improved dry development performance in processing to follow. In some instances, a remote plasma might be used.

In the case of post-application processing (e.g., PAB), a thermal process with control of temperature, gas ambient (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum, and moisture can be used after deposition and before exposure to change the composition of unexposed metal and/or metal oxide photoresist. The change can increase the EUV sensitivity of the material and thus lower dose to size and edge roughness can be achieved after exposure and dry development.

In the case of post-exposure processing (e.g., PEB), a thermal process with the control of temperature, gas atmosphere (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum, and moisture can be used to change the composition of both unexposed and exposed photoresist. The change can increase the composition/material properties difference between the unexposed and exposed photoresist and the etch rate difference of dry development etch gas between the unexposed and exposed photoresist. A higher etch selectivity can thereby be achieved. Due to the improved selectivity, a squarer PR profile can be obtained with improved surface roughness, and/or less photoresist residual/scum. In particular embodiments, PEB can be performed in air and in the optional presence of moisture and $CO_2$.

In the case of post-development processing (e.g., post development bake or PDB), a thermal process with the control of temperature, gas atmosphere (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum (e.g., with UV), and moisture can be used to change the composition of the unexposed photoresist. In particular embodiments, the condition also includes use of plasma (e.g., including $O_2$, $O_3$, Ar, He, or their mixtures). The change can increase the hardness of material, which can be beneficial if the film will be used as a resist mask when etching the underlying substrate.

In these cases, in alternative implementations, the thermal process could be replaced by a remote plasma process to increase reactive species to lower the energy barrier for the reaction and increase productivity. Remote plasma can generate more reactive radicals and therefore lower the reaction temperature/time for the treatment, leading to increased productivity.

Accordingly, one or multiple processes may be applied to modify the photoresist itself to increase dry development selectivity. This thermal or radical modification can increase the contrast between unexposed and exposed material and thus increase the selectivity of the subsequent dry development step. The resulting difference between the material properties of unexposed and exposed material can be tuned by adjusting process conditions including temperature, gas flow, moisture, pressure, and/or RF power. The large process latitude enabled by dry development, which is not limited by material solubility in a wet developer solvent, allows more aggressive conditions to be applied further enhancing the material contrast that can be achieved. The resulting high material contrast feeds back a wider process window for dry development and thus enables increased productivity, lower cost, and better defectivity performance.

A substantial limitation of wet-developed resist films is limited temperature bakes. Since wet development relies on material solubility, heating to or beyond 220° C., for example, can greatly increase the degree of cross-linking in both exposed and unexposed regions of a metal-containing PR film such that both become insoluble in the wet development solvents, so that the film can no longer by reliably wet developed. For dry-developed resist films, in which the etch rate difference (i.e., selectivity) between the exposed and unexposed regions of the PR is relied upon for removal of just the exposed or unexposed portion of the resist, the treatment temperature in a PAB, PEB, or PDB can be varied across a much broader window to tune and optimize the treatment process, for example from about 90° C. to 250° C., such as 90° C. to 190° C., for PAB, and about 170° C. to 250° C. or more, such as 190° C. to 240° C., for PEB and/or PDB. Decreasing etch rate and greater etch selectivity has been found to occur with higher treatment temperatures in the noted ranges.

In particular embodiments, the PAB, PEB, and/or PDB treatments may be conducted with gas ambient flow in the range of 100 sccm to 10000 sccm, moisture content in the amount of a few percent up to 100% (e.g., 20%-50%), at a pressure between atmospheric and vacuum, and for a duration of about 1 to 15 minutes, for example about 2 minutes.

These findings can be used to tune the treatment conditions to tailor or optimize processing for particular materials and circumstances. For example, the selectivity achieved for a given EUV dose with a 220° C. to 250° C. PEB thermal treatment in air at about 20% humidity for about 2 minutes can be made similar to that for about a 30% higher EUV dose with no such thermal treatment. So, depending on the selectivity requirements/constraints of the semiconductor processing operation, a thermal treatment such as described herein can be used to lower the EUV dose needed. Or, if higher selectivity is required and higher dose can be tolerated, much higher selectivity, up to 100 times exposed vs. unexposed, can be obtained than would be possible in a wet development context.

Yet other steps can include in situ metrology, in which physical and structural characteristics (e.g., critical dimension, film thickness, etc.) can be assessed during the photolithography process. Modules to implement in situ metrology include, e.g., scatterometry, ellipsometry, downstream mass spectroscopy, and/or plasma enhanced downstream optical emission spectroscopy modules.

Apparatus

The present disclosure also includes airy apparatus configured to perform any methods described herein. In one embodiment, the apparatus for depositing a film includes a deposition module comprising a chamber for depositing one or more precursor(s) to provide an underlayer and/or an imaging layer; a patterning module comprising an EUV photolithography tool with a source of sub-30 nm wavelength radiation; and a development module comprising a chamber for developing a film including such layers.

The apparatus can further include a controller having instructions for such modules. In one embodiment, the controller includes one or more memory devices, one or more processors, and system control software coded with instructions for conducting deposition of the film. Such includes can include for, in the deposition module, depositing one or more precursor(s) to provide an underlayer and/or an imaging layer; in the patterning module, patterning the layer(s) with sub-30 nm resolution directly by EUV exposure, thereby forming a pattern within the film; and in the development module, developing the film. In particular embodiments, the development module provides for removal of the EUV exposed or EUV unexposed area(s), thereby providing a pattern within the film.

Figure 8:
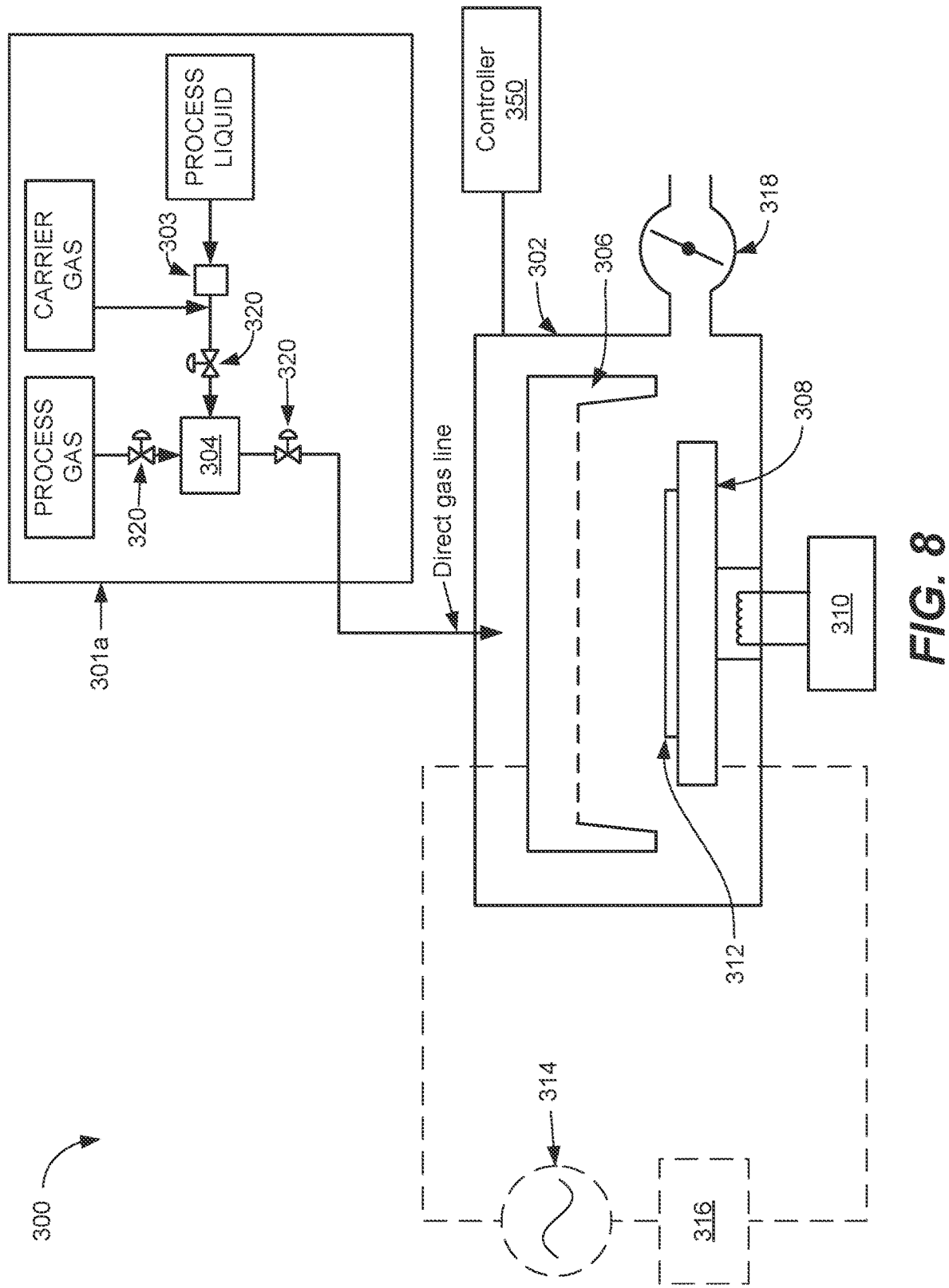
FIG. 8 presents a schematic illustration of an embodiment of a process station 300 for dry development.
Figure 9:
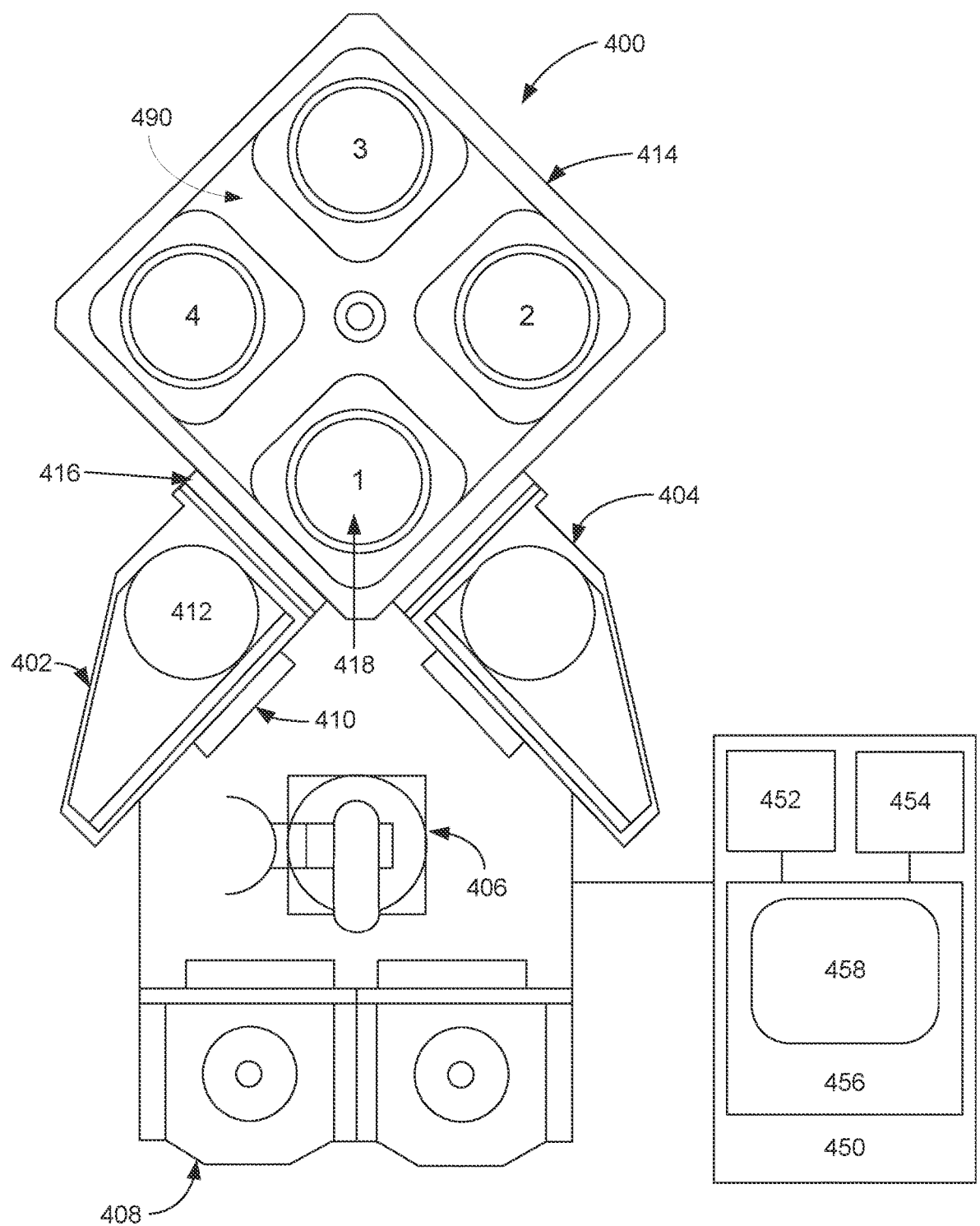
FIG. 9 presents a schematic illustration of an embodiment of a multi-station processing tool 400.

FIG. 8 depicts a schematic illustration of an embodiment of process station 300 having a process chamber body 302 for maintaining a low-pressure environment that is suitable for implementation of described vapor deposition and dry development embodiments as described herein. A plurality of process stations 300 may be included in a common low-pressure process tool environment. For example, FIG. 9 depicts an embodiment of a multi-station processing tool 400, such as a VECTOR® processing tool available from Lam Research Corporation, Fremont, Calif. in some embodiments, one or more hardware parameters of the process station 300 including those discussed in detail below may be adjusted programmatically by one or more computer controllers 350.

A process station may be configured as a module in a cluster tool. FIG. 11 depicts a semiconductor process cluster tool architecture with vacuum-integrated deposition and patterning modules suitable for implementation of the embodiments described herein. Such a cluster process tool architecture can include PR and underlayer deposition, resist exposure (EUV scanner), resist dry development and etch modules, as described above and further below with reference to FIGS. 10-11.

In some embodiments, certain of the processing functions can be performed consecutively in the same module, for example vapor deposition (e.g., PECVD), dry development and etch. And embodiments of this disclosure are directed to apparatus for processing a substrate, the apparatus having a process chamber comprising a substrate support, a process gas source connected with the process chamber and associated flow-control hardware, substrate handling hardware connected with the process chamber, and a controller having a processor and a memory. In some implementations, the processor and the memory are communicatively connected with one another, the processor is at least operatively connected with the flow-control and substrate handling hardware, and the memory stores computer-executable instructions for conducting the operations in the methods of making a patterning structure described herein.

For example, the memory may store computer-executable instructions for providing a hardmask disposed on a substrate, for example by chemical vapor deposition (e.g., PECVD). As described above, suitable hardmasks may be amorphous carbon ashable hardmask films, undoped or doped with B or W, for example.

The memory may further store instructions for depositing an underlayer on the substrate and/or the hardmask, where the underlayer is configured to increase adhesion between the substrate and/or the hardmask and a subsequently formed EUV-sensitive inorganic photoresist, and to reduce ELY dose for effective EUV exposure of the photoresist. For example, as described above the underlayer may be or include a vapor deposited film of hydrogenated carbon doped with a non-carbon heteroatom (e.g., any herein, such as O, Si, N, W, B, I, Cl, etc.), the film having a thickness of no more than about 25 nm, and may include about 0-30% 0. In some implementations, the underlayer may be vapor deposited on the substrate and/or the hardmask by PECVD or ALD using a hydrocarbon precursor and/or a dopant precursor. In other implementations, the underlayer may be vapor deposited on the substrate and/or the hardmask by PECVD or ALD using an oxocarbon precursor that co-reacts with $H_2$ or a hydrocarbon. In variations on this implementation, the oxocarbon precursor may further co-react with a Si source dopant during the deposition. In other implementations, the underlayer may be vapor deposited on the substrate and/or the hardmask by PECVD or ALD using a Si-containing precursor that co-reacts with an oxidizer (e.g., any O-containing precursor described herein). In variations on this implementation, the Si-containing precursor further co-reacts with a C source dopant. In some implementations, the underlayer may be vapor deposited on the substrate and/or the hardmask by PECVD as a termination operation of a vapor deposition on the substrate or vapor deposition of the hardmask on the substrate, for example by adjusting the precursor flows entering the PECVD process chamber to achieve the desired composition of the underlayer.

The memory may further store instructions for forming an EUV-sensitive inorganic photoresist is formed on the photoresist underlayer. A suitable EUV-sensitive inorganic photoresist may be a metal oxide film, such as a EUV-sensitive tin oxide-based photoresist, such as described above.

Returning to FIG. 8, process station 300 fluidly communicates with reactant delivery system 301a for delivering process gases to a distribution showerhead 306. Reactant delivery system 301a optionally includes a mixing vessel 304 for blending and/or conditioning process gases, for delivery to showerhead 306. One or more mixing vessel inlet valves 320 may control introduction of process gases to mixing vessel 304. Where plasma exposure is used, plasma may also be delivered to the showerhead 306 or may be generated in the process station 300. As noted above, in at least some embodiments, non-plasma thermal exposure is favored.

FIG. 8 includes an optional vaporization point 303 for vaporizing liquid reactant to be supplied to the mixing vessel 304. In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 306 distributes process gases toward substrate 312. In the embodiment shown in FIG. 8, the substrate 312 is located beneath showerhead 306 and is shown resting on a pedestal 308. Showerhead 306 may have any suitable shape and may have any suitable number and arrangement of ports for distributing process gases to substrate 312.

In some embodiments, pedestal 308 may be raised or lowered to expose substrate 312 to a volume between the substrate 312 and the showerhead 306. It will be appreciated that, in some embodiments, pedestal height may be adjusted programmatically by a suitable computer controller 350.

In some embodiments, pedestal 308 may be temperature controlled via heater 310. In some embodiments, the pedestal 308 may be heated to a temperature of greater than 0° C. and up to 300° C. or more, for example 50 to 120° C., such as about 65 to 80° C., during non-plasma thermal exposure of a photopatterned resist to hydrogen halide dry development chemistry, such as HBr or HCl.

Further, in some embodiments, pressure control for process station 300 may be provided by a butterfly valve 318. As shown in the embodiment of FIG. 8, butterfly valve 318 throttles a vacuum provided by a downstream vacuum pump (not shown). However, in some embodiments, pressure control of process station 300 may also be adjusted by varying a flow rate of one or more gases introduced to the process station 300.

In some embodiments, a position of showerhead 306 may be adjusted relative to pedestal 308 to vary a volume between the substrate 312 and the showerhead 306. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

Where plasma may be used, for example in gentle plasma-based dry development embodiments and/or etch operations conducted in the same chamber, showerhead 306 and pedestal 308 electrically communicate with a RF power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are up to about 500 W. Likewise, RF power supply 314 may provide RF power of any suitable frequency. In some embodiments, RF power supply 314 may be configured to control high- and low-frequency RF power sources independently of one another. Examples of low-frequency RF frequencies may include, but are not limited to, frequencies between 50 kHz and 1000 kHz. Examples of high-frequency RF frequencies may include, but are not limited to, frequencies between 1.8 MHz and 2.45 GHz (e.g., about 13.56 MHz). It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas. The RF power supply may be operated at any suitable duty cycle. Examples of suitable duty cycles include, but are not limited to, duty cycles of between about 5% and 90%. Acceptable process pressures are between about 20 mTorr to 5 Torr.

In some examples, RF power can be continuous or pulsed between one or more levels. If pulsed operation is used, pulsing can be performed at a frequency in a range from 1 Hz to 1 MHz. In some examples, chamber pressure is maintained at a predetermined pressure in a range from 5 mTorr to 450 mTorr. In other examples, deposition and treatment are performed at a pressure in a range from 5 mTorr to 150 mTorr. In still other examples, deposition and treatment are performed at a pressure in a range from 5 mTorr to 35 mTorr.

In some deposition processes, plasma strikes last on the order of a few seconds or more in duration. In certain implementations, much shorter plasma strikes may be used. These may be on the order of 10 ms to 1 second, typically, about 20 to 80 ins, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a photoresist underlayer oxocarbon precursor and $H_2$ or hydrocarbon co-reactants and optional dopants. In some embodiments, the controller 350 may include any of the features described below with respect to system controller 450 of FIG. 9.

As described above, one or more process stations may be included in a multi station processing tool. FIG. 9 shows a schematic view of an embodiment of a multi station processing tool 400 with an inbound load lock 402 and an outbound load lock 404, either or both of which may include a remote plasma source. A robot 406 at atmospheric pressure is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment to treat a surface in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the water into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 414 includes four process stations, numbered from 1 to 4 in the embodiment shown in FIG. 9, Each station has a heated pedestal (shown at 418 for station 1), and gas line inlets. It will be appreciated that in some embodiments, each process station may have different or multiple purposes. For example, in some embodiments, a process station may be switchable between dry development and etch process modes. Additionally, or alternatively, in some embodiments, processing chamber 414 may include one or more matched pairs of dry development and etch process stations. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 depicts an embodiment of a wafer handling system 490 for transferring, wafers within the processing, chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 450 employed to control process conditions and hardware states of process tool 400, System controller 450 may include one or more memory devices 456, one or more mass storage devices 454, and one or more processors 452. Processor 452 may include a CPU or computer, analog, and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, water temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling hydrogen halide gas composition (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by the system controller 450 may relate to process conditions. Non-limiting examples include process gas composition and flow rates, temperature, pressure, plasma conditions (such as RF bias power levels, frequency, and exposure time), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing above-described deposition processes. The program instructions may control a variety of process parameters, such as direct current (DC) power level, RF bias power level, pressure, temperature, etc. The instructions may control the parameters to operate photoresist underlayer deposition processes according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (PSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus, as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 10:
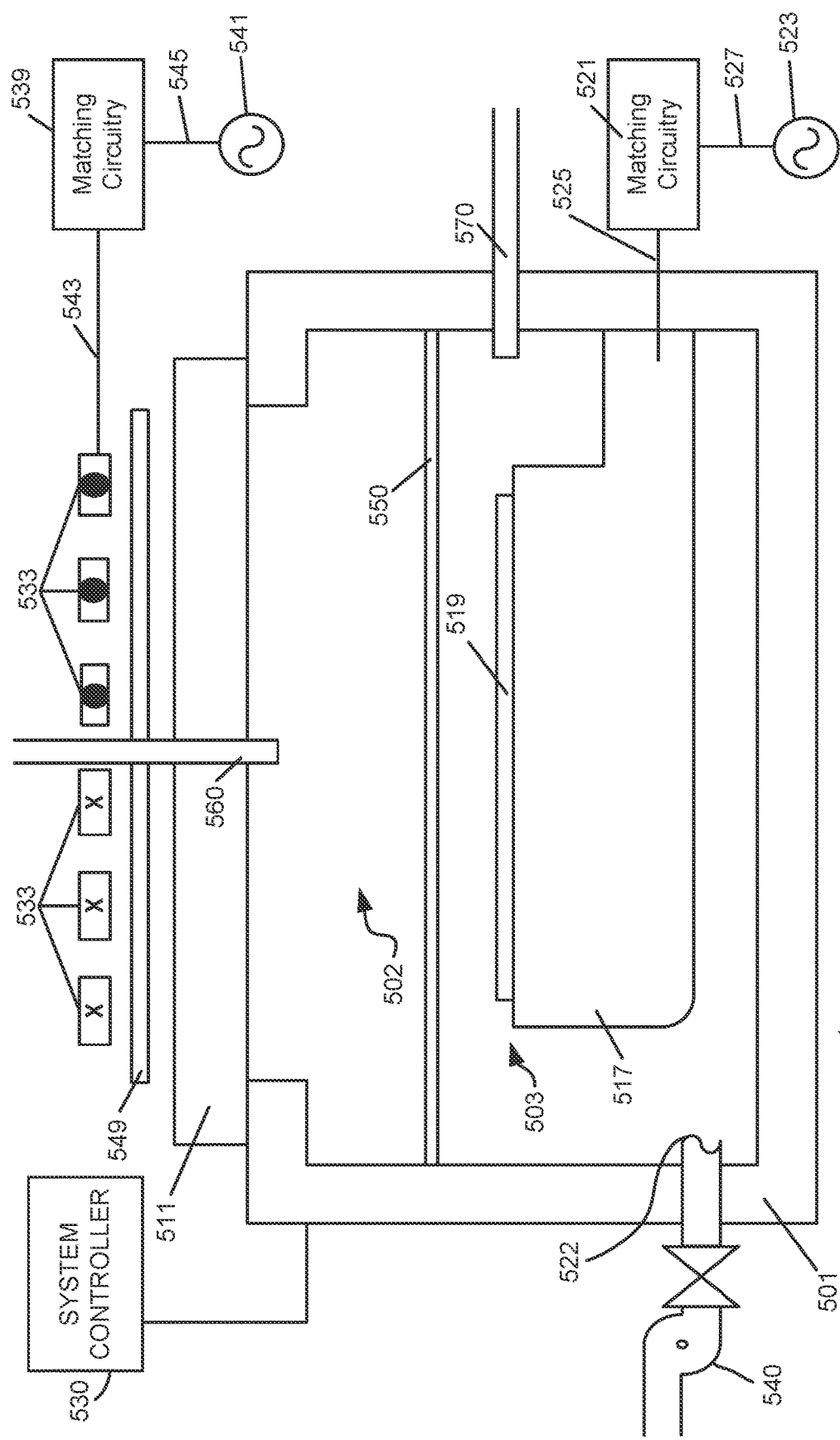
FIG. 10 presents a schematic illustration of an embodiment of an inductively coupled plasma apparatus 500.
Figure 11:
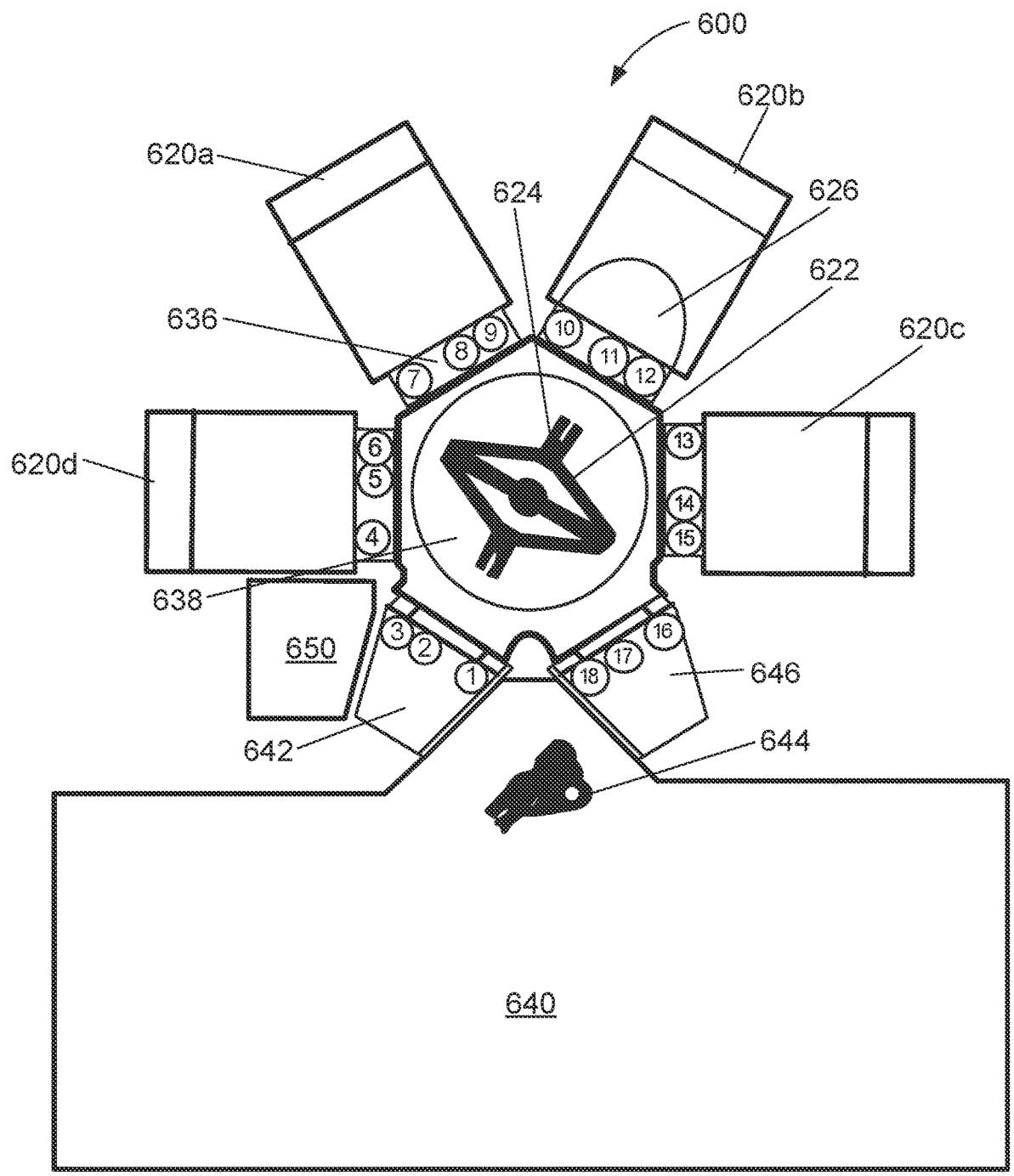
FIG. 11 presents a schematic illustration of an embodiment of a semiconductor process cluster tool architecture 600.

FIG. 10 schematically shows a cross-sectional view of an inductively coupled plasma apparatus 500 appropriate for implementing certain embodiments or aspects of embodiments such as vapor (dry) deposition, dry development and/or etch, an example of which is a Kiyo® reactor, produced by Lam Research Corp. of Fremont, Calif. In other embodiments, other tools or tool types having the functionality to conduct the dry deposition, development and/or etch processes described herein may be used for implementation.

The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber into an upper sub-chamber 502 and a lower sub chamber 503. In most embodiments, plasma grid 550 may be removed, thereby utilizing a chamber space made of sub chambers 502 and 503. A chuck 517 is positioned within the lower sub-chamber 503 near the bottom inner surface. The chuck 517 is configured to receive and hold a semiconductor wafer 519 upon which the etching and deposition processes are performed. The chuck 517 can be an electrostatic chuck for supporting the wafer 519 when present. In some embodiments, an edge ring (not shown) surrounds chuck 517 and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517. In various embodiments, a bias power of the electrostatic chuck may be set at about 50V or may be set at a different bias power depending on the process performed in accordance with disclosed embodiments. For example, the bias power may be between about 20 V and about 100 V, or between about 30 V and about 150 V.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 10 includes three turns. The cross sections of coil 533 are shown with symbols, and coils having an "X" extend rotationally into the page, while coils having a "•" extend rotationally out of the page. Elements for plasma generation also include an RF power supply 541 configured to supply RF power to the coil 533. In general, the RE power supply 541 is connected to matching circuitry 539 through a connection 545. The matching circuitry 539 is connected to the coil 533 through a connection 543. In this manner, the RF power supply 541 is connected to the coil 533. An optional Faraday shield 549a is positioned between the coil 533 and the window 511. The Faraday shield 549a may be maintained in a spaced apart relationship relative to the coil 533. In some embodiments, the Faraday shield 549a is disposed immediately above the window 511. In some embodiments, the Faraday shield 549b is between the window 511 and the chuck 517. In some embodiments, the Faraday shield 549b is not maintained in a spaced apart relationship relative to the coil 533. For example, the Faraday shield 549b may be directly below the window 511 without a gap. The coil 533, the Faraday shield 549a, and the window 511 are each configured to be substantially parallel to one another. The Faraday shield 549a may prevent metal or other species from depositing on the window 511 of the process chamber 524.

Process gases may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 524 and to maintain a pressure within the process chamber 524. For example, the vacuum pump may be used to evacuate the lower sub-chamber 503 during a purge operation of ALD. A valve-controlled conduit may be used to fluidically connect the vacuum pump to the process chamber 524 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549a and/or optional grid 550 may include internal channels and holes that allow delivery of process gases to the process chamber 524. Either or both of Faraday shield 549a and optional grid 550 may serve as a showerhead for delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and selectively deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus, as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (e.g., PECVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWIN-SCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 11 depicts a semiconductor process cluster tool architecture 600 with vacuum-integrated deposition, EUV patterning and dry development/ etch modules that interface with a vacuum transfer module, suitable for implementation of the processes described herein. While the processes may be conducted without such vacuum integrated apparatus, such apparatus may be advantageous in some implementations.

FIG. 11 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 638 interfaces with four processing modules 620a-620d, which may be individually optimized to perform various fabrication processes. By way of example, processing modules 620a-620d may be implemented to perform deposition, evaporation, ELD, dry development, etch, strip, and/or other semiconductor processes. For example, module 620a may be an ALD reactor that may be operated to perform in a non-plasma, thermal atomic layer depositions as described herein, such as Vector tool, available from Lam Research Corporation, Fremont, Calif. And module 620b may be a PECVD tool, such as the Lam Vector®. It should be understood that the figure is not necessarily drawn to scale.

Airlocks 642 and 646, also known as a loadlocks or transfer modules, interface with the VIM 638 and a patterning module 640. For example, as noted above, a suitable patterning module may be the TWINSCAN NXE: 3300B® platform supplied by ASH of Veldhoven, NL): This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 11 but without the integrated patterning module.

Airlock 642 may be an "outgoing" loadlock, referring to the transfer of a substrate out from the VTM 638 serving a deposition module 620a to the patterning module 640, and airlock 646 may be an "ingoing" loadlock, referring to the transfer of a substrate from the patterning module 640 back in to the VTM 638. The ingoing loadlock 646 may also provide an interface to the exterior of the tool for access and egress of substrates. Each process module has a facet that interfaces the module to VIM 638. For example, deposition process module 620a has facet 636. Inside each facet, sensors, for example, sensors 1-18 as shown, are used to detect the passing of wafer 626 when moved between respective stations. Patterning module 640 and airlocks 642 and 646 may be similarly equipped with additional facets and sensors, not shown.

Main VTM robot 622 transfers wafer 626 between modules, including airlocks 642 and 646. In one embodiment, robot 622 has one arm, and in another embodiment, robot 622 has two arms, where each arm has an end effector 624 to pick wafers such as wafer 626 for transport. Front-end robot 644, in is used to transfer wafers 626 from outgoing airlock 642 into the patterning module 640, from the patterning module 640 into ingoing airlock 646. Front-end robot 644 may also transport wafers 626 between the ingoing loadlock and the exterior of the tool for access and egress of substrates. Because ingoing airlock module 646 has the ability to match the environment between atmospheric and vacuum, the wafer 626 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 642 may provide this function by holding the transferred wafers at a lower pressure, no higher than the pressure in the patterning module 640, for a period of time and exhausting any off-gassing, so that the optics of the patterning tool 640 are not contaminated by off-gassing from the substrate. A suitable pressure for the outgoing, off-gassing airlock is no more than 1E-8 Torr.

In some embodiments, a system controller 650 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture or can be located external to the cluster architecture in the manufacturing floor, or in a remote location and connected to the cluster architecture via a network. A controller as described above with respect to any of FIG. 8, 9, or 10 may be implemented with the tool in FIG. 11.

Figure 12:
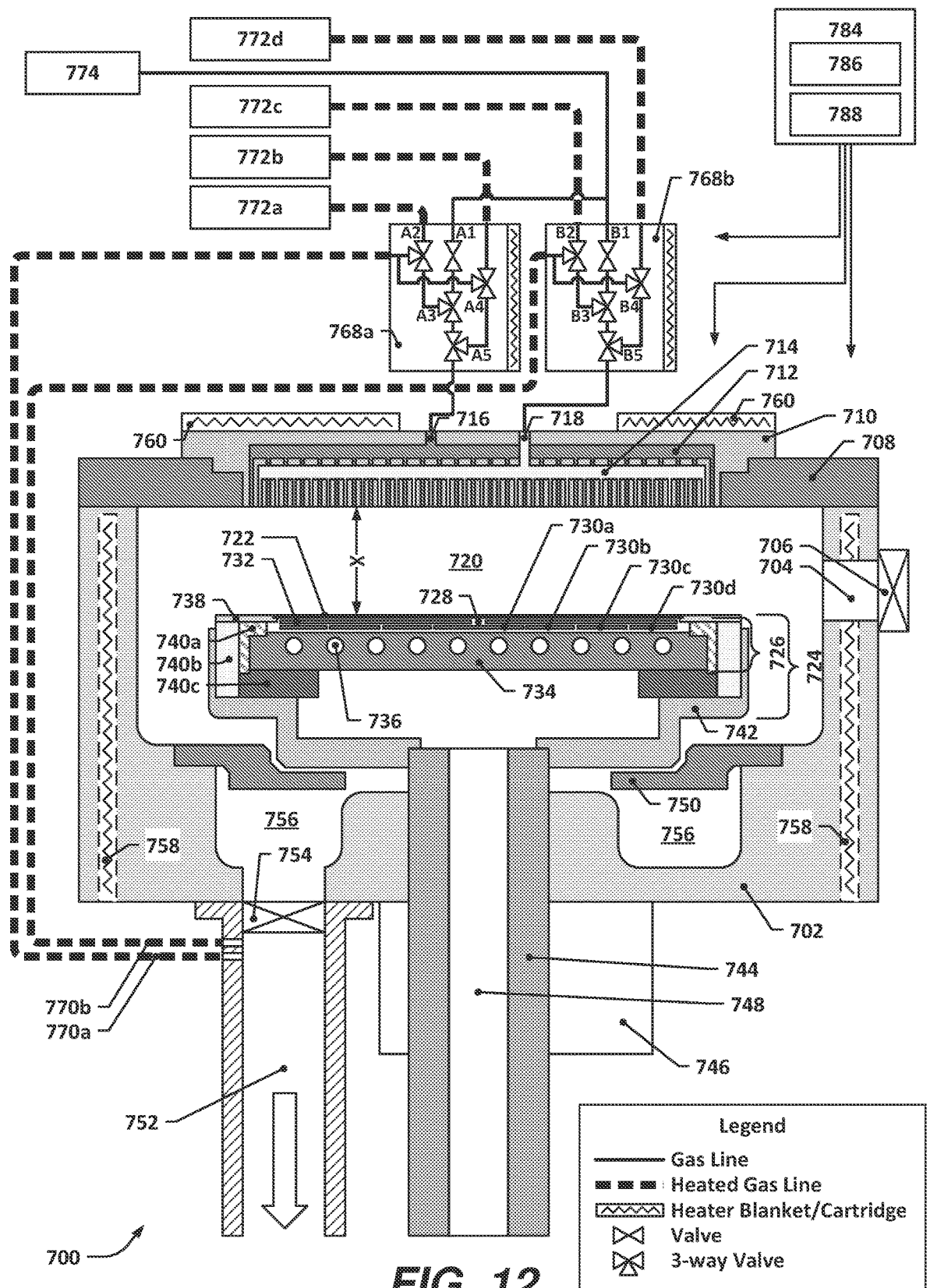
FIG. 12 depicts a cross-sectional schematic view of an example of a dry deposition apparatus 700.

FIG. 12 shows an example of a deposition chamber (e.g., for vapor-based deposition, such as for an imaging layer and/or an under layer). As can be seen, the apparatus 700 includes a processing chamber 702 having a lid 708 and a wafer transfer passage 704, which is sized to allow a substrate 722 to be passed therethrough and to be placed on a wafer support 724. The wafer transfer passage 704 may have a gate valve 706 or similar door mechanism that may be operated to seal or unseal the wafer transfer passage. For example, the processing chamber 702 may be provided substrates 722 via a wafer handling robot that is located in an adjoining transfer chamber.

The wafer support 724 may include an ESC 726 to provide a wafer support surface for the substrate 722, The ESC 726 may include a base plate 734 that is bonded to a top surface of the top plate 728. In the depicted example, the top plate 728 has two separate electrical systems embedded within it. One such system is an electrostatic clamping electrode system having one or more clamping electrodes 732 to generate an electric charge within the substrate 722 that causes the substrate 722 to be drawn against the wafer support surface of the top plate 728.

The other system is a thermal control system to control the temperature of the substrate 722 during processing conditions. In FIG. 12, the thermal control system features four annular resistance heater traces 730a, 730h, 730c, and 730d positioned beneath the clamping electrodes 732. Each resistance heater trace 730a/b/c/d may be individually controlled to provide a variety of radial heating profiles in the top plate 728, for example, to maintain the substrate 722 so as to have a temperature uniformity of ±0.5° C. in some cases. Other implementations may use single-zone or multi-zone heating systems having more or fewer than four zones. In some implementations, of, for example, temperature control mechanisms discussed above, heat pumps or Peltier junctions may be used instead of resistance heating traces.

The ESC 726 may also include a base plate 734 to provide structural support to the underside of the top plate 728 and which may also act as a heat dispersion system. For example, the base plate 734 may include one or more heat exchange passages 736; and a heat exchange medium, e.g., water or inert fluorinated liquid, may be circulated through the heat exchange passages 736 during use.

The ESC 726 may be supported by a wafer support housing 742 that is connected with, and supported by, a wafer support column 744. The wafer support column 744 may have a routing passage 748 other pass-throughs for routing cabling (e.g., for providing electrical power), fluid flow conduits (e.g., for conveying heat exchange medium), and other equipment to the underside of the base plate 734 and/or the top plate 728.

The apparatus 700 of FIG. 12 also includes a wafer support z-actuator 746 that may provide movable support to the wafer support column 744. The wafer support z-actuator 746 may be actuated to cause the wafer support column 744, and the wafer support 724 supported thereby, to move up or down vertically, e.g., by up to several inches, within a reaction space 720 of the processing chamber 702. In doing so, a gap distance X between the substrate 722 and the underside of the showerhead 710 may be tuned depending on various process conditions.

The wafer support 724 may also include one or more edge rings that may be used to control and/or fine-tune various process conditions. In FIG. 12, an upper edge ring 738 is provided that lies on top of, for example, lower edge rings 740a and 740b, which, in turn, are supported by the wafer support housing 742 and a third lower edge ring 740c.

The apparatus 700 may also include a system for removing process gases from the processing chamber 702 during and after processing concludes. For example, the processing chamber 702 may include an annular plenum 756 that encircles the wafer support column 744. The annular plenum 756 may, in turn, be fluidically connected with a vacuum foreline 752 that may be connected with a vacuum pump. A regulator valve 754 may be provided in between the vacuum foreline 752 and the processing chamber 702 and actuated to control the flow into the vacuum foreline 752, In some implementations, a baffle 750, e.g., an annular plate or other structure that may serve to make the flow into the annular plenum 756 more evenly distributed about the circumference of the wafer support column 744, may be provided to reduce the chances of flow non-uniformities developing in reactants flowed across the substrate 722.

The showerhead 710, as shown, is a dual-plenum showerhead 710 and includes a first plenum 712 that is provided process gas via a first inlet 716 and a second plenum 714 that is provided process gas via a second inlet 718. Two or more plenums can be employed to maintain separation between the precursor(s) and the counter-reactant(s) prior to release of the precursor and the counter-reactant. In some instances, a single plenum is used to deliver the precursor(s) into the reaction space 720 of the processing chamber 702. Each plenum may have a corresponding set of gas distribution ports that fluidically connect the respective plenum with the reaction space 720 through the faceplate of the showerhead 710 (the faceplate being the portion of the showerhead 710 that is interposed between the lowermost plenum and the reaction space 720).

The first inlet 716 and the second inlet 718 of the showerhead 710 may be provided processing gases via a gas supply system, which may be configured to provide one or more precursor(s) and/or counter-reactant(s), as discussed herein. A first valve manifold 768a may be configured to provide one or more precursor(s) to the first inlet 716, while a second valve manifold 768b may be configured to provide other precursor(s) or other reactant to the second inlet 718. In this example, the first valve manifold 768a, for example, includes multiple valves A1-A5. Valve A2 may, for example, be a three-way valve that has one port fluidically connected with a first vaporizer 772a, another port fluidically connected with a bypass line 770a, and a third port fluidically connected with a port on another 3-way valve A3. Similarly, valve A4 may be another three-way valve that has one port fluidically connected with a second vaporizer 772h, another port fluidically connected with the bypass line 770a, and a third port fluidically connected with a port on another 3-way valve A5. One of the other ports on valve A5 may be fluidically connected with the first inlet 716 while the remaining port on valve A5 may be fluidically connected with one of the remaining ports on the valve A3. The remaining port on the valve A3 may, in turn, be fluidically connected with the valve A1 which may be fluidically interposed between the valve A3 and a purge gas source 774, e.g., nitrogen, argon, or other suitably inert gas (with respect to precursor(s) and/or counter-reactant(s)). In some embodiments, only the first valve manifold is employed.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

The first valve manifold 768a may, for example, be controllable to cause vapors from one or both of the vaporizers 772a and 772b to be flowed either to the processing chamber 702 or through the first bypass line 770a and into the vacuum foreline 752, such as by controlled actuation of valves A1-A5. The first valve manifold 768a may also be controllable to cause a purge gas to be flowed from the purge gas source 774 and into the first inlet 716.

It will be appreciated that the second valve manifold 768b may be controlled in a similar manner, e.g., by controlling valves B1-B5, to provide vapors from vaporizers 772c and 772d to the second inlet 718 or to the second bypass line 770b. It will be further appreciated that different manifold arrangements may be utilized as well, including a single unitary manifold that includes valves for controlling flow of the precursor(s), counter-reactant(s), or other reactants to the first inlet 716 and the second inlet 718.

As mentioned earlier, some apparatuses 700 may feature a lesser number of vapor sources, e.g., only two vaporizers 772, in which case the valve manifold(s) 768 may be modified to have a lesser number of valves, e.g., only valves A1-A3.

As discussed above, apparatuses such as apparatus 700, which may be used to provide for dry deposition of films, may be configured to maintain particular temperature profiles within the processing chamber 702, In particular, such apparatuses 700 may be configured to maintain the substrate 722 at a lower temperature, e.g., at least 25° C. to 50° C. lower, than most of the equipment of the apparatus 702 that comes into direct contact with the precursor(s) and/or counter-reactant(s).

To provide for temperature control, various heating systems may be included in the apparatus 700. For example, the processing chamber 702 may have receptacles for receiving cartridge heaters 758, e.g., vertical holes for receiving cartridge heaters 758 may be bored into the four corners of the chamber 702 housing. In some implementations, the showerhead 710 may be covered with heater blankets 760, which may be used to apply heat across the exposed upper surface of the showerhead 710 to keep the showerhead temperature elevated. It may also be beneficial to heat various gas lines that are used to conduct the vaporized reactants from the vaporizers 772 to the showerhead 710. For example, resistive heater tape may be wound around such gas lines and used to heat them to an elevated temperature. Any of the gas lines and even the fate valve 706 in FIG. 12 can be actively or indirectly heated.

The various operational systems of the apparatus 700 may be controlled by a controller 784, which may include one or more processors 786 and one or more memory devices 788 that are operatively connected with each other and that are communicatively connected with various systems and subsystems of the apparatus 700 so as to provide for control functionality for those systems. For example, the controller 784 may be configured to control the valves A1-A5 and B1-B5, the various heaters 758, 760, the vaporizers 772, the regulator valve 754, the gate valve 706, the wafer support z-actuator, and so forth.

Figure 13:
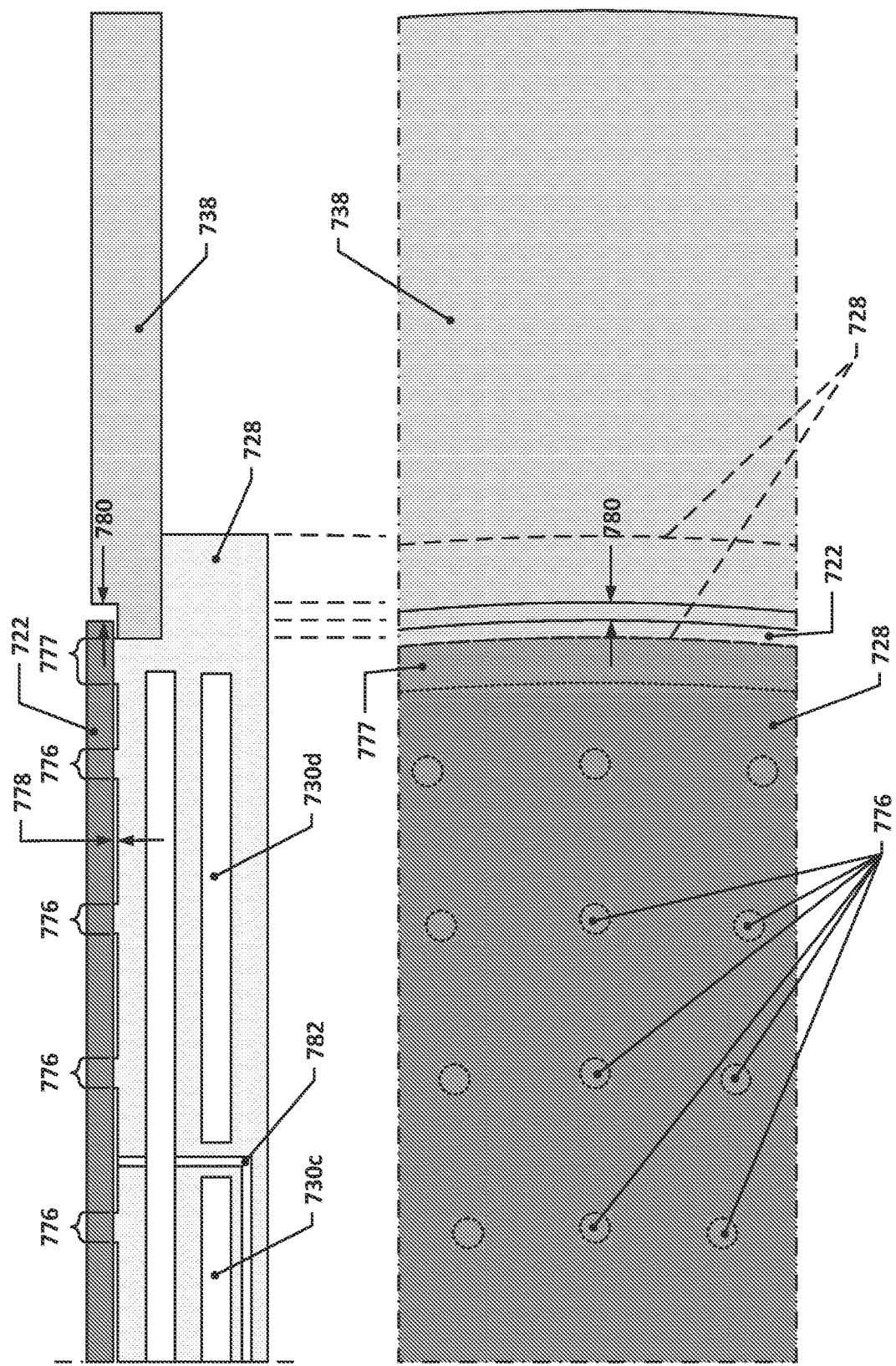
FIG. 13 depicts detail side section and plan views of a portion of a top plate, substrate, and edge ring.

Another feature that the apparatus 700 may include is shown in FIG. 13, which depicts close-up side cross-sectional and plan views of a portion of the substrate 722, top plate 728, and upper edge ring 738 of FIG. 12. As can be seen, in some implementations, the substrate 722 may be elevated off of most of the top plate 728 by a plurality of small mesas 776, which may be shallow bosses that protrude from the nominal upper surface of the top plate 728 by a small distance so as to provide for a backside gap 778 between the underside of the substrate 722 and the majority of the top plate 728. A circumferential wall feature 777 may be provided at the periphery of the top plate 728. The circumferential wall feature 777 may extend around the entire perimeter of the top plate 728 and be of nominally the same height as the mesas 776. During processing operations, a generally inert gas, such as helium, may be flowed into the backside gap 778 via one or more gas ports 782. This gas may then flow radially outward before encountering the circumferential wall feature 777, which way then restrict such radially outward flow and cause a higher-pressure region of the gas to be trapped between the substrate 722 and the top plate 728. The inert gas that leaks past the circumferential wall 777 may eventually flow out through a radial gap 780 between the outer edge of the substrate 722 and a portion of the upper edge ring 738. Such gas may serve to protect the underside of the substrate from undesirably being affected by the processing operations being performed by acting to prevent the gases released by the showerhead 710 from reaching the underside of the substrate 722. At the same time, the gas released into the backside gap 778 region may also act to increase thermal coupling between the substrate 722 and the top plate 728, thereby allowing the top plate 728 to more effectively heat or cool the substrate 722. Due to the higher pressure provided by the circumferential wall, the gas that is within the backside gap 778 region may also be at a higher density than gas in the remainder of the chamber, and may thus provide more effective thermal coupling between the substrate 722 and the top plate 728.

The controller 784 may be configured, e.g., via execution of computer-executable instructions, to cause the apparatus 700 to perform various operations consistent with the disclosure provided above.

Once the imaging layer and/or underlayer has been deposited on the substrate 722, the substrate 722 may, as noted above, be transferred to one or more subsequent processing chambers or tool for additional operations (e.g., any described herein). Further deposition apparatuses are described in International Patent Application No. PCT/US2020/038968, filed Jun. 22, 2020, titled "APPARATUS FOR PHOTORESIST DRY DEPOSITION," which is herein incorporated by reference in its entirety.

Definitions

By "acyloxy" or "alkanoyloxy," as used interchangeably herein, is meant an acyl or alkanoyl group, as defined herein, attached to the parent molecular group through an oxy group. In particular embodiments, the alkanoyloxy is —O—C(O)-Ak, in which Ak is an alkyl group, as defined herein. In some embodiments, an unsubstituted alkanoyloxy is a $C_{2-7}$ alkanoyloxy group. Exemplary alkanoyloxy groups include acetoxy.

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. Such an aliphatic can be unsubstituted or substituted with one or more groups, such as groups described herein for an alkyl group.

By "alkenyl" is meant an optionally substituted $C_{2-24}$ alkyl group having one or more double bonds. The alkenyl group can be cyclic (e.g., $C_{3-24}$ cycloalkenyl) or acyclic. The alkenyl group can also be substituted or unsubstituted. For example, the alkenyl group can be substituted with one or more substitution groups, as described herein for alkyl.

By "alkenylene" is meant a multivalent (e.g., bivalent) form of an alkenyl group, which is an optionally substituted $C_2$-24 alkyl group having one or more double bonds. The alkenylene group can be cyclic (e.g., $C_{3-24}$ cycloalkenyl) or acyclic. The alkenylene group can be substituted or unsubstituted. For example, the alkenylene group can be substituted with one or more substitution groups, as described herein for alkyl. Exemplary, non-limiting alkenylene groups include —CH=CH— or —CH=CHCH$_2$—.

By "alkoxy" is meant —OR, where R is an optionally substituted alkyl group, as described herein, Exemplary alkoxy groups include methoxy, ethoxy, butoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

By "alkyl" and the prefix "alk" is meant a branched or unbranched saturated hydrocarbon group of 1 to 24 carbon atoms, such as methyl (Me), ethyl (Et), n-propyl (n-Pr), isopropyl (i-Pr), cyclopropyl, n-butyl (n-Bu), isobutyl (i-Bu), s-butyl (s-Bu), (t-Bu), cyclobutyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic (e.g., $C_{3-24}$ cycloalkyl) or acyclic. The alkyl group can be branched or unbranched. The alkyl group can also be substituted or unsubstituted. For example, the alkyl group can include haloalkyl, in which the alkyl group is substituted by one or more halo groups, as described herein. In another example, the alkyl group can be substituted with one, two, three or, in the case of alkyl groups of two carbons or more, four substituents independently selected from the group consisting of: (1) $C_{1-6}$ alkoxy (e.g., —O-Ak, wherein Ak is optionally substituted $C_{1-6}$ alkyl); (2) amino (e.g., —NR$^{N1}$R$^{N2}$, where each of R$^{N1}$ and R$^{N2}$ is, independently, H or optionally substituted alkyl, or R$^{N1}$ and R$^{N2}$, taken together with the nitrogen atom to which each are attached, form a heterocyclyl group); (3) aryl; (4) arylalkoxy (e.g., —O-Lk-Ar, wherein Lk is a bivalent form of optionally substituted alkyl and Ar is optionally substituted aryl); (5) aryloyl (e.g., —C(O)—Ar, wherein Ar is optionally substituted aryl); (6) cyano (e.g., —CN); (7) carboxyaldehyde (e.g., —C(O)H); (8) carboxyl (e.g., —CO$_2$H); (9) $C_{3-8}$ cycloalkyl (e.g., a monovalent saturated or unsaturated non-aromatic cyclic $C_{3-8}$ hydrocarbon group); (10) halo (e.g., F, Cl, Br, or I); (11) heterocyclyl (e.g., a 5-, 6- or 7-membered ring, unless otherwise specified, containing one, two, three, or four non-carbon heteroatoms, such as nitrogen, oxygen, phosphorous, sulfur, or halo); (12) heterocyclyloxy (e.g., —O-Het, wherein Het is heterocyclyl, as described herein); (13) heterocyclyloyl (e.g., —C(O)-Het, wherein Het is heterocyclyl, as described herein); (14) hydroxyl (e.g., —OH); (15) N-protected amino; (16) nitro (e.g., —NO$_2$); (17) oxo (e.g., =O); (18) —CO$_2$R$^A$, where R$^A$ is selected from the group consisting of (a) $C_{1-6}$ alkyl, (b) $C_{4-18}$ aryl, and (c) ($C_{4-18}$ aryl) $C_{1-6}$ alkyl (e.g., -Lk-Ar, wherein Lk is a bivalent form of optionally substituted alkyl group and Ar is optionally substituted aryl); (19) —C(O)NR$^B$R$^C$, where each of R$^B$ and R$^C$ is, independently, selected from the group consisting of (a) hydrogen, (b) $C_{1-6}$ alkyl, (c) $C_{4-18}$ aryl, and (d) ($C_{4-18}$ aryl) $C_{1-6}$ alkyl (e.g., -Lk-Ar, wherein Lk is a bivalent form of optionally substituted alkyl group and Ar is optionally substituted aryl); and (20) —NR$^G$R$^H$, where each of R$^G$ and R$^H$ is, independently, selected from the group consisting of (a) hydrogen, (b) an N-protecting group, (c) $C_{1-6}$ alkyl, (d) $C_{2-6}$ alkenyl (e.g., optionally substituted alkyl having one or more double bonds), (e) $C_{2-6}$ alkynyl (e.g., optionally substituted alkyl having one or more triple bonds), (f) $C_{4-18}$ aryl, (g) ($C_{4-18}$ aryl) $C_{1-6}$ alkyl (e.g., Lk-Ar, wherein Lk is a bivalent form of optionally substituted alkyl group and Ar is optionally substituted aryl), (h) $C_{3-8}$ cycloalkyl, and (i) ($C_{3-8}$ cycloalkyl) $C_{1-6}$ alkyl (e.g., -Lk-Cy, wherein Lk is a bivalent form of optionally substituted alkyl group and Cy is optionally substituted cycloalkyl, as described herein), wherein in one embodiment no two groups are bound to the nitrogen atom through a carbonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylene" is meant a multivalent (e.g., bivalent) form of an alkyl group, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

By "alkynyl" is meant an optionally substituted $C_{2-24}$ alkyl group having one or more triple bonds. The alkynyl group can be cyclic or acyclic and is exemplified by ethynyl, 1-propynyl, and the like. The alkynyl group can also be substituted or unsubstituted. For example, the alkynyl group can be substituted with one or more substitution groups, as described herein for alkyl.

By "alkynylene" is meant a multivalent (e.g., bivalent) form of an alkynyl group, which is an optionally substituted $C_{2-24}$ alkyl group having one or more triple bonds. The alkynylene group can be cyclic or acyclic. The alkynylene group can be substituted or unsubstituted. For example, the alkynylene group can be substituted with one or more substitution groups, as described herein for alkyl. Exemplary, non-limiting alkynylene groups include —C≡—C— or —C≡CCH$_2$—.

By "amino" is meant —NR$^{N1}$R$^{N2}$, where each of R$^{N1}$ and R$^{N2}$ is, independently, H, optionally substituted alkyl, or optionally substituted aryl, or R$^{N1}$ and R$^{N2}$, taken together with the nitrogen atom to which each are attached, form a heterocyclyl group, as defined herein.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system. Such an aromatic can be unsubstituted or substituted with one or more groups, such as groups described herein for an alkyl or aryl group. Yet other substitution groups can include aliphatic, haloaliphatic, halo, nitrate, cyano, sulfonate, sulfonyl, or others.

By "aryl" is meant a group that contains any carbon-based aromatic group including, but not limited to, phenyl, benzyl, anthracenyl, anthryl, benzocyclobutenyl, benzocyclooctenyl, biphenylyl, chrysenyl, dihydroindenyl, fluoranthenyl, indacenyl, indenyl, naphthyl, phenanthryl, phenoxybenzyl, picenyl, pyrenyl, terphenyl, and the like, including fused benzo-$C_{4-8}$ cycloalkyl radicals (e.g., as defined herein) such as, for instance, indanyl, tetrahydronaphtlyl, fluorenyl, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents, such as any described herein for alkyl.

By "arylene" is meant a multivalent (e.g., bivalent) form of an aryl group, as described herein. Exemplary arylene groups include phenylene, naphthylene, biphenylene, triphenylene, diphenyl ether, acenaphthenylene, anthrylene, or phenanthrene. In some embodiments, the arylene group is a $C_{4-18}$, $C_{4-14}$, $C_{4-12}$, $C_{4-10}$, $C_{6-18}$, $C_{6-14}$, $C_{6-12}$, or $C_{6-10}$ arylene group. The arylene group can be branched or unbranched. The arylene group can also be substituted or unsubstituted. For example, the arylene group can be substituted with one or more substitution groups, as described herein for alkyl or aryl.

By "(aryl)(alkyl)ene" is meant a bivalent form including an arylene group, as described herein, attached to an alkylene or a heteroalkylene group, as described herein. In some embodiments, the (aryl)(alkyl)ene group is -L-Ar— or -L-Ar-L- or —Ar-L-, in which Ar is an arylene group and each L is, independently, an optionally substituted alkylene group or an optionally substituted heteroalkylene group.

By "carbonyl" is meant a —C(O)— group, which can also be represented as >C=O, or a —CO group.

By "carboxyl" is meant a —CO$_2$H group.

By "carboxyalkyl" is meant an alkyl group, as defined herein, substituted by one or more carboxyl groups, as defined herein.

By "carboxyaryl" is meant an aryl group, as defined herein, substituted by one or more carboxyl groups, as defined herein.

By "cyclic anhydride" is meant a 3-, 4-, 5-, 6- or 7-membered ring (e.g., a 5-, 6- or 7-membered ring), unless otherwise specified, having a —C(O)—O—C(O)— group within the ring. The term "cyclic anhydride" also includes bicyclic, tricyclic and tetracyclic groups in which any of the above rings is fused to one, two, or three rings independently selected from the group consisting of an aryl ring, a cyclohexane ring, a cyclohexene ring, a cyclopentane ring, a cyclopentene ring, and another monocyclic heterocyclic ring. Exemplary cyclic anhydride groups include a radical formed from succinic anhydride, glutaric anhydride, maleic anhydride, phthalic anhydride, isochroman-1,3-dione, oxepanedione, tetrahydrophthalic anhydride, hexahydrophthalic anhydride, pyromellitic dianhydride, naphthalic anhydride, 1,2-cyclohexanedicarboxylic anhydride, etc., by removing one or more hydrogen. Other exemplary cyclic anhydride groups include dioxotetrahydrofuranyl, dioxodihydroisobenzofuranyl, etc. The cyclic anhydride group can also be substituted or unsubstituted. For example, the cyclic anhydride group can be substituted with one or more groups including those described herein for heterocyclyl.

By "cycloalkenyl" is meant a monovalent unsaturated non-aromatic or aromatic cyclic hydrocarbon group of from three to eight carbons, unless otherwise specified, having one or more double bonds. The cycloalkenyl group can also be substituted or unsubstituted. For example, the cycloalkenyl group can be substituted with one or more groups including those described herein for alkyl.

By "cycloalkyl" is meant a monovalent saturated or unsaturated non-aromatic or aromatic cyclic hydrocarbon group of from three to eight carbons, unless otherwise specified, and is exemplified by cyclopropyl, cyclobutyl, cyclopentyl, cyclopentadienyl, cyclohexyl, cycloheptyl, bicyclo[2.2.1.]heptyl, and the like. The cycloalkyl group can also be substituted or unsubstituted. For example, the cycloalkyl group can be substituted with one or more groups including those described herein for alkyl.

By "halo" is meant F, Cl, Br, or I.

By "haloalkyl" is meant an alkyl group, as defined herein, substituted with one or more halo.

By "heteroalkyl" is meant an alkyl group, as defined herein, containing one, two, three, or four non-carbon heteroatoms (e.g., independently selected from the group consisting of nitrogen, oxygen, phosphorous, sulfur, selenium, or halo).

By "heteroalkylene" is meant a bivalent form of an alkylene group, as defined herein, containing one, two, three, or four non-carbon heteroatoms (e.g., independently selected from the group consisting of nitrogen, oxygen, phosphorous, sulfur, selenium, or halo). The heteroalkylene group can be substituted or unsubstituted. For example, the heteroalkylene group can be substituted with one or more substitution groups, as described herein for alkyl.

By "heterocyclyl" is meant a 3-, 4-, 5-, 6- or 7-membered ring (e.g., a 5-, 6- or 7-membered ring), unless otherwise specified, containing one, two, three, or four non-carbon heteroatoms (e.g., independently selected from the group consisting of nitrogen, oxygen, phosphorous, sulfur, selenium, or halo). The 3-membered ring has zero to one double bonds, the 4- and 5-membered ring has zero to two double bonds, and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofinyl, benzothienyl and the like. The heterocyclyl group can be substituted or unsubstituted. For example, the heterocyclyl group can be substituted with one or more substitution groups, as described herein for alkyl.

By "hydrocarbyl" is meant a univalent group formed by removing a hydrogen atom from a hydrocarbon. Non-limiting unsubstituted hydrocarbyl groups include alkyl, alkenyl, alkynyl, and aryl, as defined herein, in which these groups include only carbon and hydrogen atoms. The hydrocarbyl group can be substituted or unsubstituted. For example, the hydrocarbyl group can be substituted with one or more substitution groups, as described herein for alkyl. In other embodiments, any alkyl or aryl group herein can be replaced with a hydrocarbyl group, as defined herein.

By "hydroxyl" is meant —OH.

By "hydroxyalkyl" is meant an alkyl group, as defined herein, substituted by one to three hydroxyl groups, with the proviso that no more than one hydroxyl group may be attached to a single carbon atom of the alkyl group and is exemplified by hydroxymethyl, dihydroxypropyl, and the like.

By "hydroxyaryl" is meant an aryl group, as defined herein, substituted by one to three hydroxyl groups, with the proviso that no more than one hydroxyl group may be attached to a single carbon atom of the aryl group and is exemplified by hydroxyphenyl, dihydroxyphenyl, and the like.

By "isocyanato" is meant —NCO.

By "oxido" is meant an —O$^-$ group.

By "oxo" is meant an =O group.

By "phosphine" is meant a trivalent or tetravalent phosphorous having hydrocarbyl moieties. In some embodiments, phosphine is a —PR$^P_3$ group, where each R$^P$ is, independently, H, optionally substituted alkyl, or optionally substituted aryl. The phosphine group can be substituted or unsubstituted. For example, the phosphine group can be substituted with one or more substitution groups, as described herein for alkyl.

By "selenol" is meant an —SeH group.

By "tellurol" is meant an —TeH group.

By "thioisocyanato" is meant —NCS.

By "thiol" is meant an —SH group.

As used herein, the terms "top," "bottom," "upper," "lower," "above," and "below" are used to provide a relative relationship between structures. The use of these terms does not indicate or require that a particular structure must be located at a particular location in the apparatus.

CONCLUSION

Pattering structures and schemes, and associated process and apparatus for incorporating a photoresist underlayer configured to increase adhesion between a substrate (e.g., a hardmask) and the photoresist and/or to reduce EUV dose for effective photoresist exposure during EUV lithography, are disclosed and described.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein but may be modified within the scope of the disclosure.

The following sample claims are provided for further illustration of certain embodiments of the disclosure. The disclosure is not necessarily limited to these embodiments.

The invention claimed is:

1. A patterning structure, comprising:
   a substrate comprising a partially fabricated semiconductor device film stack;
   a radiation-sensitive imaging layer disposed over the substrate; and
   an underlayer disposed between the substrate and the imaging layer,
   wherein the underlayer comprises a vapor deposited film of hydrogenated carbon doped with oxygen (O), silicon (Si), nitrogen (N), tungsten (W), boron (B), iodine (I), chlorine (Cl), or a combination of two or more of any of these, and
   wherein the film has a thickness of no more than about 25 nm or a thickness of about 2 to 20 nm.

2. The patterning structure of claim 1, wherein the substrate further comprises an optionally doped amorphous carbon hardmask disposed thereon.

3. The patterning structure of claim 1, wherein the underlayer comprises 0-30 atomic % oxygen (O) and/or about 20-50 atomic % hydrogen (H); and/or wherein a surface of the underlayer comprises hydroxyl groups, carboxyl groups, peroxy groups, $sp^2$ carbons, sp carbons, and/or unsaturated carbon-containing bonds.

4. The patterning structure of claim 1, wherein the hydrogenated carbon doped with iodine is configured to improve generation of secondary electrons upon exposure to radiation.

5. The patterning structure of claim 1, wherein the underlayer comprises a density of about 0.7 to 2.9 $g/cm^3$; optionally wherein the underlayer further provides increased etch selectivity; and optionally wherein the underlayer further provides decreased line edge and line width roughness and/or decreased dose to size.

6. The patterning structure of claim 1, wherein the underlayer further comprises beta hydrogen atoms configured to be released upon exposure to radiation and/or oxygen atoms configured to form oxygen bonds to an atom in the imaging layer.

7. The patterning structure of claim 1, wherein the imaging layer comprises an Extreme Ultraviolet (EUV)-sensitive inorganic photoresist layer, a chemical vapor deposited (CVD) film, a spin-on film, a tin oxide film, or a tin oxide hydroxide film.

8. The patterning structure of claim 1, wherein the imaging layer comprises a vapor deposited organometallic imaging layer.

9. The patterning structure of claim 8, wherein the vapor deposited organometallic imaging layer comprises tin.

10. The patterning structure of claim 8, wherein the vapor deposited organometallic imaging layer comprises organotin.

11. The patterning structure of claim 1, wherein the imaging layer comprises a spin-on organometallic imaging layer.

12. The patterning structure of claim 11, wherein the spin-on organometallic imaging layer comprises tin.

13. The patterning structure of claim 11, wherein the spin-on organometallic imaging layer comprises organotin.

14. The patterning structure of claim 11, further comprising a hard mask between the substrate and the underlayer.

15. The patterning structure of claim 14, wherein the hard mask is ashable.

16. A method of making a patterning structure, comprising:
   providing a substrate;
   depositing an underlayer on the substrate, wherein the underlayer is configured to increase adhesion between the substrate and the photoresist and/or reduce radiation dose for effective photoresist exposure; and
   forming a radiation-sensitive imaging layer on the underlayer, wherein
   the substrate is a partially fabricated semiconductor device film stack;
   the substrate further comprises or is a hardmask, amorphous carbon film, amorphous hydrogenated carbon film, silicon oxide film, silicon nitride film, silicon oxynitride film, silicon carbide film, silicon boronitride film, amorphous silicon film, polysilicon film, or a combination thereof;
   the imaging layer comprises a tin oxide-based photoresist or a tin oxide hydroxide-based photoresist; and
   the underlayer comprises a vapor deposited film of hydrogenated carbon doped with oxygen (O), silicon (Si), nitrogen (N), tungsten (W), boron (B), iodine (I), chlorine (Cl), or a combination of two or more of any of these, wherein the film has a thickness of no more than 25 nm.

17. The method of claim 16, wherein the underlayer is vapor deposited on the substrate using a hydrocarbon precursor in the presence or absence of an oxocarbon precursor, thereby providing a carbon-containing film; and optionally wherein the oxocarbon precursor co-reacts with hydrogen ($H_2$) or a hydrocarbon and optionally further co-reacts with a silicon (Si) source dopant.

18. The method of claim 17, wherein the hydrocarbon precursor comprises an alkane, an alkene, or an alkyne.

19. The method of claim 17, wherein the underlayer is vapor deposited using the hydrocarbon precursor in the presence of a nitrogen-containing precursor, a tungsten-containing precursor, a boron-containing precursor, and/or an iodine-containing precursor, thereby providing a doped film.

20. The method of claim 19, wherein the doped film comprises iodine; a combination of iodine and silicon; or a combination of iodine, silicon, and nitrogen.

21. The method of claim 16, wherein the underlayer is vapor deposited on the substrate by using a silicon (Si)-containing precursor that co-reacts with an oxidizer and wherein the Si-containing precursor optionally further co-reacts with a carbon (C) source dopant.

22. The method of claim 16, wherein said depositing further comprises applying a bias at a bias power of 0 W to about 1000 W and using a duty cycle of about 5% to 100%.

23. The method of claim 22, wherein said applying the bias provides the underlayer having an increased density, as compared to an underlayer formed without applying the bias.

24. The method of claim 16, wherein the underlayer is vapor deposited on the substrate by PECVD as a termination operation of a vapor deposition on the substrate.

25. The method of claim 16, wherein the underlayer is vapor deposited on the substrate by plasma enhanced chemical vapor deposition (PECVD) or atomic layer deposition (ALD).

26. The method of claim 16, further comprising, after said depositing, modifying the underlayer to provide a roughened surface and optionally exposing the underlayer or the roughened surface to an oxygen-containing plasma to provide an oxygen-containing surface.

27. The method of claim 16, wherein the hydrogenated carbon doped with iodine is configured to improve generation of secondary electrons upon exposure to radiation.

28. The method of claim 16, wherein the underlayer comprises about 0-30 atomic % oxygen (O) and/or about 20-50 atomic % hydrogen (H); and/or wherein a surface of the underlayer comprises hydroxyl groups, carboxyl groups, peroxy groups, $sp^2$ carbons, sp carbons, and/or unsaturated carbon-containing bonds.

29. The method of claim 16, wherein the underlayer comprises a density of about 0.7 to 2.9 g/cm$^3$; optionally wherein the underlayer further provides increased etch selectivity; and optionally wherein the underlayer further provides decreased line edge and line width roughness and/or decreased dose to size.

30. The method of claim 16, wherein the underlayer further comprises beta hydrogen atoms configured to be released upon exposure to radiation and/or oxygen atoms configured to form oxygen bonds to an atom in the imaging layer.

31. The method of claim 16, wherein said depositing comprises a plasma enhanced chemical vapor deposition (PECVD) process.

32. The method of claim 16, wherein the imaging layer comprises an Extreme Ultraviolet (EUV)-sensitive inorganic photoresist layer, a chemical vapor deposited (CVD) film, a spin-on film, a tin oxide film, or a tin oxide hydroxide film.

33. The method of claim 16, wherein said forming comprises vapor depositing an imaging layer on the underlayer or spin-coating an imaging layer on the underlayer.

34. The method of claim 33, wherein the imaging layer comprises a vapor deposited organometallic imaging layer.

35. The method of claim 34, wherein the vapor deposited organometallic imaging layer comprises tin.

36. The method of claim 34, wherein the vapor deposited organometallic imaging layer comprises organotin.

37. The method of claim 33, wherein the imaging layer comprises a spin-on organometallic imaging layer.

38. The method of claim 37, wherein the organometallic imaging layer comprises tin.

39. The method of claim 37, wherein the organometallic imaging layer comprises organotin.

40. The method of claim 33, further comprising, after said forming:
exposing the organometallic imaging layer to Extreme Ultraviolet (EUV) radiation.

41. The method of claim 40, further comprising, after said exposing:
developing the organometallic imaging layer using dry development.

42. The method of claim 40, further comprising, after said exposing:
developing the organometallic imaging layer using wet development.

43. The method of claim 42, wherein the wet development is performed using an alkaline developer, an ammonium-based ionic liquid, a glycol ether, an organic acid, a ketone, or an alcohol.

44. The method of claim 42, wherein the wet development is performed using tetramethylammonium hydroxide (TMAH).

45. The method of claim 42, wherein the wet development is performed using propylene glycol methyl ether (PGME) or propylene glycol methyl ether acetate (PGMEA).

46. The method of claim 42, wherein the wet development is performed using an organic acid.

47. The method of claim 42, wherein the wet development is performed using 2-heptanone.

48. The method of claim 42, wherein the wet development is performed using ethanol.

49. The method of claim 33, further comprising, after said spin-coating:
performing a post-application bake at a temperature below 200° C.

50. The method of claim 40, further comprising, after said exposing:
performing a post-exposure bake at a temperature below 200° C.

51. The method of claim 42, further comprising, after said developing:
performing a post-development bake at a temperature below 200° C.

52. The method of claim 16, further comprising:
providing a hard mask between the substrate and the underlayer.

53. The method of claim 52, wherein the hard mask is an ashable hard mask.

54. A method of depositing an underlayer, the method comprising:
providing a substrate in a process chamber; and
depositing by a plasma enhanced chemical vapor deposition (PECVD) process a hydrogenated carbon film on a surface of the substrate, wherein the hydrogenated carbon film is a low density film.

55. The method of claim 54, wherein the PECVD process comprises introducing a carbon-containing precursor selected from methane ($CH_4$), acetylene ($C_2H_2$), ethylene ($C_2H_4$), propylene ($C_3H_6$), propyne ($C_3H_4$), allene ($C_3H_4$), cyclopropene ($C_3H_4$), butane ($C_4H_{10}$), cyclohexane ($C_6H_{12}$), benzene ($C_6H_6$), and toluene ($C_7H_8$).

56. The method of claim 55, wherein the PECVD process further comprises introducing a nitrogen-containing precursor, a tungsten-containing precursor, a boron-containing precursor, and/or an iodine-containing precursor, thereby providing a doped film.

57. The method of claim 54, wherein the PECVD process comprises a transformer coupled plasma (TCP) or an inductively coupled plasma (ICP).

58. The method of claim 57, wherein a TCP power is about 100-1000 W with no bias.

59. The method of claim 57, wherein the PECVD process further comprises a pressure of about 10-1000 mTorr and/or a temperature of about 0-100° C.

60. The method of claim 57, wherein the PECVD process further comprises an applied pulsed bias comprising a power of about 10-1000 W or an applied continuous wave bias comprising a power of about 10-500 W.

61. The method of claim 60, wherein the applied pulsed bias comprises a duty cycle of about 1-99% and a pulsing frequency of about 10-2000 Hz.

62. The method of claim 54, further comprising, after said depositing, modifying the hydrogenated carbon film to provide a roughened surface and optionally exposing the roughened surface to an oxygen-containing plasma to provide an oxygen-containing surface.

63. The method of claim 54, further comprising, after said depositing:
vapor depositing or spin-coating an organometallic imaging layer on the hydronated carbon film.

64. The method of claim 63, wherein the organometallic imaging layer comprises tin.

65. The method of claim 63, wherein the organometallic imaging layer comprises organotin.

66. The method of claim 63, further comprising, after said spin-coating:
exposing the organometallic imaging layer to Extreme Ultraviolet (EUV) radiation.

67. The method of claim 66, further comprising, after said exposing:
developing the organometallic imaging layer using dry development.

68. The method of claim 66, further comprising, after said exposing:
developing the organometallic imaging layer using wet development.

69. The method of claim 68, wherein the wet development is performed using an alkaline developer, an ammonium-based ionic liquid, a glycol ether, an organic acid, a ketone, or an alcohol.

70. The method of claim 68, wherein the wet development is performed using tetramethylammonium hydroxide (TMAH).

71. The method of claim 68, wherein the wet development is performed using propylene glycol methyl ether (PGME) or propylene glycol methyl ether acetate (PGMEA).

72. The method of claim 68, wherein the wet development is performed using an organic acid.

73. The method of claim 68, wherein the wet development is performed using 2-heptanone.

74. The method of claim 68, wherein the wet development is performed using ethanol.

75. The method of claim 63, further comprising, after said spin-coating:
performing a post-application bake at a temperature below 200° C.

76. The method of claim 66, further comprising, after said exposing:
performing a post-exposure bake at a temperature below 200° C.

77. The method of claim 68, further comprising, after said developing:
performing a post-development bake at a temperature below 200° C.

78. The method of claim 54, further comprising:
providing a hard mask between the substrate and hydronated carbon film.

79. The method of claim 78, wherein the hard mask is an ashable hard mask.

\* \* \* \* \*